(12) United States Patent
van de Ven et al.

(10) Patent No.: US 9,799,243 B2
(45) Date of Patent: Oct. 24, 2017

(54) LIGHTING DEVICES INCLUDING SOLID STATE EMITTER GROUPS FOR ILLUMINATING PRINTED MATERIAL WITH ENHANCED VIBRANCY

(71) Applicant: CI Holdings C.V., Amsterdam (NL)

(72) Inventors: Antony Paul van de Ven, Sai Kung (HK); John Roberts, Durham, NC (US); Benjamin A. Jacobson, Santa Barbara, CA (US); Michael Leung, Ventura, CA (US); Nalini Gupta, Santa Barbara, CA (US)

(73) Assignee: CI Holdings C.V., Amsterdam (NL)

( * ) Notice: Subject to any disclaimer, the term of this patent is extended or adjusted under 35 U.S.C. 154(b) by 0 days.

(21) Appl. No.: 15/204,000

(22) Filed: Jul. 7, 2016

(65) Prior Publication Data
US 2017/0011670 A1    Jan. 12, 2017

Related U.S. Application Data

(60) Provisional application No. 62/189,413, filed on Jul. 7, 2015.

(51) Int. Cl.
*G09F 13/22*    (2006.01)
*H05B 33/08*    (2006.01)
(Continued)

(52) U.S. Cl.
CPC .............. *G09F 13/22* (2013.01); *F21K 9/27* (2016.08); *G09F 9/33* (2013.01); *G09F 13/02* (2013.01); *G09F 13/04* (2013.01); *H05B 33/0827* (2013.01); *H05B 33/0854* (2013.01); *H05B 37/0218* (2013.01); *H05B 37/0227* (2013.01); *F21V 13/02* (2013.01); *F21V 13/08* (2013.01);
(Continued)

(58) Field of Classification Search
CPC . G09F 13/22; H05B 37/0218; H05B 37/0227; H05B 33/0827; H05B 33/0854; F21V 7/22; F21V 9/16; F21V 13/08; F21V 29/70
See application file for complete search history.

(56) References Cited

U.S. PATENT DOCUMENTS 6,648,475 B1    11/2003    Roddy et al.
7,651,243 B2    1/2010    McGuire, Jr. et al.
(Continued)

*Primary Examiner* — Joseph L Williams
(74) *Attorney, Agent, or Firm* — Withrow & Terranova, P.L.L.C.; Vincent K. Gustafson

(57) ABSTRACT

Combinations of solid state light emitters, optionally arranged to stimulate one or more lumiphoric materials, are used to illuminate surfaces (e.g., upright surfaces) including printed material produced with CMY or CMYK inks. Vibrancy and/or efficacy may be enhanced by increasing the effective steepness of printed ink reflectance wavelength boundaries by illuminating printed material with solid state light emitters of multiple colors having tailored boundaries (e.g., increased separation between colors and/or increased energy in spectral areas highly reflected by CMY inks, or reducing energy of emissions at wavelengths to which the human eye is less sensitive). Lighting devices may include multiple operating modes having different gamut properties (e.g., relative gamut values). One or more subregions of an upright surface bearing printed material may be preferentially illuminated with an array of solid state light emitters including multiple emitters having different peak wavelengths.

29 Claims, 33 Drawing Sheets

(51) Int. Cl.

| | | |
|---|---|---|
| *G09F 9/33* | (2006.01) | |
| *F21V 9/16* | (2006.01) | |
| *F21V 13/08* | (2006.01) | |
| *H05B 37/02* | (2006.01) | |
| *F21K 9/27* | (2016.01) | |
| *G09F 13/02* | (2006.01) | |
| *G09F 13/04* | (2006.01) | |
| *F21V 29/70* | (2015.01) | |
| *F21Y 115/10* | (2016.01) | |
| *F21V 13/02* | (2006.01) | |
| *F21V 23/00* | (2015.01) | |
| *F21V 23/04* | (2006.01) | |
| *F21V 29/74* | (2015.01) | |
| *F21Y 103/10* | (2016.01) | |
| *F21Y 113/13* | (2016.01) | |

(52) U.S. Cl.
CPC ......... *F21V 23/006* (2013.01); *F21V 23/0442* (2013.01); *F21V 29/70* (2015.01); *F21V 29/74* (2015.01); *F21Y 2103/10* (2016.08); *F21Y 2113/13* (2016.08); *F21Y 2115/10* (2016.08); *G09F 2013/222* (2013.01)

(56) References Cited

U.S. PATENT DOCUMENTS

2005/0018428 A1    1/2005    Harvey
2009/0077847 A1    3/2009    Hsieh et al.

| SOURCE | DAYLIGHT |
|---|---|
| GAMUT: VS DAYLIGHT | 100 |
| BRIGHTNESS: VS DAYLIGHT | 100 |
| CCT | 5000K |
| Ra | 100 |
| Qg | 100 |

| Source | Metal Halide |
|---|---|
| Gamut: vs daylight | 75-90 |
| Brightness: vs daylight | 90-94 |
| CCT | 5000K |
| Efficacy | 15-35 |
| Ra | 64-90 |
| Qg | 75-100 |
*FIG._3A (RELATED ART)*
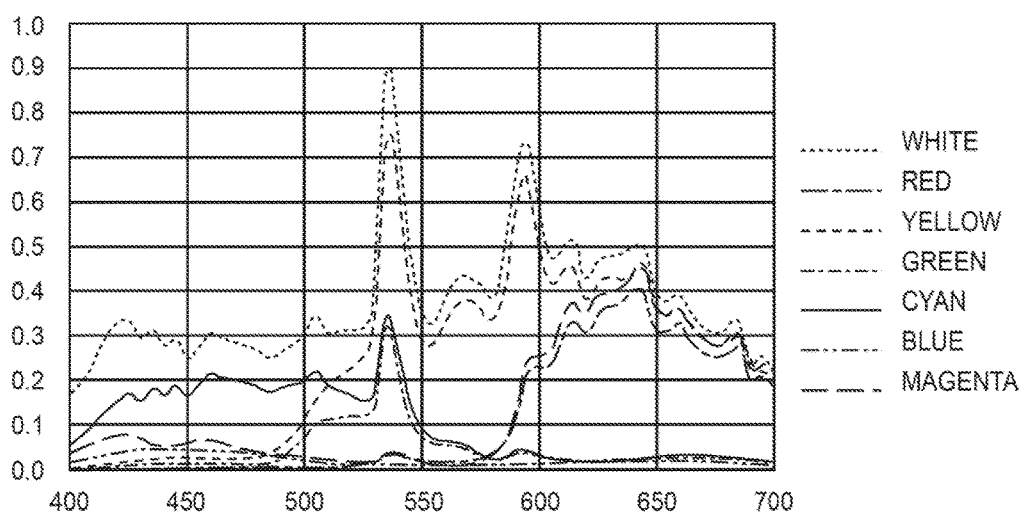
*FIG._3B (RELATED ART)*

| Source | Multi-phosphor LED 450 + 5:1 + CRV3 |
|---|---|
| Gamut: vs daylight | 105 |
| Brightness: vs daylight | 93 |
| CCT | 5000K |
| Efficacy | 120 |
| Ra | 82 |
| Qg | 102 |
*FIG._4A*
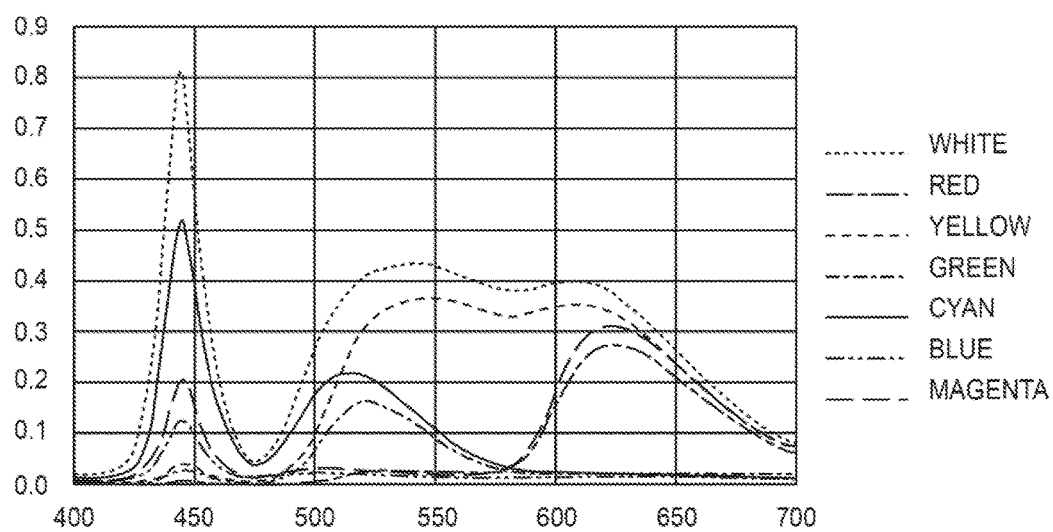
*FIG._4B*

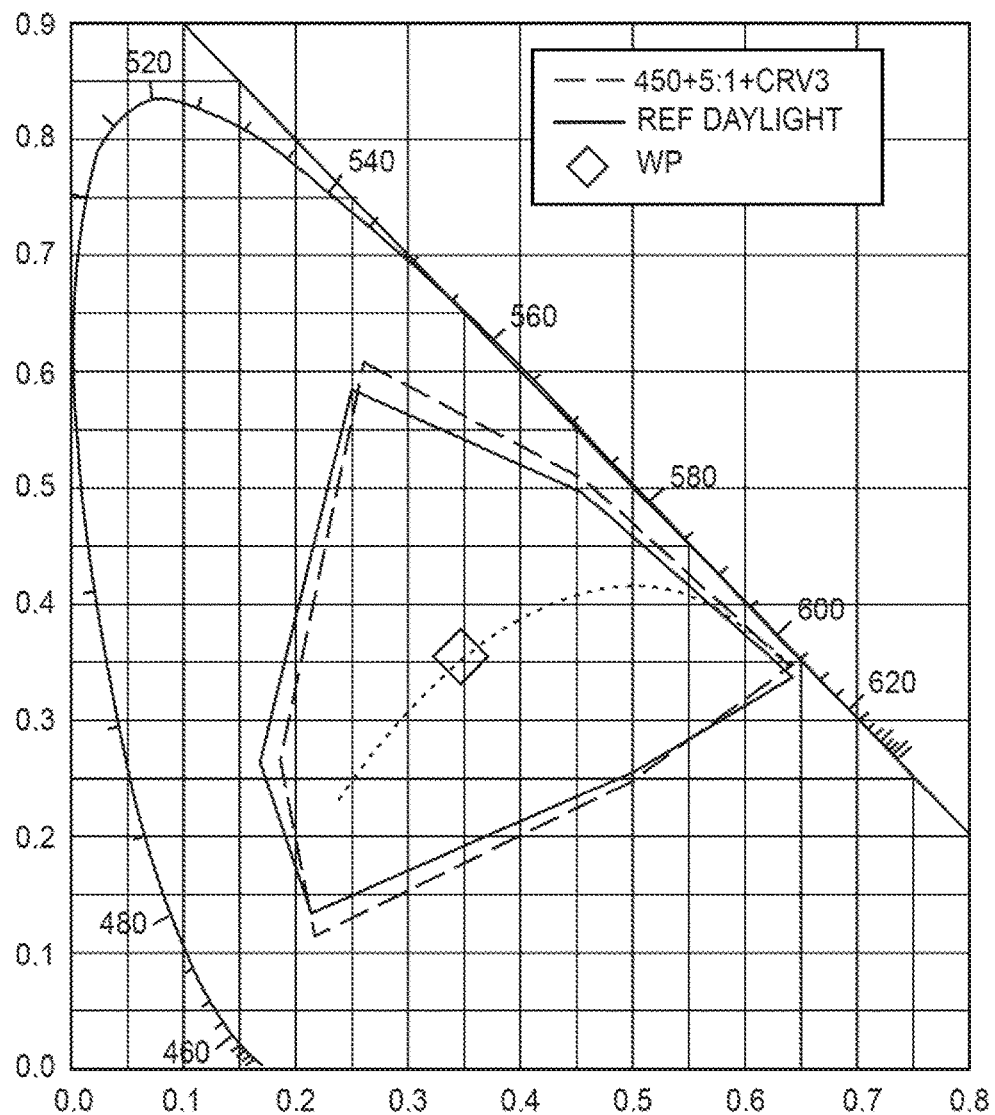
FIG._4C

| Source | BSG + R 454 + GAL + ORed |
|---|---|
| Gamut: vs daylight | 105 |
| Brightness: vs daylight | 95 |
| CCT | 5000K |
| Efficacy | 140 |
| Ra | 92 |
| Qg | 108 |
FIG._5A
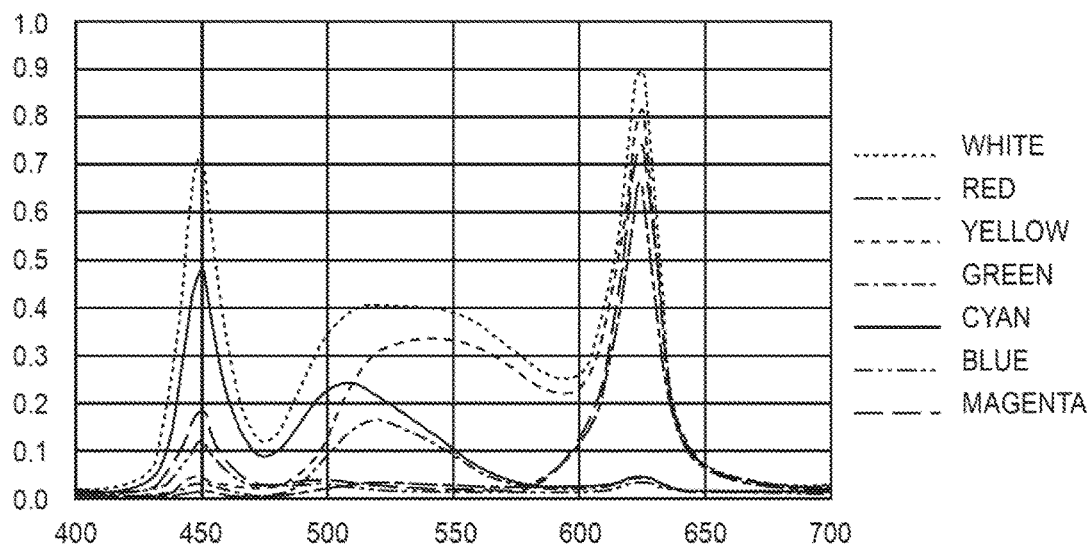
FIG._5B

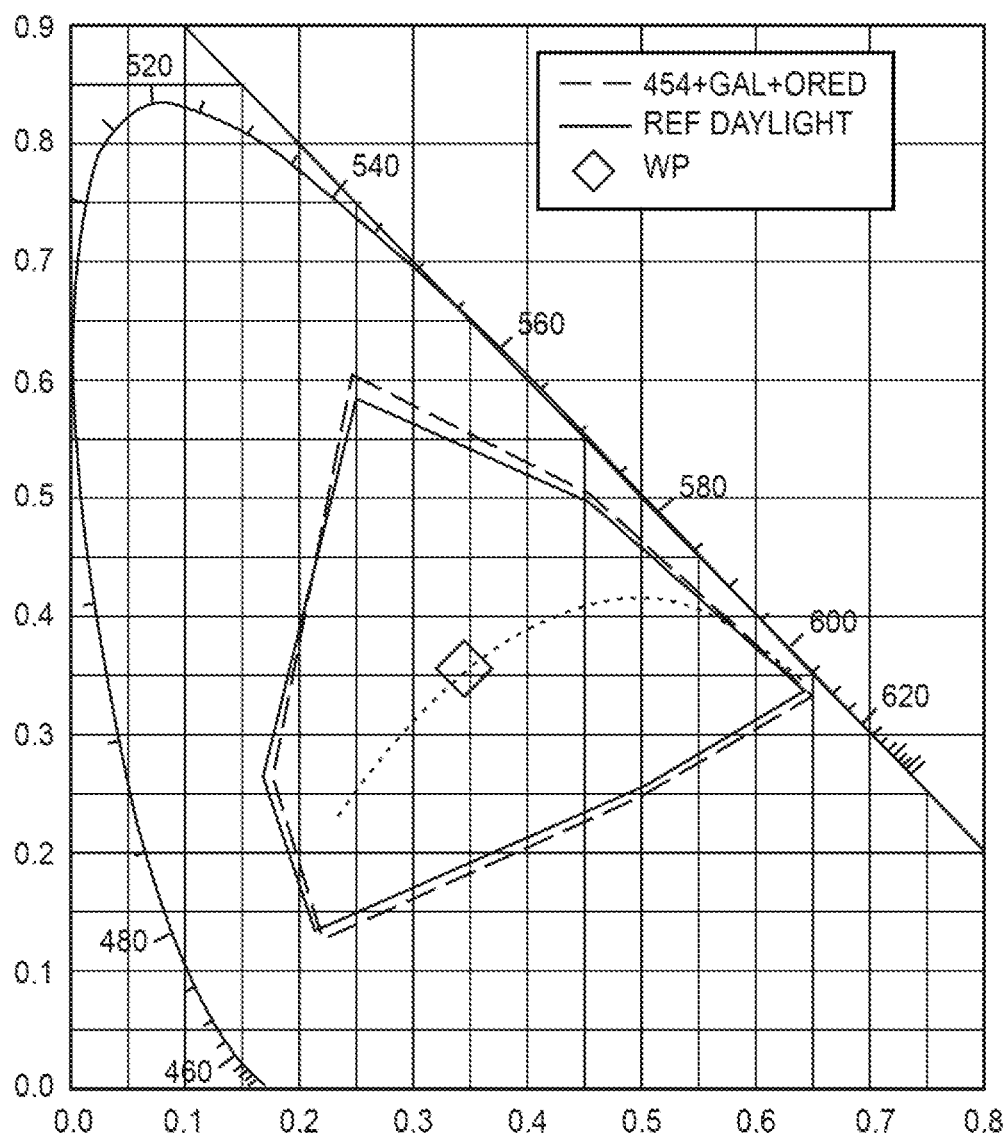
FIG._5C

| Source | RGB LED 452 + 532 + 622 |
|---|---|
| Gamut: vs daylight | 111 |
| Brightness: vs daylight | 102 |
| CCT | 5000K |
| Efficacy | 92 |
| Ra | 42 |
| Qg | 137 |
FIG._6A
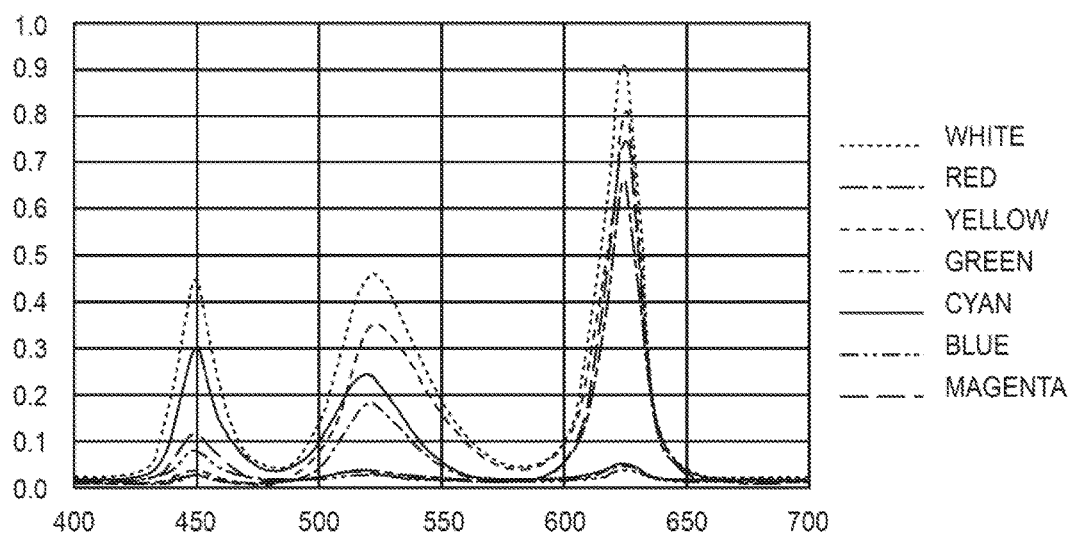
FIG._6B

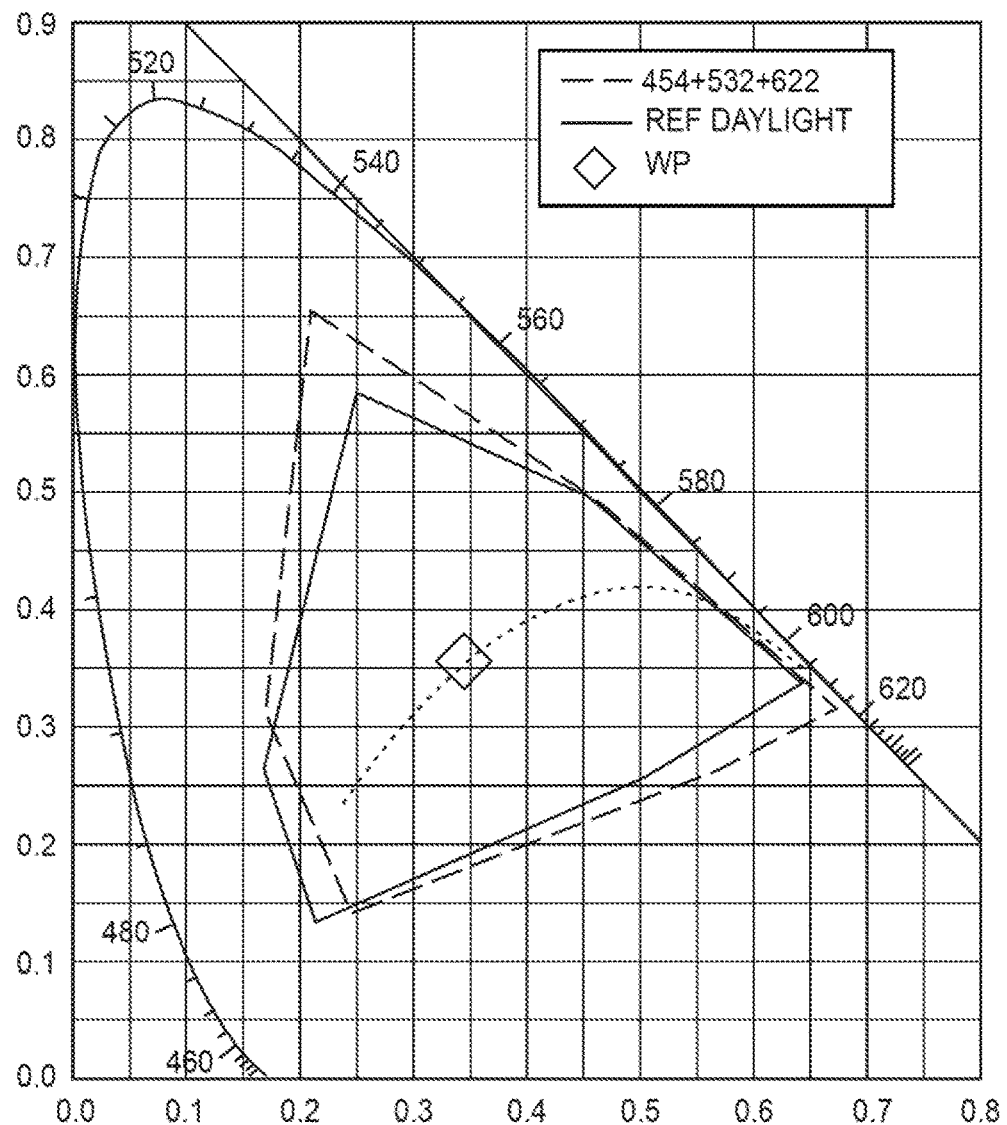
FIG._6C

| Emitter | x | y | u' | v' | dom | pk | FWHM | W | L | L/W | mW | mW% | S/P |
|---|---|---|---|---|---|---|---|---|---|---|---|---|---|
| ORed 617dm | .6836 | .3152 | .5050 | .5238 | 617 | 626 | 17 | 1.1 | 134 | 122 | .5 | 31.8 | .07 |
| S3 IrG-r-gre | .1788 | .7195 | .0634 | .5742 | 528 | 520 | 36 | 4.88 | 356 | 73 | .7 | 41.8 | 2.73 |
| XPi 447 dm | .1596 | .0163 | .2219 | .0511 | 447 | 440 | 19 | .85 | 10 | 12 | .5 | 26.4 | 28.66 |
| Total | .3123 | .3282 | .1979 | .4678 | 489 | 626 | 48 | 6.84 | 500 | 73 | 1.7 | | 2.53 |

FIG._7A

| CCT | 6532 |
|---|---|
| du'v' BBL/DLL | .0002 |
| duv | .0030 |
| Power | 6.8 |
| Lumens | 500 |
| LPW | 73.1 |
| LER | 291 |
| S/P ratio | 2.53 |
| CRI Ra | 51.5 |
| R9 | -82 |
| R9 prime | 276 |
| CQS (ver. 9) | 68.7 |
| Nist Qf | 49.4 |
| Nist Qg | 135.6 |
| GAI | 138% |

FIG._7B

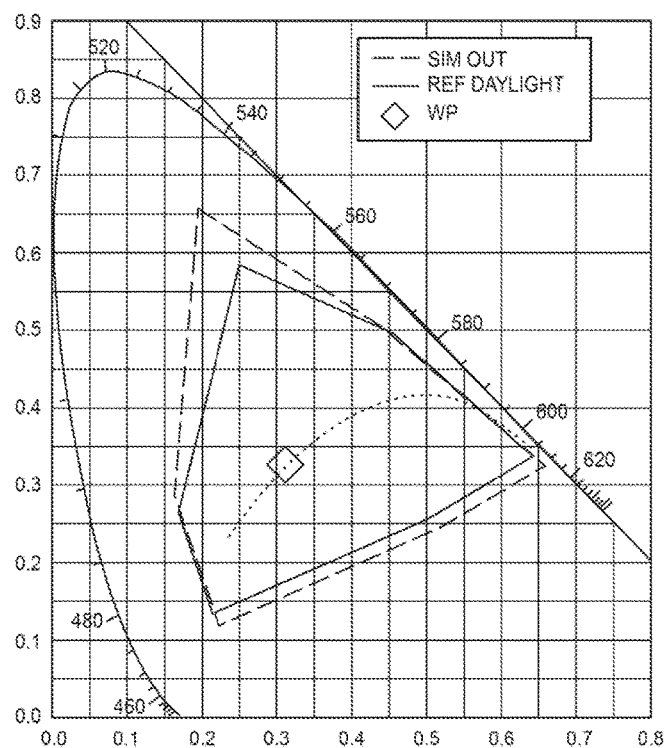
*FIG._7C*
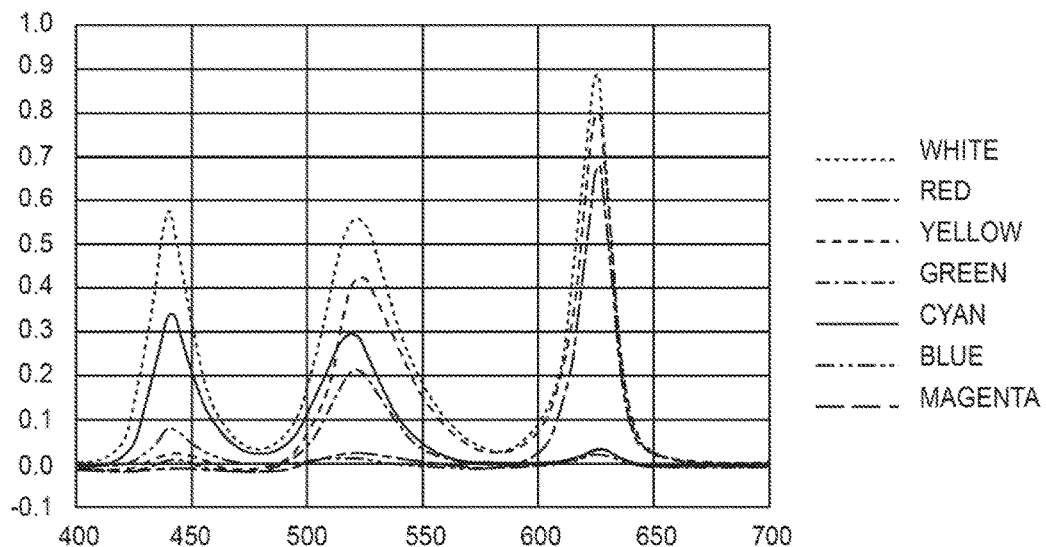
*FIG._7D*

| XPG (90 CRI) | |
|---|---|
| 460 nm LED + multi phosphor | |
| LER | 277.6 |
| x | 0.3348 |
| y | 0.3457 |
| CCT | 5401 |
| Duv | 0.00133 |
| CRI Ra | 86.5 |
| R9 | 89.1 |
| CQS Qg | 92.8 |
*FIG._8C(i)*
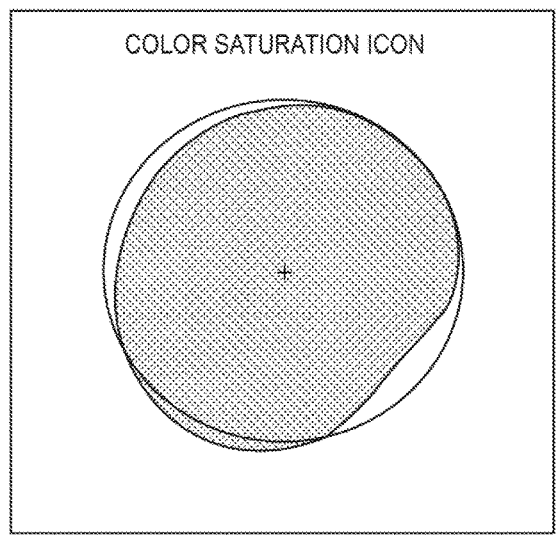
*FIG._8C(iii)*
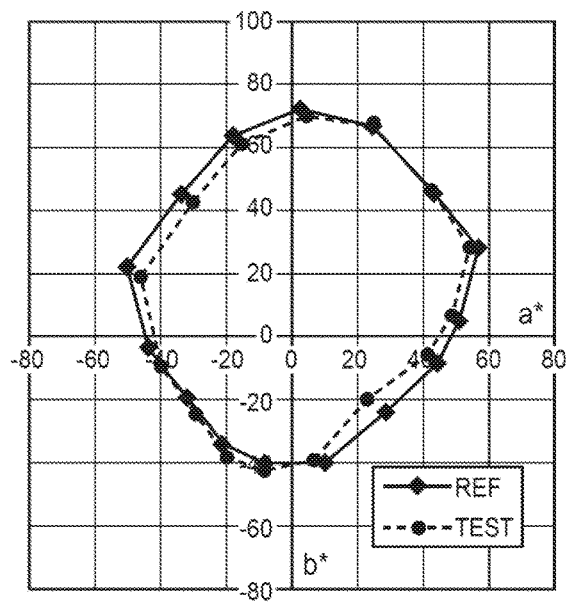
*FIG._8C(ii)*

| BSY + 605 nm LED | |
|---|---|
| LER | 340.3 |
| x | 0.3447 |
| y | 0.3538 |
| CCT | 5022 |
| Duv | 0.00127 |
| CRI Ra | 81.02 |
| R9 | -24.4 |
| CQS Qg | 96.8 |
*FIG._8D(i)*
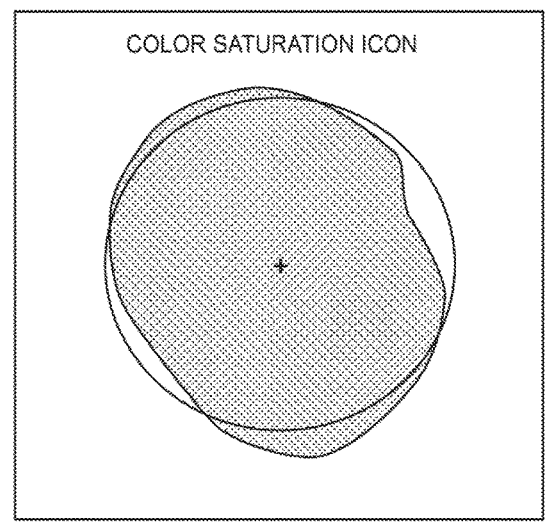
*FIG._8D(iii)*
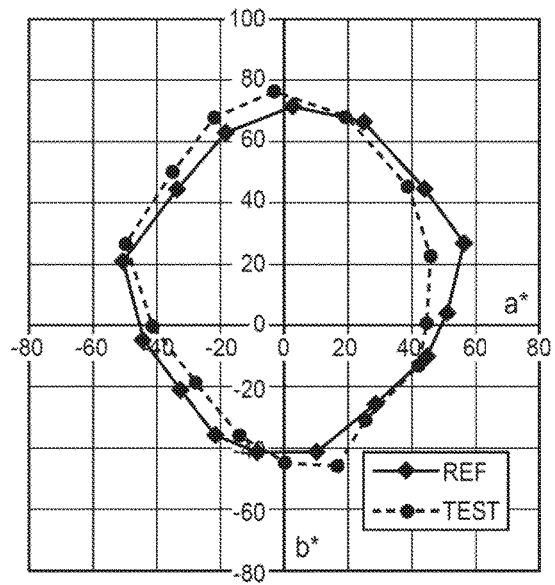
*FIG._8D(ii)*

| BSY + 615 nm LED | |
|---|---|
| LER | 330.9 |
| x | 0.3466 |
| y | .03534 |
| CCT | 4951 |
| Duv | 0.00032 |
| CRI Ra | 87.26 |
| R9 | 59.2 |
| CQS Qg | 102.8 |
FIG._8E(i)
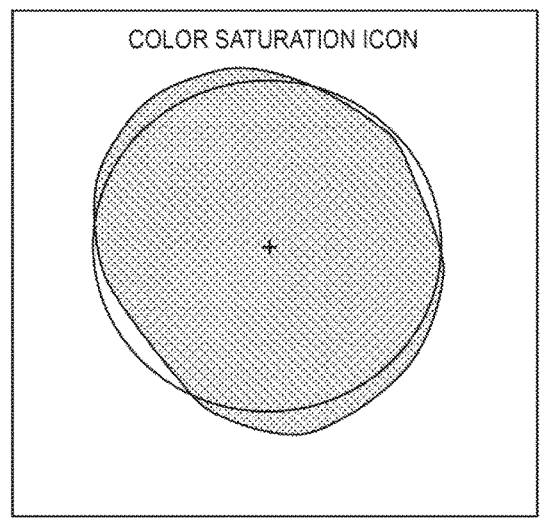
FIG._8E(iii)
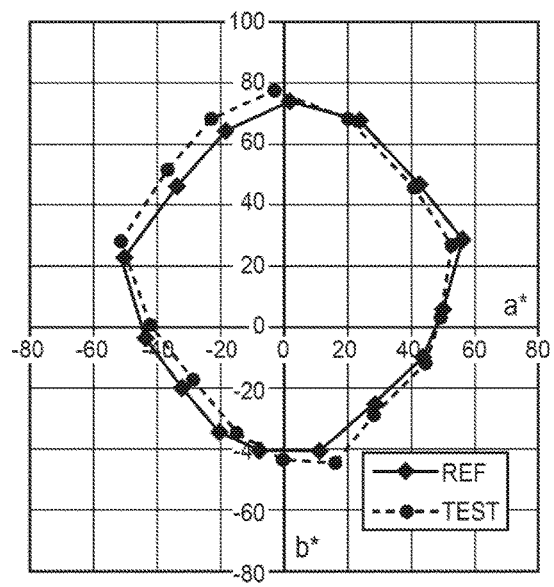
FIG._8E(ii)

| BSY + 628 nm LED | |
|---|---|
| LER | 311 |
| x | 0.3452 |
| y | 0.3509 |
| CCT | 4991 |
| Duv | -0.00043 |
| CRI Ra | 86.1 |
| R9 | 72.3 |
| CQS Qg | 107.8 |
*FIG._8F(i)*
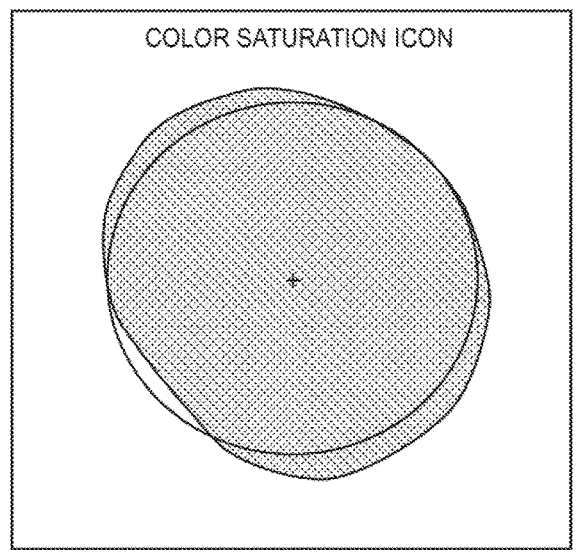
*FIG._8F(iii)*
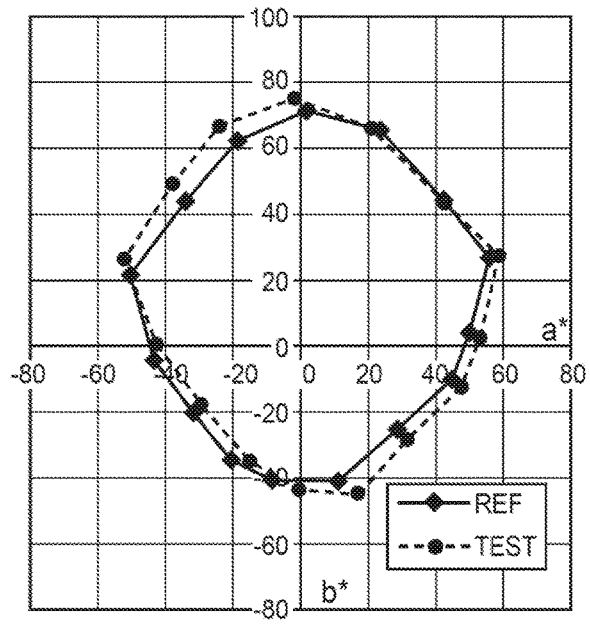
*FIG._8F(ii)*

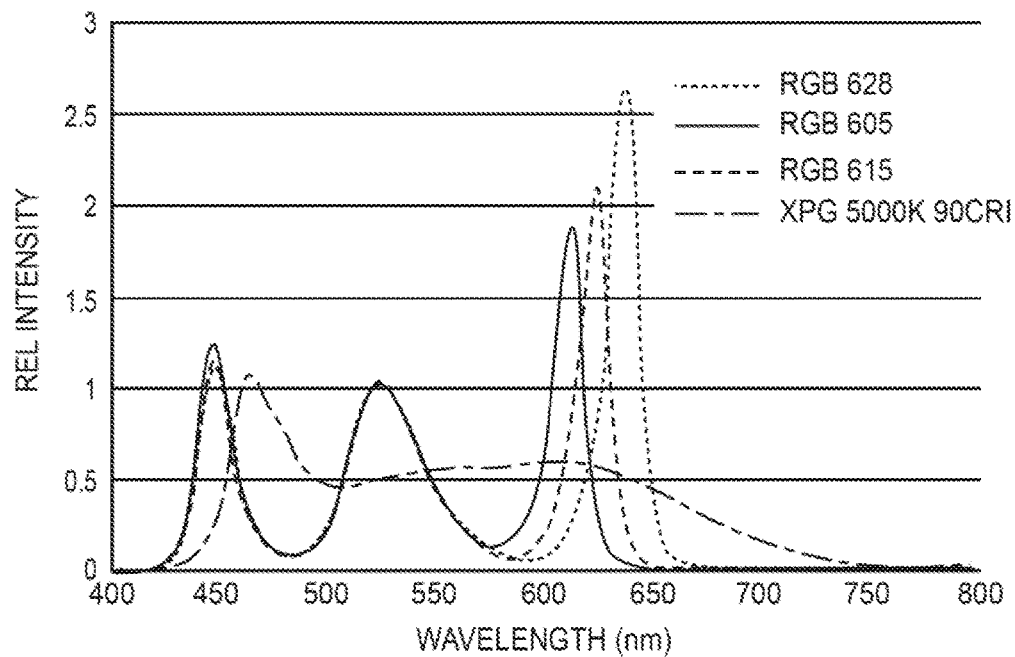
FIG._9A
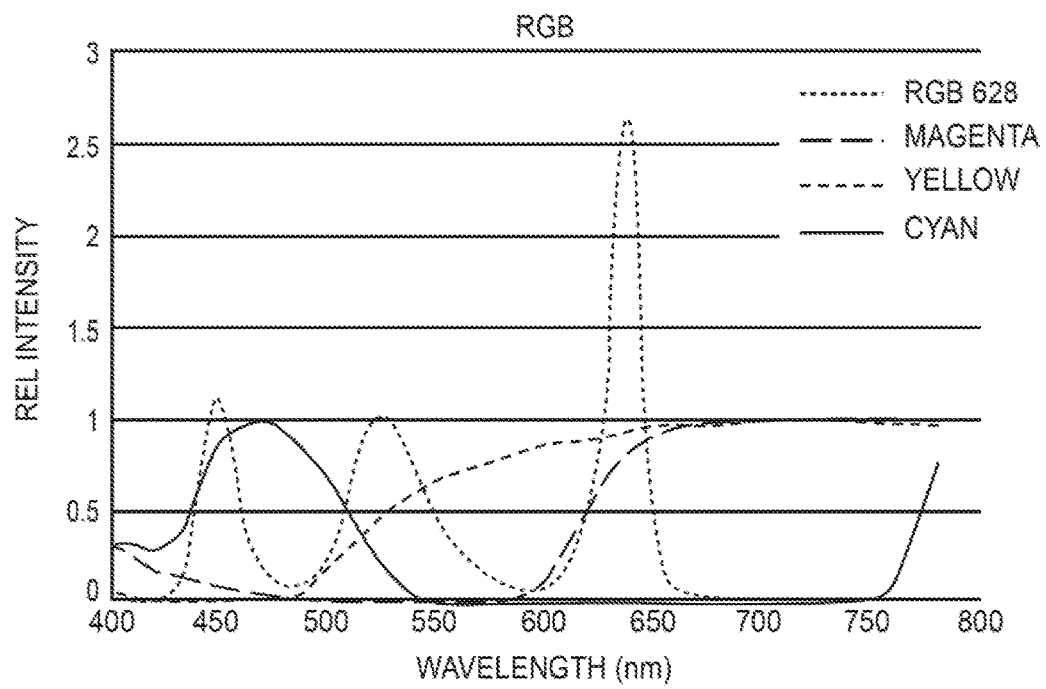
FIG._9B

| RGB – 605 nm dom. red WL | |
|---|---|
| Blue peak | 447 |
| Red peak | 612 |
| LER | 343.7 |
| S:P ratio | 2.15 |
| Rf | 3.5948 |
| x | 0.3405 |
| y | 0.3518 |
| u' | 0.2083 |
| v' | 0.4841 |
| CCT | 5179 |
| Duv | 0.00196 |
| CRI Ra | 79.89 |
| R9 | 45.8 |
| R9 prime | 45.8 |
| CQS Qa | 79 |
| CQS Qf | 74.6 |
| CQS Qg | 115.6 |
FIG._9C(i)
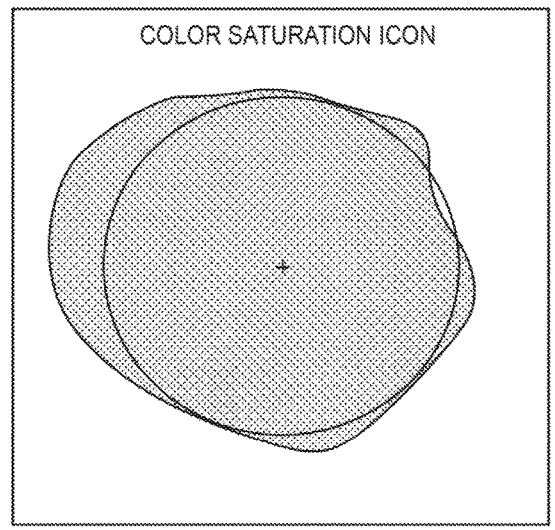
FIG._9C(iii)
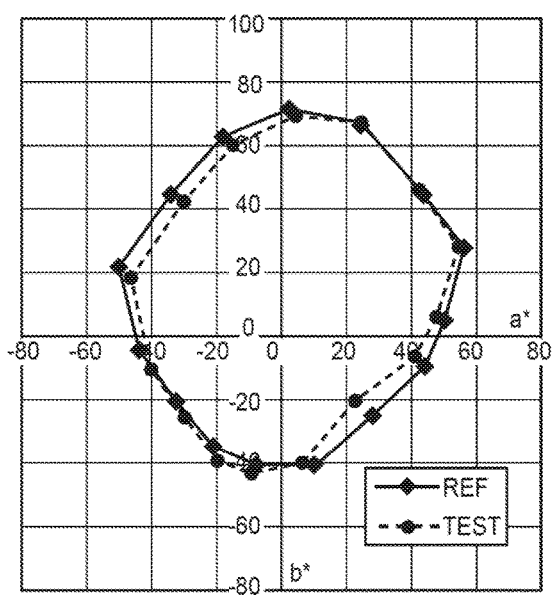
FIG._9C(ii)

| RGB – 615 nm dom. red WL | |
|---|---|
| Blue peak | 447 |
| Red peak | 624 |
| LER | 314 |
| S:P ratio | 2.26 |
| Rf | 3.5948 |
| x | 0.3393 |
| y | 0.3487 |
| u' | 0.2086 |
| v' | 0.4824 |
| CCT | 5222 |
| Duv | 0.00094 |
| CRI Ra | 56.46 |
| R9 | -45.3 |
| R9 prime | 240.8 |
| CQS Qa | 62.2 |
| CQS Qf | 57.7 |
| CQS Qg | 131.9 |
*FIG._9D(i)*
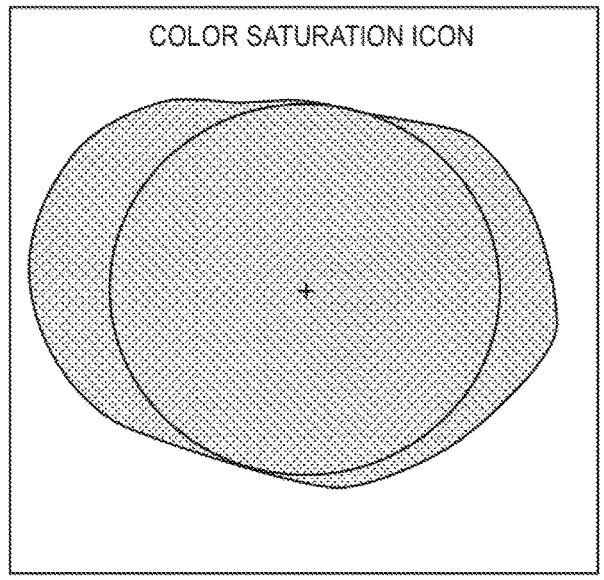
*FIG._9D(iii)*
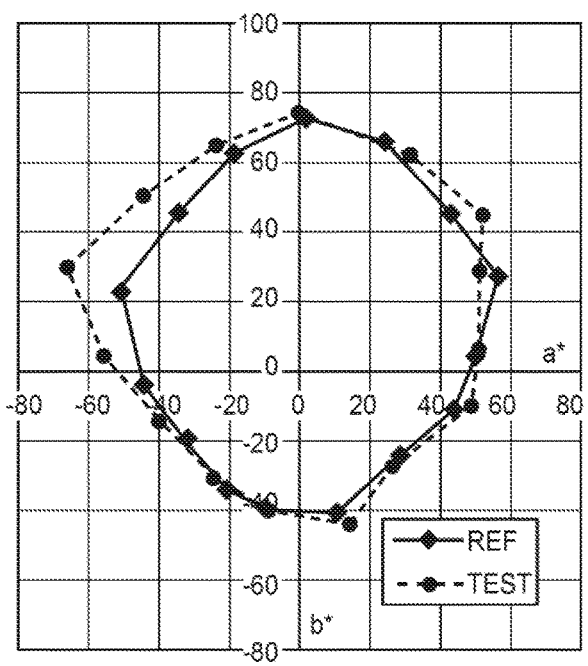
*FIG._9D(ii)*

| RGB – 628 nm dom. red WL | |
|---|---|
| Blue peak | 447 |
| Red peak | 637 |
| LER | 272.1 |
| S:P ratio | 2.32 |
| Rf | 3.5948 |
| x | 0.339 |
| y | 0.3502 |
| u' | 0.2078 |
| v' | 0.4831 |
| CCT | 5235 |
| Duv | 0.00183 |
| CRI Ra | 37.91 |
| R9 | -196.5 |
| R9 prime | 381.5 |
| CQS Qa | 45.9 |
| CQS Qf | 43.5 |
| CQS Qg | 141.7 |
*FIG._9E(i)*
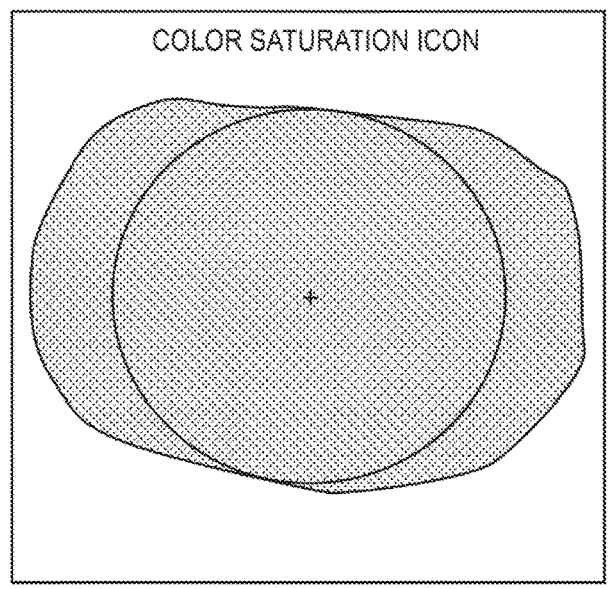
*FIG._9E(iii)*
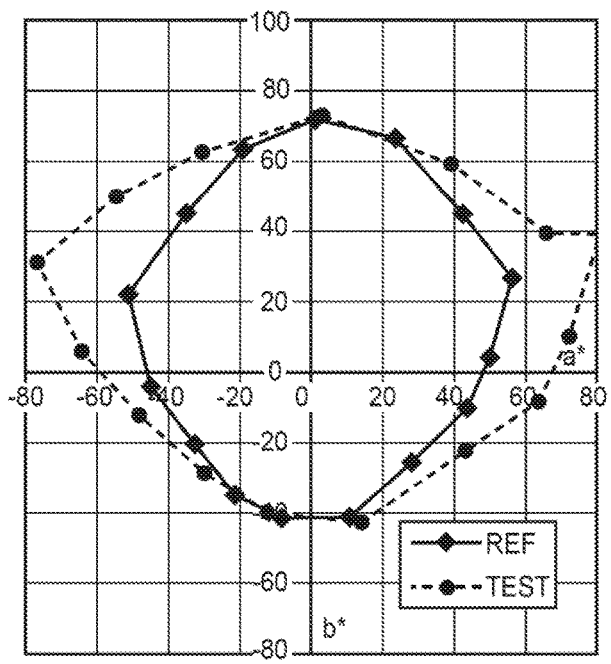
*FIG._9E(ii)*

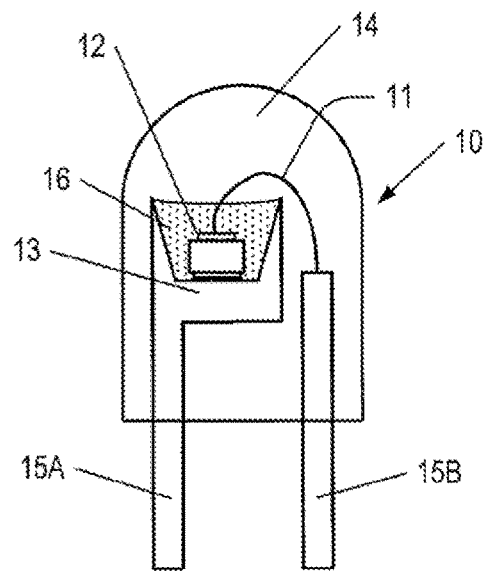
*FIG._11A*
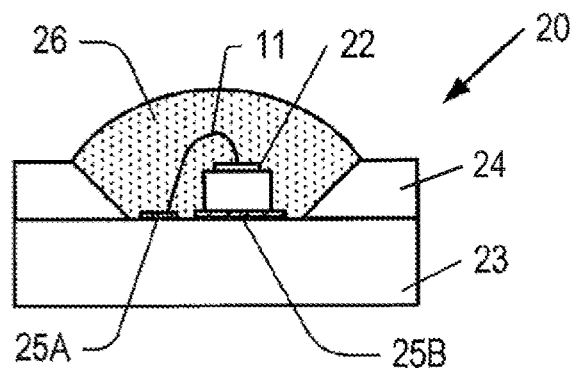
*FIG._11B*
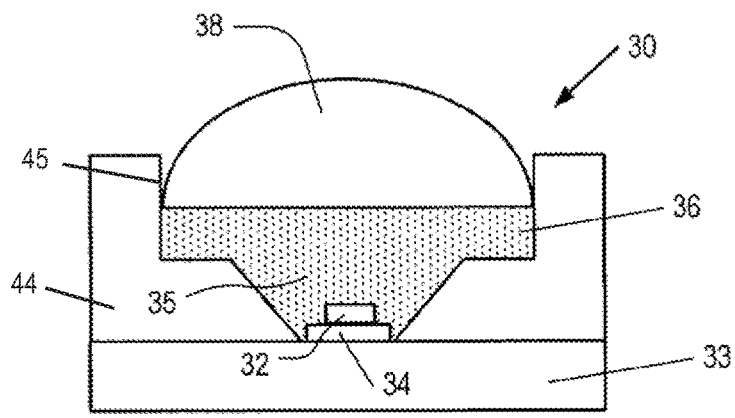
*FIG._11C*

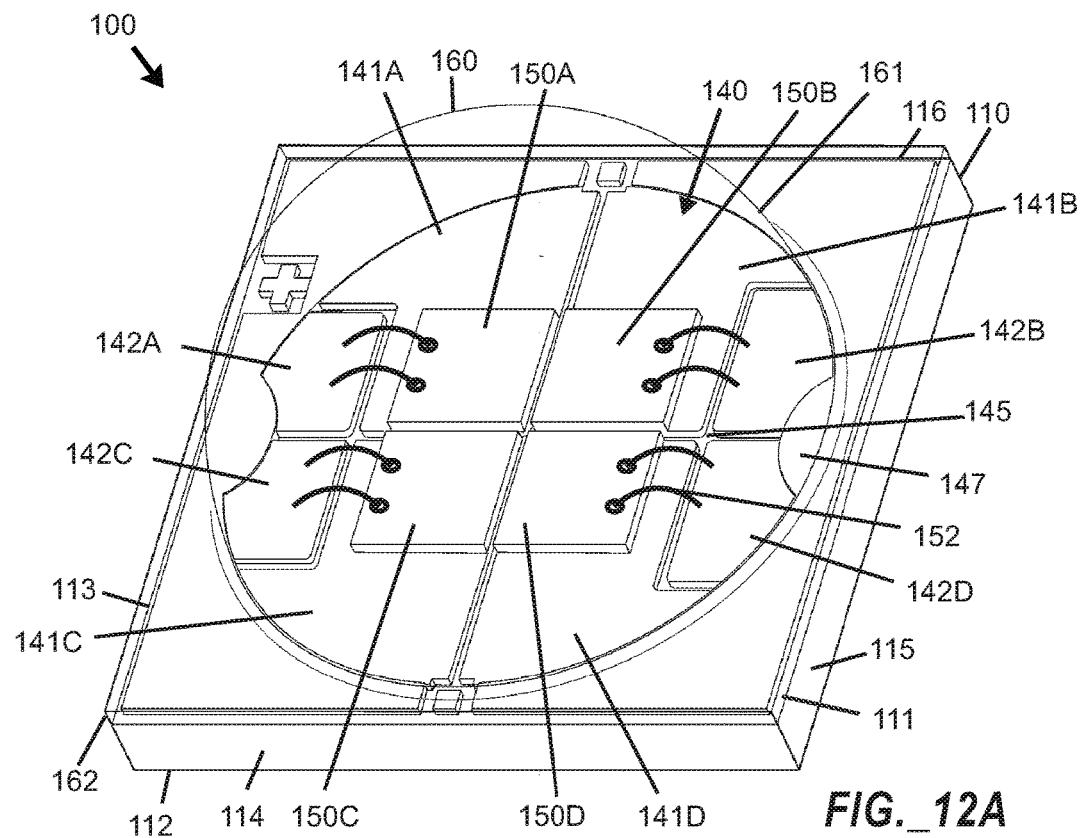
FIG._12A
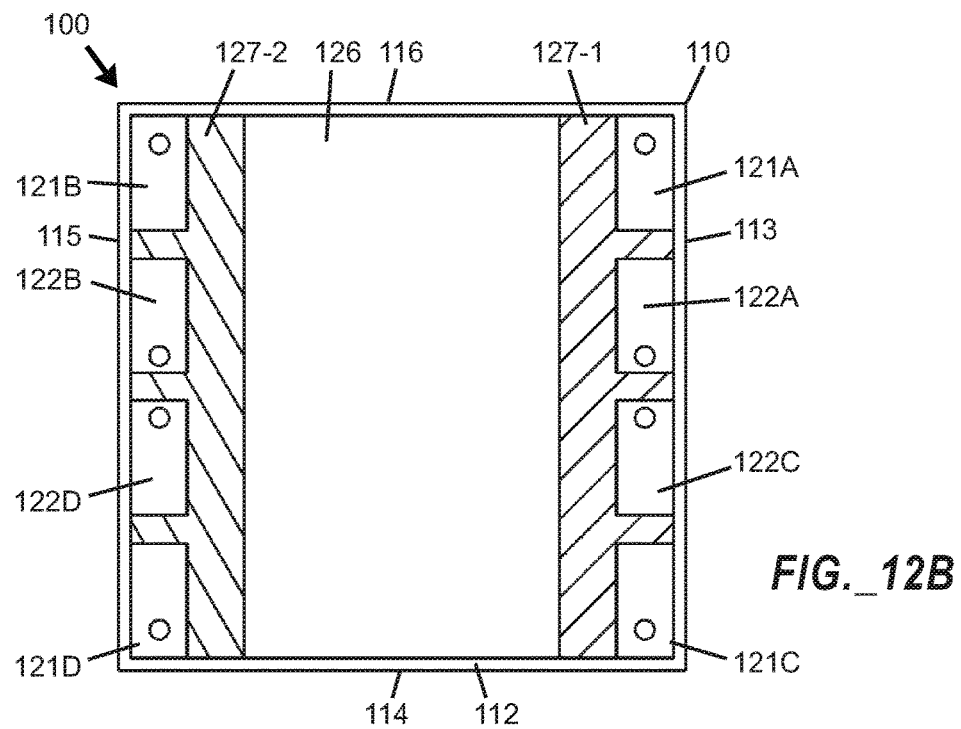
FIG._12B

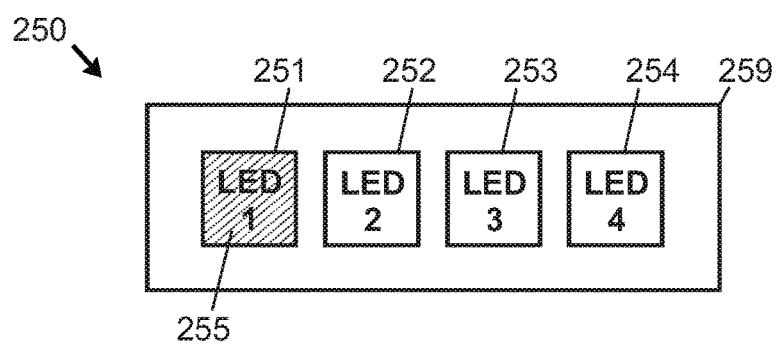
FIG. _13F
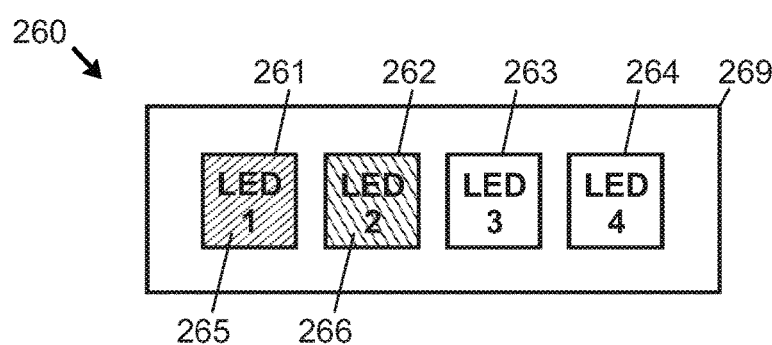
FIG. _13G
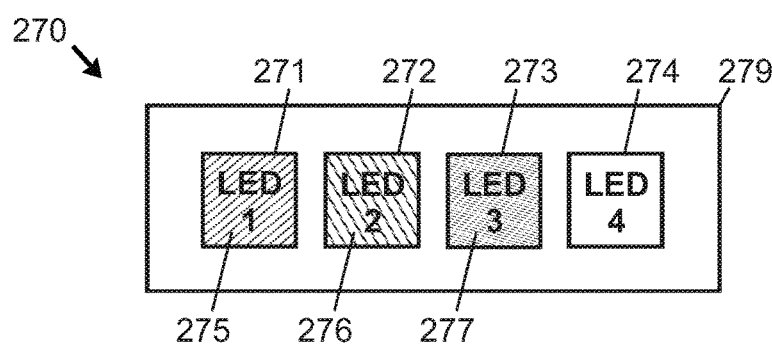
FIG. _13H

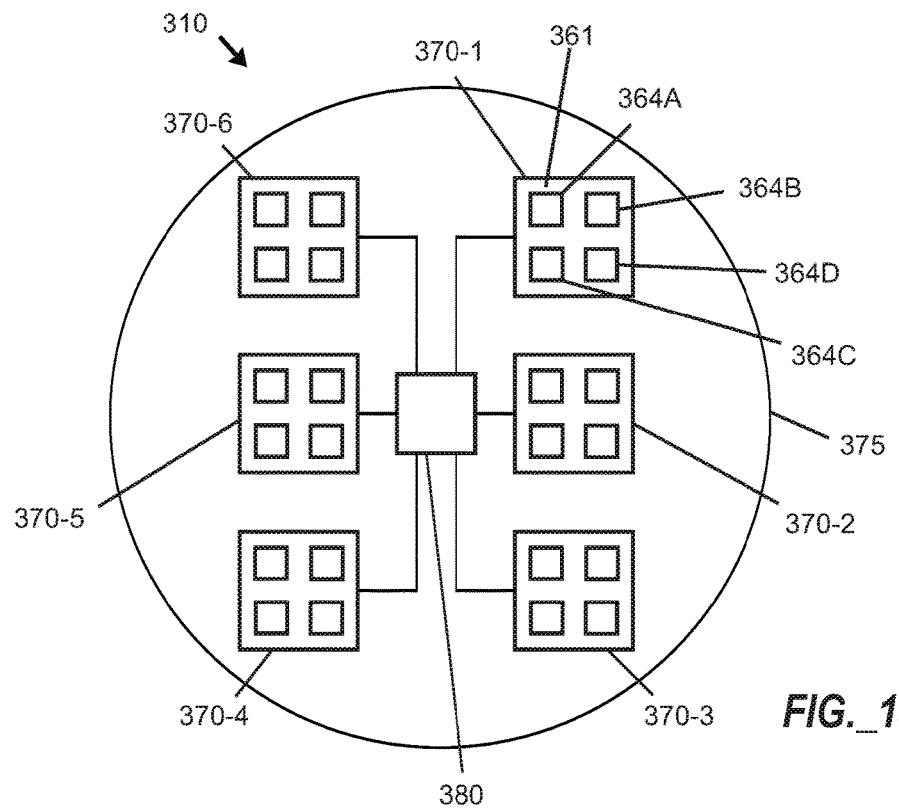
FIG._14
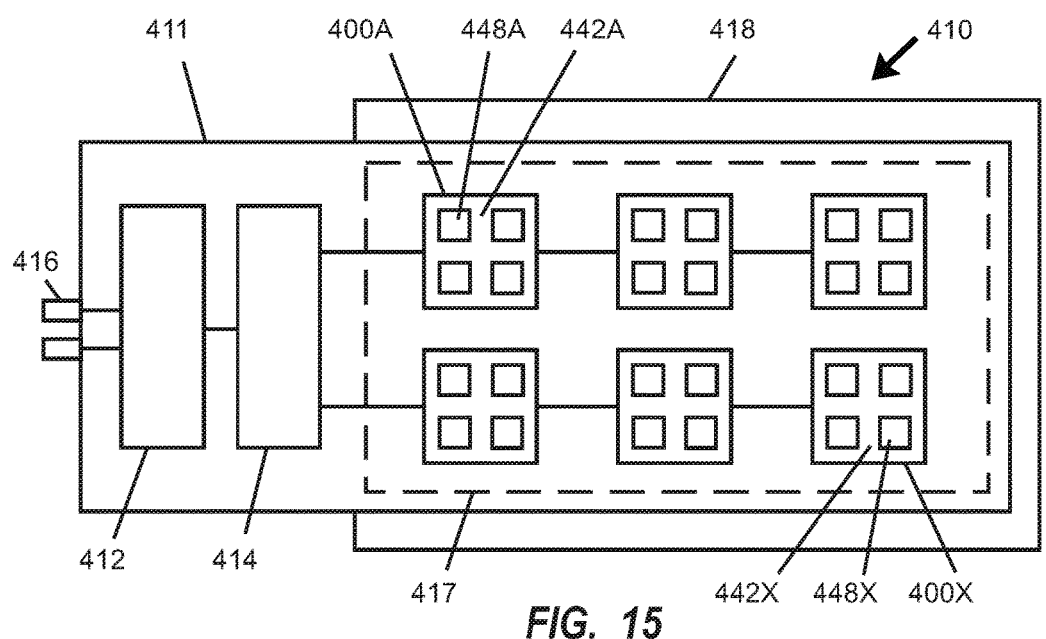
FIG._15

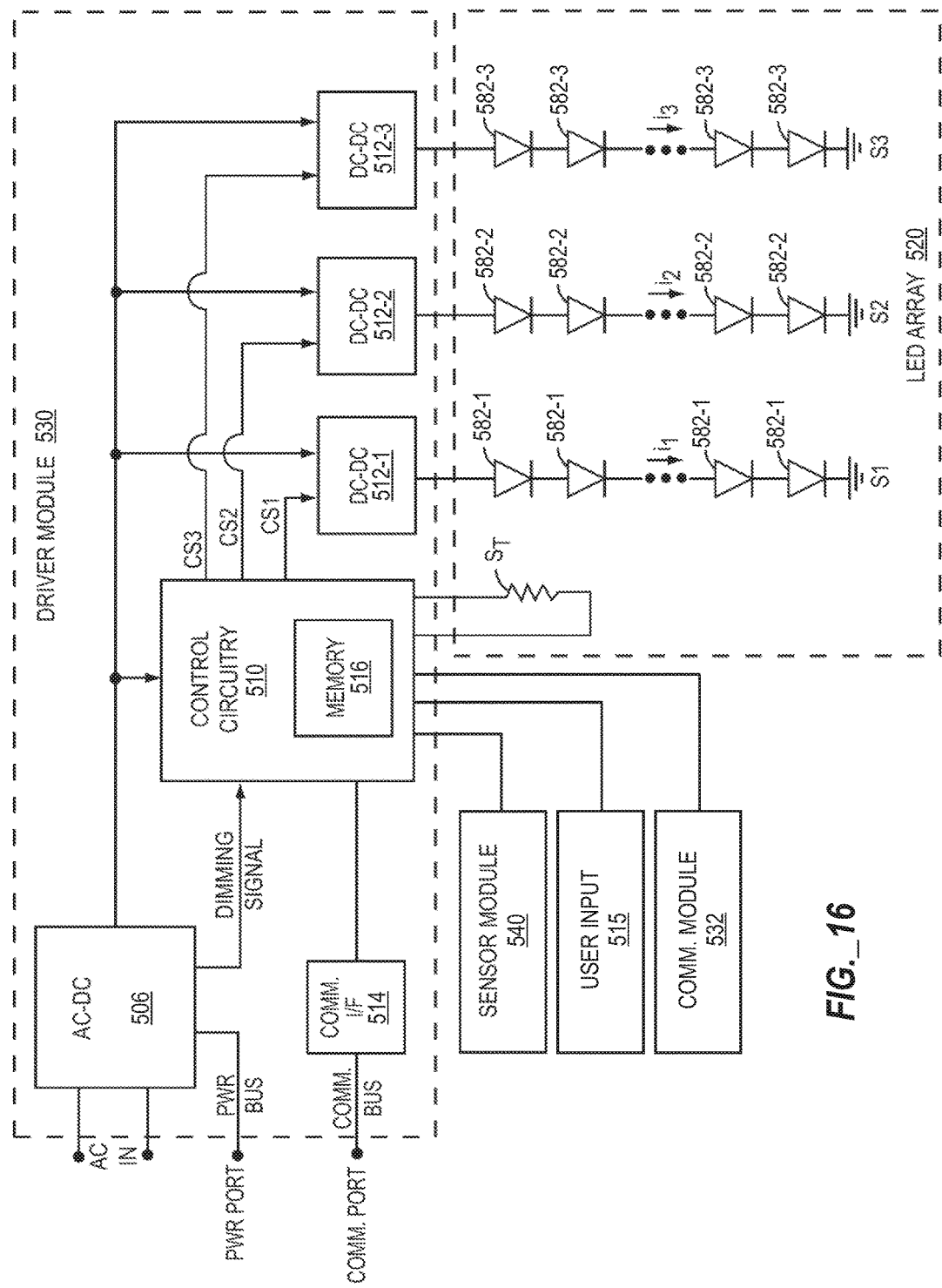
FIG. _16

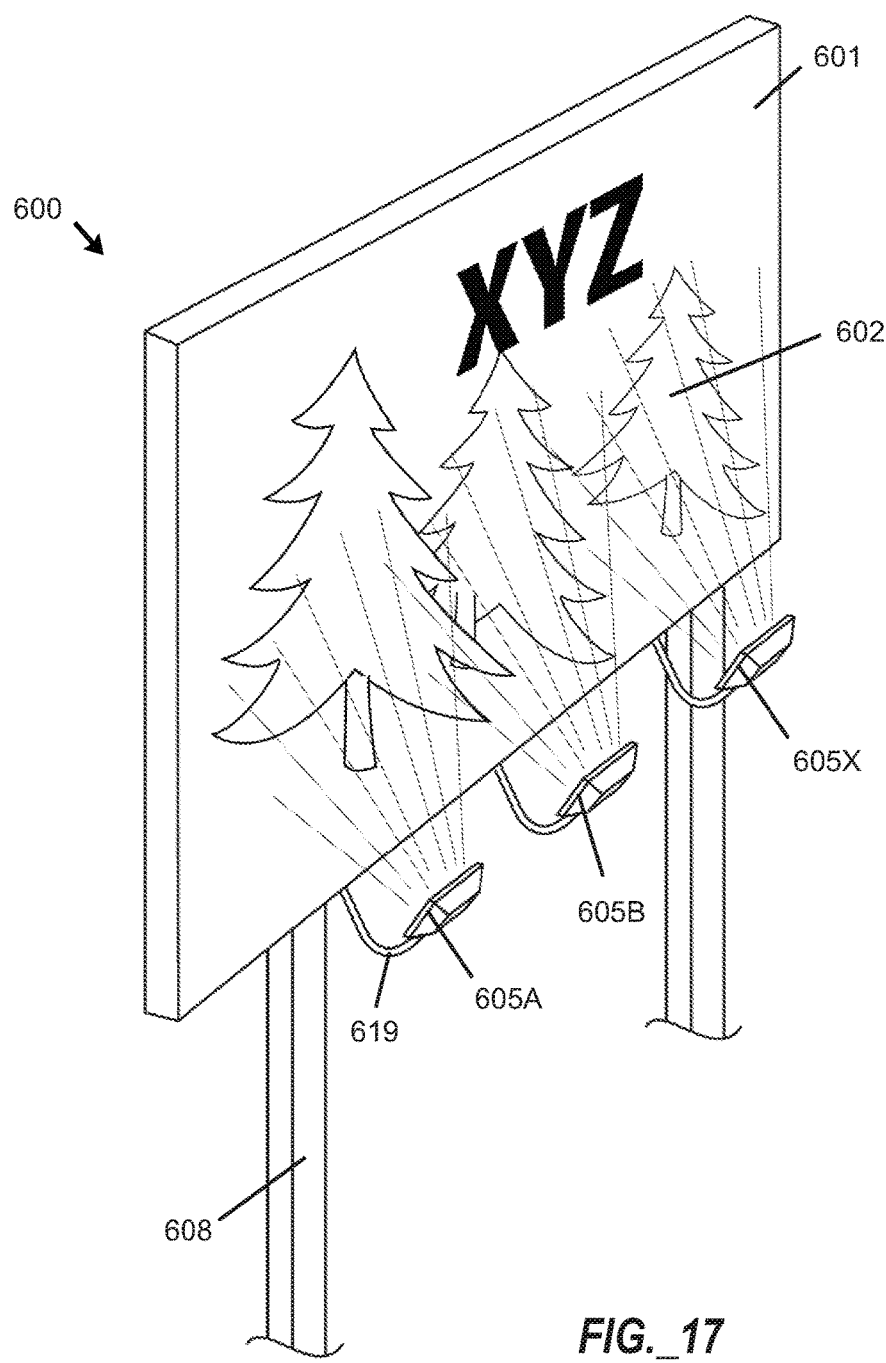
FIG._17

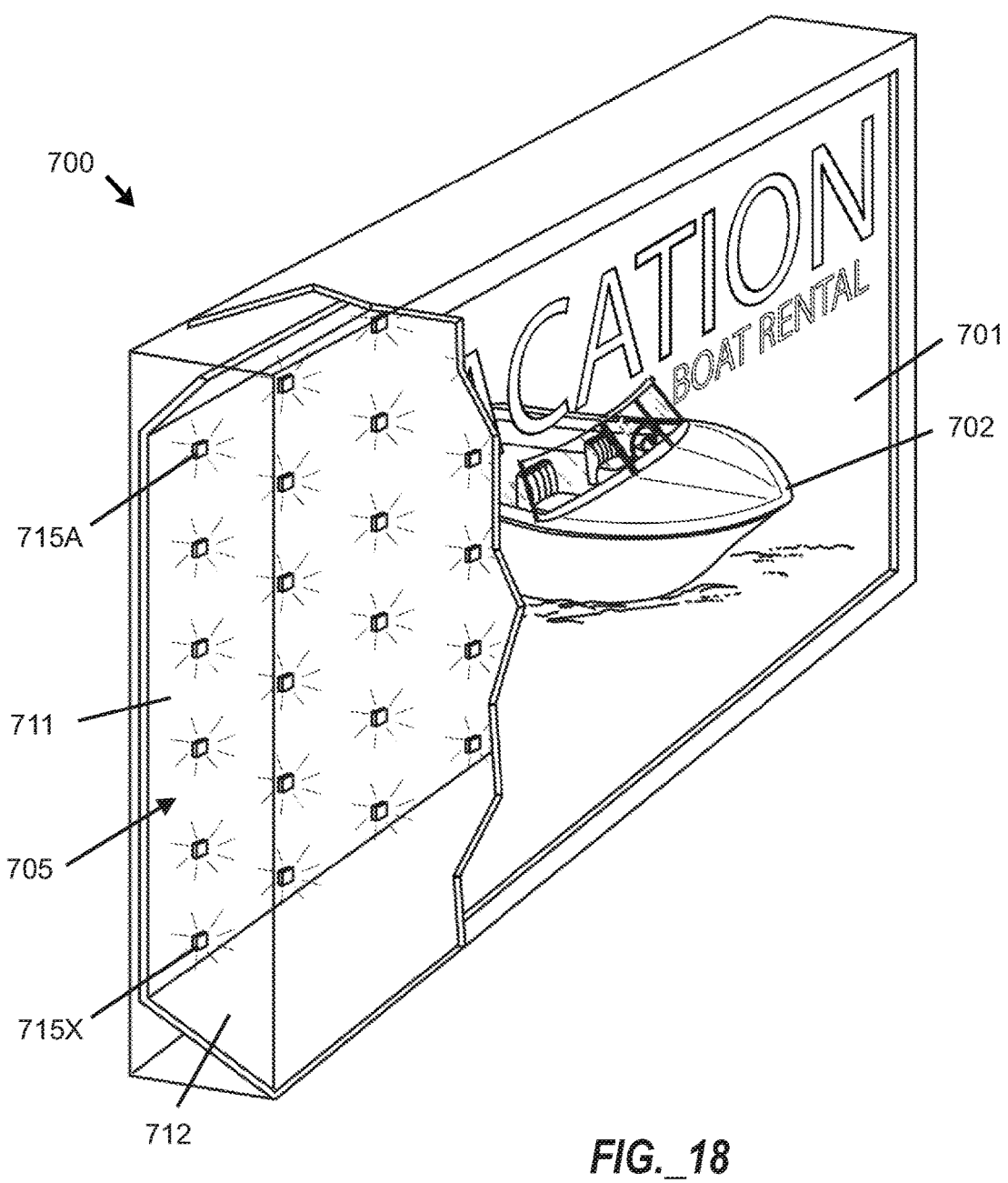
FIG._18

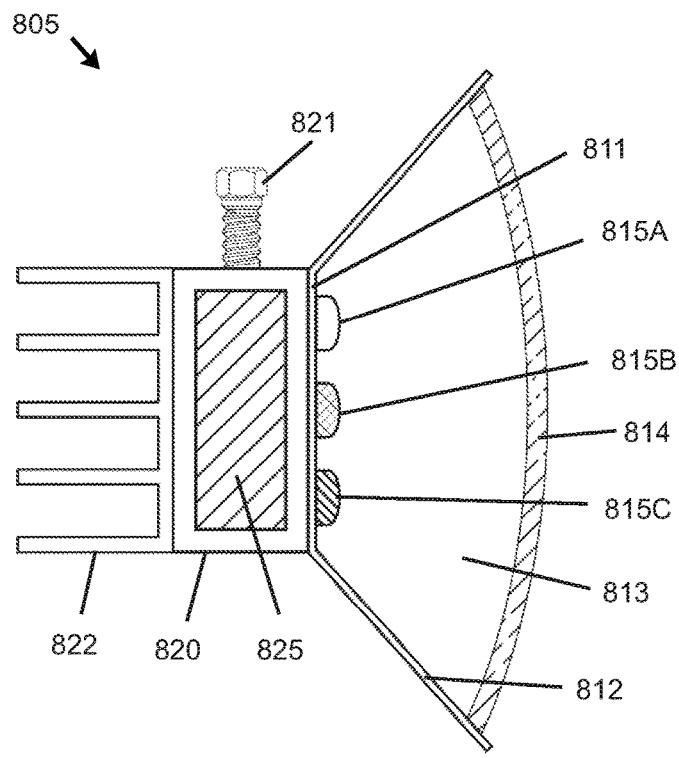
FIG._19
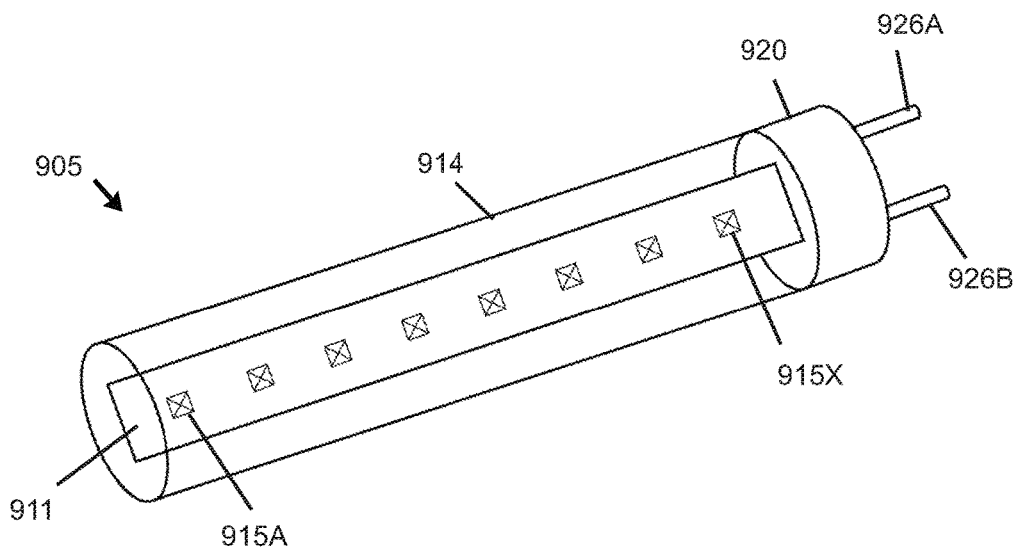
FIG._20

LIGHTING DEVICES INCLUDING SOLID STATE EMITTER GROUPS FOR ILLUMINATING PRINTED MATERIAL WITH ENHANCED VIBRANCY

CROSS-REFERENCE TO RELATED APPLICATION(S)

This application is a non-provisional of and claims priority to U.S. Provisional Patent Application No. 62/189,413 filed on Jul. 7, 2015. The entire contents of the foregoing provisional application are hereby incorporated by reference herein.

TECHNICAL FIELD

Subject matter herein relates to lighting devices, including devices with emitters or groups of solid state light emitters for illuminating printed material to provide desired effects, and relates to associated methods of making and using such devices.

BACKGROUND

Combining light sources of different spectra permit lighting devices to emit a light spectrum of almost any desired energy content. For example, red light can be combined with unsaturated green light to yield a light spectrum that renders colors similar to daylight or similar to incandescence depending on the amount of accompanying blue light. Using red, green, and blue light sources, colors from such sources can be combined in any proportion to yield any aggregate color within the gamut of colors.

Color is the visual effect that is caused by the spectral composition of the light emitted, transmitted, or reflected by objects. Color derives from the spectrum of light (i.e., distribution of light power versus wavelength) interacting in the eye with the spectral sensitivities of light receptors, including cones that are differently receptive to red, green, and blue light. Color categories and physical specifications of color are also associated with objects, materials, light sources, and the like based on their physical properties such as light absorption, reflection, and emission spectra.

Color is subjective, since it is generated within the visual cortex. Unlike the sensations of taste, smell, or feeling, color is not a characteristic of objects, but instead of the light that enters our eyes from the objects. Objects are visible or seen as colored only when light reaches our eyes after interaction with such objects. The same object may be seen in different colors when observed under varying lights. In the absence of light, all colors disappear.

Color reproduction may be performed according to additive or subtractive processes. One example of an additive color reproduction process is RGB color applied to a light-emitting color television or monitor. In such a context, images may be formed on an initially dark screen by illuminating pixels with light sources of basic colors (e.g., red, green, and blue), wherein any two basic colors in combination produce secondary colors (cyan, magenta, or yellow), and all three basic colors in combination produce white.

One example of a subtractive color reproduction process is ink printing on an initially white substrate. Since white is the presence of all color, the printing of colored ink onto an initially white substrate effectively "subtracts" color from the substrate. Typically, cyan (C), magenta (M), and yellow (Y) inks are used in color printing processes. Cyan can be thought of as minus-red, magenta as minus-green, and yellow as minus-blue. These inks are semi-transparent or translucent. Where two such inks overlap on a substrate (e.g., paper) due to sequential printing impressions, a primary color is perceived. For example, yellow (minus-blue) overprinted by magenta (minus-green) yields red. Hues are produced by overlapping and spacing the absorption spectra of the different inks on a reflective substrate. The ink density or thickness is typically constant but the area reflected by each ink is variable. White point is not affected by the ink. In regions where all three inks overlap, almost all incident light is absorbed or subtracted, yielding a near-black condition. Due to imperfect pigments and dyes, however, a combination of cyan, magenta, and yellow inks does not fully extinguish color of a light colored substrate, and typically yields a dark muddy color. To enhance the ability to produce black color, black ink is often added (referred to as "K," which stands for "key" as a traditional word for a black printing plate). The resulting combination of four inks (cyan, magenta, yellow, and black) is commonly referred to as "CMYK." When CMYK inks are used on a white substrate, there are effectively only eight spectra—namely black, white (substrate), cyan, yellow, magenta, blue (obtained by cyan+magenta), green (obtained by yellow+cyan), and red (obtained by yellow+cyan). Black and white may be regarded as neutral.

Most printed material uses Process Blue (PB15:3), Process Red (PR57-1), and Process Yellow (PY-12) inks. ISO Standard No. 2846-1-2006 entitled "Graphic technology—Colour and transparency of printing ink sets for four-colour printing" defines a method of testing inks to ensure acceptable color performance, and provides "typical" spectra for acceptable inks. A plot of reflected intensity versus wavelength for a white substrate as well as four standard CMYK inks derived from the above-identified ISO standard is provided in FIG. 1A. FIG. 1B includes the diagram of FIG. 1A with addition of a dashed oval at the intersection between the blue and yellow reflectance spectra. The presence of imperfect boundaries (including overlaps) between colored inks, such as within the dashed oval shown in FIG. 1B, causes reflected colors to be less vibrant and therefore muddled.

Additive and subtractive color reproduction processes differ in the manner they work, but ultimately achieve the same objective of providing reflection of three basic colors of red, green, and blue that are perceptible by the human eye under appropriate conditions. Because additive color spaces are defined by light and not colorants, devices employing additive color reproduction processes generally have a larger color gamut than devices employing subtractive color reproduction processes. As a result, vivid colors are more challenging to produce using a subtractive color reproduction process than using an additive color reproduction process.

Quality artificial lighting generally attempts to emulate the characteristics, including color rendering characteristics, of natural light. Natural light sources include daylight with a relatively high correlated color temperature (CCT) (e.g., ~5000K), and incandescent lamps with a lower CCT (e.g., ~2800K). A commonly accepted measure of color reproduction for light sources is Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which are pastel colored with low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same CCT. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight and blackbody sources are superior to many artificial light sources for emphasizing and distinguishing color. The ability of human vision to differentiate color is different under CCT conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low CCT sources (e.g., incandescent emitters) have a GAI of approximately 50% (i.e., about half the gamut area of the EES source). Sources with higher CCT values have a larger GAI. For example, a very bluish light with a CCT of 10000K may have a GAI of 140%.

Another way of characterizing how saturated an illuminant makes objects appear is relative gamut area, or "Qg" (also referred to as "Color Quality Scale Qg" or "CQS Qg"), which is the area formed by (a*, b*) coordinates of the 15 test-color samples in CIELAB normalized by the gamut area of a reference illuminant at the same CCT and multiplied by 100. In a manner similar to GAI, Qg values can exceed 100; however, Qg values are scaled for consistency relative to CCT. Because of chromatic adaptation, and because CCT is selected to set the overall color tone of an environment as part of the lighting design process, variable-reference measures such as Qg may be especially relevant to applied lighting design. If the relative gamut is greater than that of the reference, and if illuminance is lower than that provided by daylight, then an increase in preference and discrimination might be expected relative to the reference at that same CCT. Conversely, if the relative gamut is smaller than that of the reference, then a decrease in preference and discrimination might be expected relative to the reference at the same CCT.

Significant resources are expended in illuminating printed material (e.g., including CMY or CMYK inks) on upright surfaces, such as posters, billboards, signs, packaging, point of purchase product displays, and the like. Billboards have traditionally been illuminated with fluorescent, metal halide, or phosphor converted white LEDs (such as disclosed in U.S. Patent Application Publication No. 2009/0077847A1) to provide high luminous efficacy at a relatively low cost. In certain contexts, it may be challenging to illuminate printed material with appropriate accuracy/naturalness of colors therein, to illuminate printed material with enhanced attractiveness, and/or to reduce the energy required to provide adequate illumination. The art continues to seek improved lighting devices and methods that address limitations of conventional lighting devices and methods.

SUMMARY

The present disclosure relates to devices and methods for illuminating printed material on surfaces (e.g., upright surfaces) using combinations of solid state light emitters. In certain embodiments, vibrancy may be enhanced by increasing the effective steepness of printed ink reflectance wavelength boundaries by illuminating printed material with solid state light emitters of multiple colors having tailored boundaries, such as increased effective separation between colors and/or increased energy in spectral areas (e.g., green) that are absorbed too greatly by CMYK inks. In certain embodiments, efficacy may be improved by preferentially increasing energy of light emissions at or near the most visibly reflective wavelengths of the spectra for one or multiple inks used in the printed material (thereby enhancing reflection), and/or by reducing energy of light emissions at wavelengths to which the human eye is less sensitive. While artificial light sources have traditionally focused on providing high efficacy and/or high color rendering values without necessarily taking into account specific properties of the surface(s) to be illuminated, the inventors have found that in the context of illuminating upright surfaces including material printed with CMY or CMYK inks, efficacy and/or vibrancy (including brightness and vividness in combination) can be improved utilizing solid state light sources with multiple peak wavelengths, wherein one or more peak widths are relatively narrow, multiple peaks are widely spaced relative to one another, and/or one or more peak wavelengths are at or near visibly reflective peak wavelengths of the spectra for one more inks forming the printed material.

In one aspect, a lighting device is configured for illuminating a surface (e.g., an upright surface) including printed material, wherein the lighting device includes a plurality of solid state light emitter groups. In certain embodiments, the printed material may include cyan, magenta, and yellow ink. Each solid state light emitter group of the plurality of solid state light emitter groups includes at least one first solid state light emitter arranged to generate first emissions comprising a first peak wavelength, and at least one second solid state light emitter arranged to generate second emissions comprising a second peak wavelength that differs by at least 40 nm from the first peak wavelength and differs by at least 40 nm from any other peak wavelength optionally generated by the at least one first solid state light emitter. Aggregate emissions of the lighting device include emissions of the plurality of solid state light emitter groups and provide a luminous flux of at least 2000 lumens, at least 5000 lumens, at least 10,000 lumens, at least 15,000 lumens, at least 20,000 lumens, or another threshold specified herein (with one or more of the preceding minimum values optionally being bounded by an upper limit of 10,000 lumens, 20,000 lumens, or 50,000 lumens). Together with the foregoing luminous flux threshold, emissions of the lighting device include a luminous efficacy of at least 70 lumens per watt, at least 80 lumens per watt, at least 90 lumens per watt, or at least 100 lumens per watt (with one or more of the preceding minimum values optionally being bounded by an upper limit of 100 lumens per watt, 125 lumens per watt, 150 lumens per watt, or 175 lumens per watt). In certain embodiments, at least one first solid state light emitter comprises a blue LED and at least one second solid state light emitter comprises at least one of a green LED and a red LED. In certain embodiments, at least one first solid state light emitter comprises a blue electrically activated solid state light emitter arranged to stimulate emissions of at least one lumiphoric material having a dominant wavelength in a green or yellow range. In certain embodiments, the second peak wavelength is in a range of from 630 nm to 680 nm. In certain embodiments, each solid state light emitter group of the plurality of solid state light emitter groups may include at least one third solid state light emitter arranged to generate third emissions comprising a third peak wavelength that differs from the second peak wavelength by at least 40 nm, that differs from the first peak wavelength by at least 40 nm, and that differs by at least 40 nm from any other peak wavelengths optionally generated by the at least one first solid state light emitter and the at least one second solid state light emitter. In certain embodiments, the first peak wavelength is in a range of from 430 nm to 480 nm, the second peak wavelength is in a range of from 510 nm to 580 nm, and the third peak wavelength is in a range of from 600 nm to 680 nm. In certain embodiments, the lighting device includes one or both of the following features: (i) the at least one second solid state light emitter is arranged to produce emissions having a full width-half maximum intensity value of no greater than 35 nm; or (ii) the third peak wavelength is in a range of from 630 nm to 680 nm. In certain embodiments, at least one second solid state light emitter comprises a green LED and the second peak wavelength is in a range of from 520 nm to 535 nm. In certain embodiments, the plurality of solid state light emitter groups is arranged in front of the upright surface including printed material; alternatively, the plurality of solid state light emitter groups may be arranged behind an illuminated surface of the upright surface including printed material. In another aspect, an outdoor billboard, poster, or illuminated sign includes a lighting device as disclosed herein.

In another aspect, a lighting device is configured for illuminating a surface (e.g., an upright surface) including printed material, wherein the lighting device includes a plurality of solid state light emitter groups. In certain embodiments, the printed material may include cyan, magenta, and yellow ink. Each solid state light emitter group of the plurality of solid state light emitter groups includes at least one first solid state light emitter arranged to generate first emissions comprising a dominant wavelength in a blue range, at least one second solid state light emitter arranged to generate second emissions comprising a dominant wavelength in a green or yellow-green range, and at least one third solid state light emitter arranged to generate third emissions comprising a dominant wavelength in a red or red-orange range, and aggregate emissions of the lighting device include at least a portion of the first emissions, at least a portion of the second emissions, and at least a portion of the third emissions. The lighting device further includes at least one (or, alternatively, at least two, or at least three, or all four) of the following features: (a) the at least one first solid state light emitter is arranged to stimulate emissions of a lumiphoric material arranged to produce lumiphor emissions in a green or yellow-green range; (b) the at least one second solid state light emitter is arranged to produce emissions having a full width-half maximum intensity value of no greater than 35 nm; (c) the at least one third solid state light emitter comprises a peak wavelength in a range of from 630 nm to 680 nm; or (d) the aggregate emissions comprise a R9-prime color rendering value of greater than 110. In certain embodiments, the lighting device comprises a control circuit configured to operate the plurality of solid state light emitter groups in a plurality of operating modes including a first mode wherein the aggregate emissions comprise a first relative gamut value and including a second mode wherein the aggregate emissions comprise a second relative gamut value, wherein the second relative gamut value is at least 10% (or at least 15%, at least 20%, at least 25% or at least 30%) greater than the first relative gamut value. In certain embodiments, the first peak wavelength is in a range of from 430 nm to 480 nm, the second peak wavelength is in a range of from 510 nm to 580 nm, and the third peak wavelength is in a range of from 600 nm to 680 nm. In certain embodiments, aggregate emissions of the lighting device include emissions of the plurality of solid state light emitter groups and provide a luminous flux of least 2000 lumens, at least 5000 lumens, at least 10,000 lumens, at least 15,000 lumens, at least 20,000 lumens, or another threshold specified herein (with one or more of the preceding minimum values optionally being bounded by an upper limit of 10,000 lumens, 20,000 lumens, or 50,000 lumens). In certain embodiments, emissions of the lighting device include a luminous efficacy of at least 70 lumens per watt, at least 80 lumens per watt, at least 90 lumens per watt, or at least 100 lumens per watt (with one or more of the preceding minimum values optionally being bounded by an upper limit of 100 lumens per watt, 125 lumens per watt, 150 lumens per watt, or 175 lumens per watt). In certain embodiments, each solid state light emitter group of the plurality of solid state light emitter groups further comprises at least one fourth solid state light emitter including a blue solid state light emitter arranged to stimulate emissions of a lumiphoric material arranged to produce lumiphor emissions in a green or yellow-green range. In certain embodiments, at least one of the first solid state light emitter, the second solid state light emitter, and the third solid state light emitter includes at least one lumiphoric material. In certain embodiments, at least one of the at least one first solid state light emitter, the at least one second solid state light emitter, and the at least one third solid state light emitter is devoid of a lumiphoric material. In certain embodiments, the plurality of solid state light emitter groups is arranged in front of an upright surface including printed material; alternatively, the plurality of solid state light emitter groups may be arranged behind an illuminated surface of an upright surface including printed material. In another aspect, an outdoor billboard, poster, or illuminated sign includes a lighting device as disclosed herein.

In another aspect, a lighting device is configured for illuminating a surface (e.g., an upright surface) including printed material, wherein the lighting device includes a plurality of solid state light emitter groups and at least one control circuit configured to operate the plurality of solid state light emitter groups in multiple operating modes having different gamut properties. In certain embodiments, the printed material may include cyan, magenta, and yellow ink. Each solid state light emitter group of the plurality of solid state light emitter groups includes at least one first solid state light emitter arranged to generate first emissions comprising a dominant wavelength in a blue range, at least one second solid state light emitter arranged to generate second emissions comprising a dominant wavelength in a green or yellow-green range, and at least one third solid state light emitter arranged to generate third emissions comprising a dominant wavelength in a red or red-orange range, and aggregate emissions of the lighting device include at least a portion of the first emissions, at least a portion of the second emissions, and at least a portion of the third emissions. The control circuit is configured to operate the plurality of solid state light emitter groups in a plurality of operating modes including a first mode wherein the aggregate emissions comprise a first relative gamut value and including a second mode wherein the aggregate emissions comprise a second relative gamut value, wherein the second relative gamut value is at least 10% greater than the first relative gamut value. In certain embodiments, the lighting device includes at least one sensor arranged to sense at least one of an environmental condition and a property of an upright surface and produce at least one sensor output signal, wherein the control circuit is configured to select or adjust an operating mode of the lighting device responsive to the at least one sensor output signal. In certain embodiments, the lighting device includes a time signal generating element or time signal receiving element arranged to provide at least one signal indicative of time, wherein the control circuit is configured to select or adjust an operating mode of the lighting device responsive to the at least one signal indicative of time. In certain embodiments, the lighting device includes a user input signal generating element or user input signal receiving element arranged to provide at least one signal indicative of a user input, wherein the control circuit is configured to select or adjust an operating mode of the lighting device responsive to the at least one signal indicative of a user input. In certain embodiments, the lighting device includes a wired or wireless communication signal receiving element arranged to receive a signal indicative of at least one of an environmental condition, a time or temporal condition, and a user input. In certain embodiments, at least one of the at least one first solid state light emitter, the at least one second solid state light emitter, and the at least one third solid state light emitter includes at least one lumiphoric material. In certain embodiments, at least one of the at least one first solid state light emitter, the at least one second solid state light emitter, and the at least one third solid state light emitter is devoid of a lumiphoric material. In another aspect, an outdoor billboard, poster, or illuminated sign includes a lighting device as disclosed herein.

In another aspect, a lighting device is configured for illuminating a surface (e.g., an upright surface) including printed material, wherein the lighting device includes an array of solid state light emitter groups and at least one control circuit configured to adjust operation of one or more solid state light emitters or subgroups of the array of solid state light emitter groups to preferentially illuminate one or more subregions of the surface (e.g., an upright surface). In certain embodiments, the printed material may include cyan, magenta, and yellow ink. Each solid state light emitter group of the array of solid state light emitter groups includes at least one first solid state light emitter arranged to generate first emissions comprising a dominant wavelength in a blue range, at least one second solid state light emitter arranged to generate second emissions comprising a dominant wavelength in a green or yellow-green range, and at least one third solid state light emitter arranged to generate third emissions comprising a dominant wavelength in a red or red-orange range. Aggregate emissions of the lighting device include at least a portion of the first emissions, at least a portion of the second emissions, and at least a portion of the third emissions. In certain embodiments, the lighting device comprises at least one sensor arranged to sense at least one of an environmental condition and a property of an upright surface and produce at least one sensor output signal, wherein the control circuit is configured to adjust operation of one or more solid state light emitters or subgroups of the array of solid state light emitter groups to preferentially illuminate one or more subregions of the upright surface responsive to the at least one sensor output signal. In certain embodiments, the lighting device comprises a user input signal generating element or user input signal receiving element arranged to provide at least one signal indicative of a user input, wherein the control circuit is configured to adjust operation of one or more solid state light emitters or subgroups of the array to preferentially illuminate one or more subregions of an upright surface responsive to the at least one signal indicative of a user input. In certain embodiments, the lighting device comprises a wired or wireless communication signal receiving element arranged to receive a signal indicative of an instruction set, wherein the control circuit is configured to utilize the instruction set to adjust operation of one or more solid state light emitters or subgroups of the array to preferentially illuminate one or more subregions of an upright surface. In certain embodiments, the adjustment of operation of one or more solid state light emitters or subgroups of the array to preferentially illuminate one or more subregions of an upright surface includes altering relative gamut of illumination of at least one subregion of an upright surface in comparison to at least one other subregion of the upright surface. In certain embodiments, the array of solid state light emitter groups is arranged in front of an upright surface including printed material; alternatively, the array of solid state light emitter groups may be arranged behind an illuminated surface of the upright surface including printed material.

In another aspect, a lighting device is configured for illuminating printed material comprising first, second, and third colored inks, paints, or dyes providing first, second, and third reflectance spectra comprising first, second, and third peak wavelengths, respectively, that differ from one another by at least about 40 nm, wherein the lighting device includes at least one first solid state light source comprising a dominant wavelength within about 20 nm of the first peak wavelength, at least one second solid state light source comprising a dominant wavelength within about 20 nm of the second peak wavelength, and at least one third solid state light source comprising a dominant wavelength within about 20 nm of the third peak wavelength; and includes two or more of the following characteristics (a) to (c): (a) a luminous efficacy of at least 80 lumens per watt; (b) an average color rendering index (CRI Ra) of at least 80; and (c) a relative gamut (Qg) of at least 100. In certain embodiments, two or more of the at least one first, the at least one second, and the at least one third solid state light source comprise an electrically activated solid state light emitter. In certain embodiments, one or more of the at least one first, the at least one second, or the at least one third solid state light source comprises a lumiphoric material. In certain embodiments, the lighting device includes at least one, at least two, or all three of the following features (i) to (iii): (i) the at least one first solid state light source comprises a dominant wavelength within about 10 nm of the first peak wavelength; (ii)

the at least one second solid state light source comprises a dominant wavelength within about 10 nm of the second peak wavelength; and (iii) the at least one third solid state light source comprises a dominant wavelength within about 10 nm of the third peak wavelength. In certain embodiments, the lighting device includes at least one or at least two of the following features (i) to (iii): (i) the at least one first solid state light source comprises a dominant wavelength within about 5 nm of the first peak wavelength; (ii) the at least one second solid state light source comprises a dominant wavelength within about 5 nm of the second peak wavelength; or (iii) the at least one third solid state light source comprises a dominant wavelength within about 5 nm of the third peak wavelength. In certain embodiments, the lighting device comprises a plurality of solid state light source clusters, wherein each solid state light source cluster of the plurality of solid state light source clusters includes a first solid state light source of the at least one first solid state light source, a second solid state light source of the at least one second solid state light source, and a third solid state light source of the at least one third solid state light source. In certain embodiments, the plurality of solid state light source clusters is mounted on a single substrate, mounting plate, or support element. In certain embodiments, each solid state light source cluster of the plurality of solid state light source clusters comprises a solid state light emitter package. In certain embodiments, the lighting device comprises all three characteristic (a) to (c). In certain embodiments, the lighting device is configured to illuminate an upright billboard or sign. In certain embodiments, the at least one first solid state light source comprises at least one blue LED, the at least one second solid state light source comprises at least one green LED, and the at least one third solid state light source comprises at least one red or red-orange LED. In certain embodiments, the lighting device further includes at least one white solid state light emitter. In certain embodiments, the at least one first solid state light source comprises at least one blue LED, the at least one second solid state light source comprises at least one yellow and/or green lumiphor, and the at least one third solid state light source comprises at least one red or red-orange LED. In certain embodiments, the at least one first solid state light source comprises at least one blue LED, the at least one second solid state light source comprises at least one red or red-orange lumiphor, and the at least one third solid state light source comprises at least one green LED. In certain embodiments, one or more of the at least one first, the at least one second, or the at least one third solid state light source comprises a lumiphor including a full width-half maximum intensity value of no greater than 35 nm. In certain embodiments, aggregate emissions of the lighting device comprise a R9-prime color rendering value of greater than 110.

In another aspect, the disclosure relates to an outdoor billboard, poster, or illuminated sign comprising a lighting device as disclosed herein.

In another aspect, the disclosure relates to a method comprising illuminating an upright surface including printed material utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features, and embodiments of the invention will be more fully apparent from the ensuing disclosure and appended claims.

BRIEF DESCRIPTION OF THE DRAWINGS

FIG. 3A is a table of gamut (relative to daylight); brightness (relative to daylight); and CCT, Ra, and Qg values for a metal halide light source.

FIG. 3B is a superimposed plot of spectral output of the metal halide light source of FIG. 3A; modeled reflectance of cyan, magenta, and yellow inks utilizing the CMY inks characterized in FIG. 1A; and modeled reflectance of red, green, and blue colors upon interaction between the metal halide light source and the CMY inks.

FIG. 4A is a table of gamut (relative to daylight); brightness (relative to daylight); and CCT, Ra, and Qg values for a multi-phosphor LED light source including a blue LED arranged to stimulate green, yellow, and red phosphors.

FIG. 4B is a superimposed plot of spectral output of the multi-phosphor LED light source of FIG. 4A; modeled reflectance of cyan, magenta, and yellow inks utilizing the CMY inks characterized in FIG. 1A; and modeled reflectance of red, green, and blue colors upon interaction between the multi-phosphor LED light source and the CMY inks.

FIG. 4C is a 1931 CIE Chromaticity diagram including the BBL with addition of a polygon representing gamut of the multi-phosphor LED light source of FIG. 4A superimposed over another polygon representing gamut of a reference daylight source.

FIG. 5A is a table of gamut (relative to daylight); brightness (relative to daylight); and CCT, Ra, and Qg values for a modeled multi-LED BSG+R light source (embodying a blue-shifted green LED plus red LED, with the blue-shifted green LED including a blue LED arranged to stimulate emissions of a green phosphor).

FIG. 5B is a superimposed plot of spectral output of the multi-LED BSG+R light source of FIG. 5A; modeled reflectance of cyan, magenta, and yellow inks utilizing the CMY inks characterized in FIG. 1A; and modeled reflectance of red, green, and blue colors upon interaction between the multi-LED BSG+R light source and the CMY inks.

FIG. 5C is a 1931 CIE Chromaticity diagram including the blackbody locus (BBL) with addition of a polygon representing gamut of the multi-LED BSG+R light source of FIG. 5A superimposed over another polygon representing gamut of a reference daylight source.

FIG. 6A is a table of gamut (relative to daylight); brightness (relative to daylight); and CCT, Ra, and Qg values for a modeled multi-LED RGB light source including a 622 nm dominant wavelength red LED, a 532 nm dominant wavelength green LED, and a 452 nm dominant wavelength blue LED.

FIG. 6B is a superimposed plot of spectral output of the multi-LED RGB light source of FIG. 6A; modeled reflectance of cyan, magenta, and yellow inks utilizing the CMY inks characterized in FIG. 1A; and modeled reflectance of red, green, and blue colors upon interaction between the multi-LED RGB light source and the CMY inks.

FIG. 6C is a 1931 CIE Chromaticity diagram including the BBL with addition of a polygon representing gamut of the multi-LED RGB light source of FIG. 6A superimposed over another polygon representing gamut of a reference daylight source.

FIG. 7A is a table of identifying color point coordinate, wavelength, full width-half maximum, electric power, luminous flux, radiant flux, and S/P ratio values for red, green and blue LEDs of a modeled multi-LED RGB light source including a 617 nm red dominant wavelength LED, a 528 nm green dominant wavelength LED, and a 447 nm blue dominant wavelength LED.

FIG. 7B is a table identifying CCT, du'v', Duv, power, lumens, lumens per watt, luminous efficacy of radiation, S/P ratio, CRI Ra, R9 color rendering, R9 prime color rendering, color quality scale, Qf, Qg, and GAI values for aggregate output of the light source of FIG. 7A.

FIG. 7C is a 1931 CIE Chromaticity diagram including the BBL with addition of a polygon representing gamut of the multi-LED RGB light source of FIGS. 7A-7B superimposed over another polygon representing gamut of a reference daylight source.

FIG. 7D is a superimposed plot of spectral output of the multi-LED RGB light source of FIGS. 7A-7B; modeled reflectance of cyan, magenta, and yellow inks utilizing the CMY inks characterized in FIG. 1A; and modeled reflectance of red, green, and blue colors upon interaction between the multi-LED RGB light source and the CMY inks.

FIG. 8C(i) is a table of luminous efficacy of radiation, color point coordinate, CCT, Duv, CRI Ra, R9 color rendering, and CQS Qg values for the Cree® XPG source of FIG. 8A.

FIG. 8C(ii) is a CIELAB a*, b* color space diagram for the Cree® XPG source of FIGS. 8A and 8C(i).

FIG. 8C(iii) is a color saturation diagram for the Cree® XPG source of FIGS. 8A and 8C(i).

FIG. 8D(i) is a table of luminous efficacy of radiation, color point coordinate, CCT, Duv, CRI Ra, R9 color rendering, and CQS Qg values for the BSY+R (605 nm red) of FIG. 8A.

FIG. 8D(ii) is a CIELAB a*, b* color space diagram for the BSY+R (605 nm red) of FIGS. 8A and 8D(i).

FIG. 8D(iii) is a color saturation diagram for the BSY+R (605 nm red) of FIGS. 8A and 8D(i).

FIG. 8E(i) is a table of luminous efficacy of radiation, color point coordinate, CCT, Duv, CRI Ra, R9 color rendering, and CQS Qg values for the BSY+R (615 nm red) of FIG. 8A.

FIG. 8E(ii) is a CIELAB a*, b* color space diagram for the BSY+R (615 nm red) of FIGS. 8A and 8E(i).

FIG. 8E(iii) is a color saturation diagram for the BSY+R (615 nm red) of FIGS. 8A and 8E(i).

FIG. 8F(i) is a table of luminous efficacy of radiation, color point coordinate, CCT, Duv, CRI Ra, R9 color rendering, and CQS Qg values for the BSY+R (628 nm red) of FIG. 8A.

FIG. 8F(ii) is a CIELAB a*, b* color space diagram for the BSY+R (628 nm red) of FIGS. 8A and 8F(i).

FIG. 8F(iii) is a color saturation diagram for the BSY+R (628 nm red) of FIGS. 8A and 8F(i).

FIG. 9A is a plot of measured relative intensity versus wavelength for a Cree® XPG 5000K 90 CRI blue LED and multi-phosphor source (including a blue LED arranged to stimulate yellow and red phosphors) and for three multi-LED RGB sources, with the three RGB sources having red LED dominant wavelengths of 605 nm, 615 nm, and 628 nm, respectively.

FIG. 9B is a plot of measured relative intensity versus wavelength of the RGB source having a red LED dominant wavelength of 628 nm superimposed with measured reflectance of Roland Eco-Sol Max cyan, magenta, and yellow inks.

FIG. 9C(i) is a table of luminous efficacy of radiation, color point coordinate, CCT, Duv, CRI Ra, R9 color rendering, and CQS Qg values for the RGB (605 nm red) source of FIG. 9A.

FIG. 9C(ii) is a CIELAB a*, b* color space diagram for the RGB (605 nm red) source of FIGS. 9A and 9C(i).

FIG. 9C(iii) is a color saturation diagram for the RGB (605 nm red) source of FIGS. 9A and 9C(i).

FIG. 9D(i) is a table of luminous efficacy of radiation, color point coordinate, CCT, Duv, CRI Ra, R9 color rendering, and CQS Qg values for the RGB (615 nm red) of FIG. 9A.

FIG. 9D(ii) is a CIELAB a*, b* color space diagram for the RGB (615 nm red) of FIGS. 9A and 9D(i).

FIG. 9D(iii) is a color saturation diagram for the RGB (615 nm red) of FIGS. 9A and 9D(i).

FIG. 9E(i) is a table of luminous efficacy of radiation, color point coordinate, CCT, Duv, CRI Ra, R9 color rendering, and CQS Qg values for the RGB (628 nm red) of FIG. 9A.

FIG. 9E(ii) is a CIELAB a*, b* color space diagram for the RGB (628 nm red) of FIGS. 9A and 9E(i).

FIG. 9E(iii) is a color saturation diagram for the RGB (628 nm red) of FIGS. 9A and 9E(i).

FIGS. 11A-11C are side cross-sectional views illustrating examples of packaged solid state emitters that may be used in lighting devices according to at least some embodiments of the present disclosure.

FIG. 12A-12B provide top perspective and bottom plan views, respectively, of a lighting device embodying a solid state emitter package including four LED chips capable of being independently controlled.

FIG. 13F is a schematic view of a sixth lighting device including first through fourth solid state emitters, with one solid state emitter arranged to stimulate a lumiphoric material, supported by a single submount or substrate.

FIG. 13G is a schematic view of a seventh lighting device including first through fourth solid state emitters, with two solid state emitters arranged to stimulate lumiphoric materials, supported by a single submount or substrate.

FIG. 13H is a schematic view of an eighth lighting device including first through fourth solid state emitters, with three solid state emitters arranged to stimulate a lumiphoric materials, supported by a single submount or substrate.

FIG. 14 is a simplified plan view of a lighting device including multiple LED components and at least one control circuit.

FIG. 15 is a simplified plan view of another lighting device including multiple LED components and at least one control circuit.

FIG. 16 is a schematic view of a driver module and a LED array including multiple separately controllable strings of LEDs according to one embodiment of the disclosure.

FIG. 17 is a perspective view of a billboard including an upright surface with printed material thereon, with the printed material being illuminated by multiple groups of solid state light emitters arranged in front of the printed surface.

FIG. 18 is a partial cutaway perspective view of a backlit sign including an upright surface with printed material thereon, with the printed material being illuminated by multiple solid state light emitters arranged in an array behind the printed surface.

FIG. 19 is a simplified cross-sectional view of a solid state lighting device including control circuitry, multiple solid state light emitters, and a heatsink, a reflector, and a diffuser.

FIG. 20 is a perspective view of an elongated solid state lighting device including multiple solid state light emitters arranged in a tubular light-transmissive body.

DETAILED DESCRIPTION

Figure 1A:
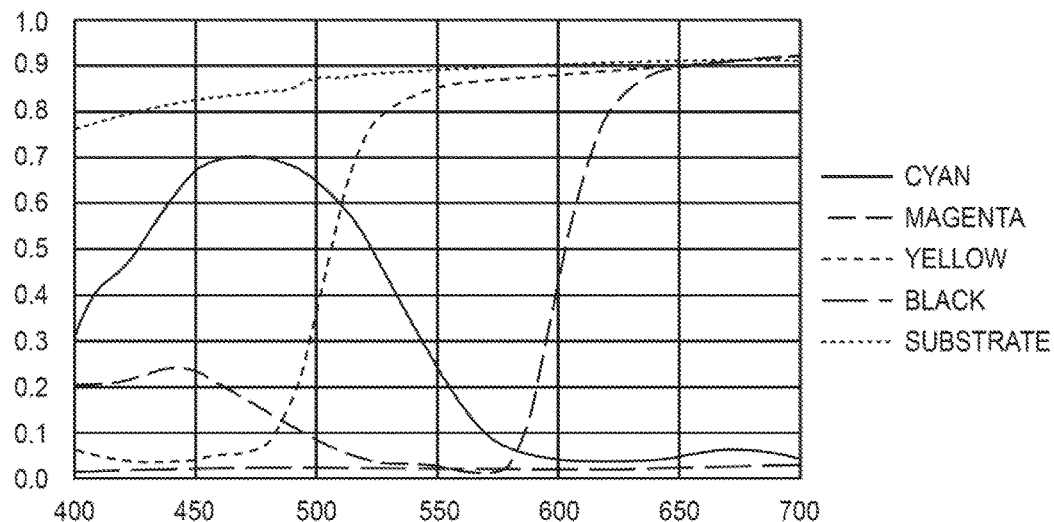
FIG. 1A is a plot of reflected intensity versus wavelength for a white substrate as well as four standard CMYK inks derived from ISO Standard No. 2846-1-2006.
Figure 1B:
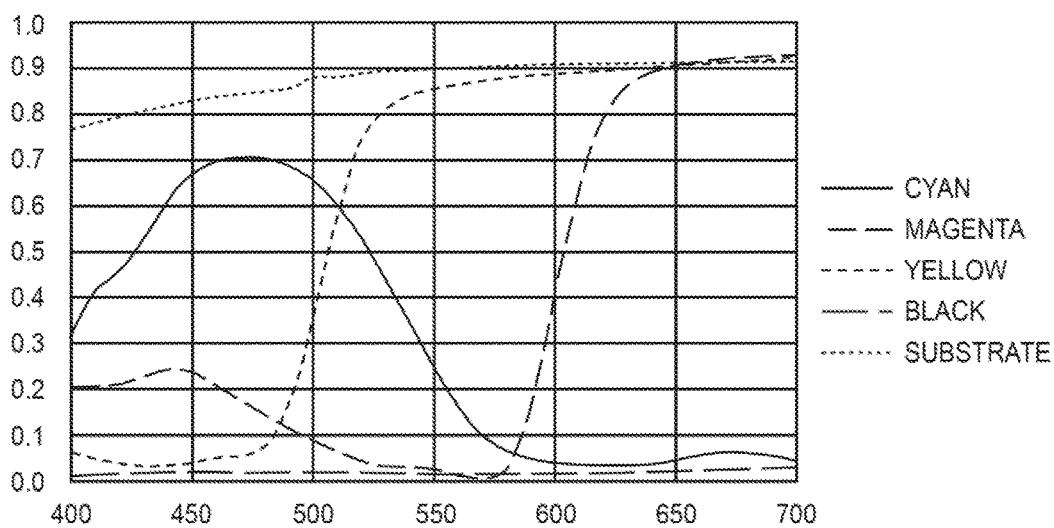
FIG. 1B is the plot of FIG. 1A with addition of a dashed oval at the intersection between the blue and yellow reflectance spectra.

Devices and methods for illuminating printed material on surfaces (e.g., upright surfaces) using combinations of solid state light emitters are disclosed herein. In certain embodiments, vibrancy may be enhanced by increasing the effective steepness of printed ink reflectance wavelength boundaries by illuminating printed material with solid state light emitters of multiple colors having tailored boundaries, such as increased effective separation between colors and/or increased energy in spectral areas (e.g., green) that are absorbed too greatly by CMYK inks. In certain embodiments, efficacy may be improved by preferentially increasing energy of light emissions at or near the most visibly reflective wavelengths of the spectra for one or multiple inks used in the printed material (thereby enhancing reflection), and/or by reducing energy of light emissions at wavelengths to which the human eye is less sensitive.

While artificial light sources have traditionally focused on providing high efficacy and/or high color rendering values without necessarily taking into account specific properties of the surface(s) to be illuminated, the inventors have found that in the context of illuminating surfaces (e.g., upright surfaces) including material printed with CMY or CMYK inks, efficacy and/or vibrancy (including brightness and vividness in combination) can be improved utilizing solid state light sources with multiple peak wavelengths, wherein one or more peak widths are relatively narrow, multiple peaks are widely spaced relative to one another, and/or one or more peak wavelength are at or near visibly reflective peak wavelengths of the spectra for one more inks forming the printed material. In certain embodiments, multiple solid state light emitter groups are used to provide illumination levels sufficient for illumination of outdoor billboards, signs, or displays, such as in a range of at least 2000 lumens, at least 5000 lumens, at least 10,000 lumens, at least 15,000 lumens, or at least 20,000 lumens. In certain embodiments, emissions of the lighting device include a luminous efficacy of at least 70 lumens per watt, at least 80 lumens per watt, at least 90 lumens per watt, or at least 100 lumens per watt (with one or more of the preceding minimum values optionally being bounded by an upper limit of 100 lumens per watt, 125 lumens per watt, 150 lumens per watt, or 175 lumens per watt).

Lighting devices disclosed herein may illuminate printed material on surfaces (e.g., upright surfaces) with enhanced vibrancy, wherein brightness considers the amount of light reflected for a particular color as a percentage of the incident light, vividness is an indication of overall gamut size, and vibrancy may be understood as brightness and vividness in combination.

In certain embodiments, a lighting device disclosed herein includes multiple solid state light emitter groups each including at least one first solid state light emitter arranged to generate first emissions comprising a first peak wavelength, and including at least one second solid state light emitter arranged to generate second emissions comprising a second peak wavelength that differs by at least 40 nm from the first peak wavelength and differs by at least 40 nm from any other peak wavelength optionally generated by the first solid state light emitter. In certain embodiments, the lighting device is configured for illuminating an upright surface including printed material. The lighting device provides high luminous flux (e.g., at least 2000 lumens or another threshold specified herein) in combination with relatively high efficacy (e.g., at least 70 lumens per watt). Examples of lighting devices disclosed that may satisfy the foregoing criteria include, but are not limited to, RGB devices (including red, green, and blue electrically activated solid state light emitters), BSY/G+R (or "blue shifted yellow/green plus red" devices including a blue electrically activated solid state light emitter arranged to stimulate emissions of yellow and/or green lumiphoric materials plus a red electrically activated solid state light emitter), BSG+R devices (or "blue shifted green plus red" devices including a blue electrically activated solid state light emitter arranged to stimulate emissions of a green lumiphoric material plus a red electrically activated solid state light emitter), BSR+G devices (or "blue shifted red plus green" devices including a blue electrically activated solid state light emitter arranged to stimulate emissions of a red lumiphoric material plus a green electrically activated solid state light emitter), and RGB+W devices (including red, green, and blue, and white solid state light emitters). Although "red" is mentioned in each of the preceding cases, it is to be understood that such color may encompass red or red-orange.

In another embodiment, a lighting device disclosed herein includes multiple solid state emitter groups each including at least one first solid state light emitter arranged to generate first emissions comprising a dominant wavelength in a blue range, at least one second solid state light emitter arranged to generate second emissions comprising a dominant wavelength in a green or yellow-green range, and at least one third solid state light emitter arranged to generate third emissions comprising a dominant wavelength in a red or red-orange range, wherein aggregate emissions of the device include at least a portion of each of the first, second, and third emissions. The lighting device further includes at least one (or, alternatively, at least two, or at least three, or all four) of the following features: (a) the at least one first solid state light emitter is arranged to stimulate emissions of a lumiphoric material arranged to produce lumiphor emissions in a green or yellow-green range; (b) the at least one second solid state light emitter is arranged to produce emissions having a full width-half maximum intensity value of no greater than 35 nm; (c) the at least one third solid state light emitter comprises a peak wavelength in a range of from 630 nm to 680 nm; and (d) the aggregate emissions comprise a R9-prime color rendering value of greater than 110. In certain embodiments, feature (a) may optionally be present in conjunction with a condition in which at least one of the first and third solid state light emitters is devoid of a lumiphoric material. Feature (a) may improve efficacy and/or vibrancy by providing increased energy in a green spectral areas that is absorbed too greatly by CMYK inks. Feature (b) may improve efficacy and/or vibrancy by ensuring separation between peak wavelengths, wherein in certain embodiments at least one peak is at or near at least one of the most visibly reflective wavelengths of spectra for one or multiple inks used in the printed material to be illuminated. Feature (c) may also facilitate increased separation between red and green colors by providing illumination with a relatively long wavelength red peak. Feature (d) also coincides with increased red content in aggregate emissions, wherein R9 prime values coincides with R9 color rendering values for values below 100, while R9 prime values continue to increase smoothly into a high-vividness (e.g., oversaturated) region when R9 values decline. Computation of R9 prime values is discussed in further detail in connection with FIG. 10 (infra).

In certain embodiments, perceived vibrancy of printed material including multiple (e.g., at least three) colored inks, paints, or dyes may be enhanced by selecting multiple (e.g., at least three) solid state light sources with dominant wavelengths that are substantially matched (or close to) peak wavelengths of reflectance spectra of the respective colored inks, paints, or dyes of the printed material (which may optionally be provided on an upright surface). In certain embodiments, each solid state light source includes a dominant wavelength that is within about 20 nm, within about 15 nm, within about 10 nm, within about 5 nm, or within about 3 nm of a peak wavelength of a reflectance spectrum of a corresponding colored ink, paint, or dye associated with printed material. Preferably, each solid state light source includes a peak wavelength that is at least about 40 nm, at least about 50 nm, at least about 60 nm, at least about 70 nm, or at least about 80 nm from each other differently-colored solid state light source. Preferably, the solid state light sources include at least two, or all three, of the following features: (a) a luminous efficacy of at least 80 lumens per watt; (b) an average color rendering index (CRI Ra) of at least 80; and (c) a relative gamut (Qg) of at least 100. Various combinations of solid state light sources may be embodied in light source clusters and/or solid state emitter packages. In certain embodiments, the solid state light sources may include various combinations of electrically activated solid state light emitters (e.g., LEDs) and lumiphoric materials. For example, in certain embodiments, the at least one first solid state light source comprises at least one blue LED, the at least one second solid state light source comprises at least one green LED, and the at least one third solid state light source comprises at least one red or red-orange LED. In certain embodiments, the lighting device further includes at least one white solid state light emitter. In certain embodiments, the at least one first solid state light source comprises at least one blue LED, the at least one second solid state light source comprises at least one yellow and/or green lumiphor, and the at least one third solid state light source comprises at least one red or red-orange LED. In certain embodiments, the at least one first solid state light source comprises at least one blue LED, the at least one second solid state light source comprises at least one red or red-orange lumiphor, and the at least one third solid state light source comprises at least one green LED. In certain embodiments, one or more of the at least one first, the at least one second, or the at least one third solid state light source comprises a lumiphor including a full width-half maximum intensity value of no greater than 35 nm. In certain embodiments, aggregate emissions of the lighting device comprise a R9-prime color rendering value of greater than 110.

In certain embodiments, a lighting device disclosed herein is arranged to operate in different modes providing illumination with different gamut properties (e.g., different relative gamut values). Such a device may permit gamut properties to be adjusted relative to environmental conditions, a property of a surface (e.g., content of printed material on the surface, which may include an upright surface), one or more sensor output signals, one or more user input signals, one or more time or temporal condition signals, and the like. In certain embodiments, one or more photosensors or image sensors may detect whether a surface to be illuminated includes skin tones or other content for which illumination with an operating mode providing aggregate emissions with greater color rendering index (CRI or CRI Ra) properties may be appropriate, as opposed to illumination according to a different operating mode providing aggregate emissions with increased vividness but lower color rendering properties.

In certain embodiments, a lighting device disclosed herein is arranged to preferentially illuminate different subregions of a surface (e.g., an upright surface) including printed material to permit spatial adjustment of gamut properties, such that different subregions of the illuminated surface are illuminated with light having different gamut properties. In certain embodiments, different subregions may be illuminated with light having different gamut properties but substantially the same CCT (e.g., a difference in CCT of no more than 5%, no more than 3%, no more than 2%, or not more than 1%). In certain embodiments, different subregions of an illuminated surface may be illuminated with different combinations of light differing in relative gamut values by at least 10% (or at least 15%, at least 20%, at least 25%, at least 30%, or another threshold specified herein). Such phenomenon may be used to emphasize or deemphasize certain portions of an illuminated surface.

More specific aspects of the invention will be described after terms are defined and general concepts are introduced.

The embodiments set forth herein represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. Unless the absence of one or more elements is specifically recited, the terms "comprising," "including," and "having" as used herein should be interpreted as open-ended terms that do not preclude the presence of one or more elements. As used herein, the phrase "arranged to" should be interpreted as synonymous with the phrase "configured to" and generally contemplates an intentional arrangement to achieve a stated purpose, result, or interaction.

The terms "solid state emitter" or "solid state light emitter" (which may be qualified as being "electrically activated") may include a LED, laser diode, organic light-emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

The expressions "lighting device" and "light emitting device" as used herein are not limited, except that such elements are capable of emitting light. In certain embodiments, a light emitting device may be embodied in a light bulb or a light fixture. In certain embodiments, a "lighting system" may include one lighting device or multiple lighting devices. In preferred embodiments, a "solid state lighting device" is devoid of any incandescent light emitting element. In certain embodiments, lighting devices or light emitting apparatuses as disclosed herein may be self-ballasted. In certain embodiments, a light emitting apparatus may be embodied in a light fixture.

The term "dominant wavelength" as used herein refers to the dominant wavelength at a reference condition used to classify LED die or individual lamps, and in general it is different from the dominant wavelength that would be measured under luminaire operating conditions of any particular embodiment.

Subject matter disclosed herein further includes methods for illuminating a surface (e.g., an upright surface) including printed material (e.g., including but not limited to CMY inks or CMYK inks) and illuminated surfaces with printed material, such as posters, billboards, signs, packaging, point of purchase product displays, and the like. In certain embodiments, at least a portion of an upright surface may be substantially vertical. In certain embodiments, at least a portion of an "upright surface" may be arranged at an angle, relative to a horizontal plane or surface, in a range of from 45 to 90 degrees, from 60 to 90 degrees, from 75 to 90 degrees, or from 80 to 90 degrees.

The term "printed material" as used herein refers to a surface that is coated, overlaid, or impregnated with one or more colored inks, paints, dyes, or other chemicals such that a light reflectance spectrum of at least a portion of the surface is altered. Printed material may include, but is not limited to, surfaces bearing one or more of text, graphics, images, and the like. In certain embodiments, printed material includes at least two, at least three, or at least four differently colored inks, paints, dyes, or other chemicals comprising reflectance spectra with different peak wavelengths. In certain embodiments, each peak wavelength may differ from each other peak wavelength by at least about 30 nm, 40 nm, 50 nm, 60 nm, 70 nm, or 80 nm in the visible range. In certain embodiments, printed material may be embodied in an outdoor billboard, a poster, or an illuminated sign that includes an upright surface.

Although various LEDs are described herein as "red," it is to be recognized that such term is intended to encompass and include "red-orange" LEDs unless specifically indicated to the contrary herein.

Solid state light emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength(s), or of at least one desired perceived color (including combinations of colors that may be perceived as white). Lumiphoric materials may be provided in the form of particles, films, or sheets. Quantum dot materials (embodying tiny particles or nanocrystals of light-emitting semiconductor materials) of various colors are commercially available from QD Vision, Inc. (Lexington, Mass., USA), Nanosys Inc. (Milpitas, Calif., USA), and Nanoco Technologies Ltd. (Manchester, United Kingdom), among others.

In certain embodiments, a lighting apparatus as disclosed herein includes multiple groups of solid state light emitters (e.g., LEDs, with one or more LEDs optionally arranged to stimulate emissions of one or more lumiphors) arranged in an array (e.g., a two-dimensional array).

Inclusion of lumiphoric (also called "luminescent") materials in lighting devices as described herein may be accomplished by any suitable means, including the following: direct coating on solid state light emitters, dispersal in encapsulant materials arranged to cover solid state light emitters, coating on lumiphor support elements (e.g., by powder coating, inkjet printing, or the like), incorporation into diffusers or lenses, and the like. Examples of lumiphoric materials are disclosed, for example, in U.S. Pat. No. 6,600,175 and in U.S. Patent Application Publication Nos. 2009/0184616 and 2012/0306355, and methods for coating light emitting elements with phosphors are disclosed in U.S. Patent Application Publication No. 2008/0179611, with the foregoing publications being incorporated by reference. Examples of phosphors that may be used according to certain embodiments include, without limitation, cerium (III)-doped yttrium aluminum garnet (Ce:YAG or YAG:Ce); yttrium aluminum oxide doped with cerium yttrium aluminum garnet (NYAG); lutetium aluminum garnet (LuAG), green aluminate (GAL, including but not limited to GAL535); $(Sr,Ba,Ca)_2$-$xSiO_4$:$Eu_x$ (BOSE, including both BOSE yellow and BOSE green varieties, including for example $(Ba,Sr)_2SiO_4$:$Eu^{2+}$); and CASN ($CaAlSiN_3$:$Eu^{2+}$).

In certain embodiments, control of one or more solid state light emitter groups or sets may be responsive to a control signal (optionally including at least one sensor arranged to sense electrical, optical, and/or thermal properties and/or environmental conditions), a timer or clock signal, and/or at least one user input. One or more control signals may be provided to at least one current supply circuit. In various embodiments, current to different circuits or circuit portions may be pre-set, user-defined, or responsive to one or more inputs or other control parameters.

Various substrates may be used as mounting elements on which, in which, or over which multiple solid state light emitters (e.g., emitter chips) may be arranged or supported (e.g., mounted). Examples of suitable substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art), or any suitable substrate for mounting LED chips and/or LED packages.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state light emitter packages. A solid state light emitter package may include at least one solid state light emitter chip (more preferably multiple solid state light emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state light emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state light emitters, lumiphoric materials, and/or lumiphor-containing layers in a solid state light emitter package.

In certain embodiments, a solid state lighting device (e.g., package) may include a reflector cup defining a cavity, at least one solid state light emitter arranged within the cavity, and encapsulant material arranged within the cavity. In certain embodiments, at least one solid state light emitter may be arranged over a substrate and at least partially surrounded by a boundary wall (optionally embodying at least one dispensed dam material laterally spaced from the emitter(s)), with an encapsulant material arranged over the emitter(s) and in contact with the at least one boundary wall.

As noted previously, in certain embodiments, vibrancy may be enhanced by increasing the effective steepness of printed ink reflectance wavelength boundaries by illuminating printed material with solid state light emitters of multiple colors having tailored boundaries, such as increased effective separation between colors and/or increased energy in spectral areas (e.g., green) that are absorbed too greatly by CMYK inks. In certain embodiments, efficacy may be improved by preferentially increasing energy of light emissions at or near the most visibly reflective wavelengths of the spectra for one or multiple inks used in the printed material (thereby enhancing reflection), and/or by reducing energy of light emissions at wavelengths to which the human eye is less sensitive.

To assess the effects of different types of light sources on illuminating surfaces bearing CMYK printed material, various light sources were modeled and compared. Results of such modeling and comparison are provided in FIGS. 2A-6C.

Lighting devices disclosed herein may illuminate printed material on surfaces (e.g., upright surfaces) with enhanced vibrancy. Brightness of illuminated printed material can be characterized as the amount of light reflected for a particular color as a percentage of the incident light, and can be compared to the same colors illuminated by a reference light (e.g., D50 daylight). It can be averaged to give an indication of efficacy, and multiplied by the efficacy of the illuminating source to give a value of the energy efficiency. Vividness of illuminated printed material can be characterized by the overall gamut size in u'v' space or ab, or the distance in u'v' or ab space from the incident light white point for each of the non-neutral six colors of cyan, yellow, magenta, blue, green and red. Vibrancy may be understood as brightness and vividness in combination.

Figures 2A, 2B:
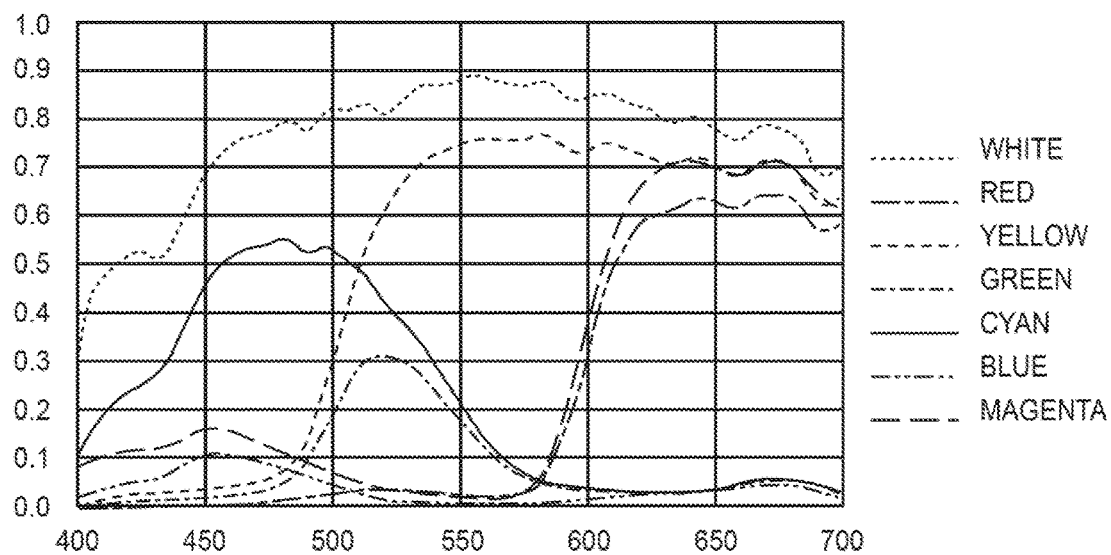
FIG. 2A is a table of gamut (relative to daylight), brightness (relative to daylight), CCT, Ra, and Qg values for a daylight source.
FIG. 2B is a superimposed plot of spectral output of the daylight source of FIG. 2A; modeled reflectance of cyan, magenta, and yellow inks utilizing the CMY inks characterized in FIG. 1A; and modeled reflectance of red, green, and blue colors upon interaction between the daylight source and the CMY inks.
Figure 2C:
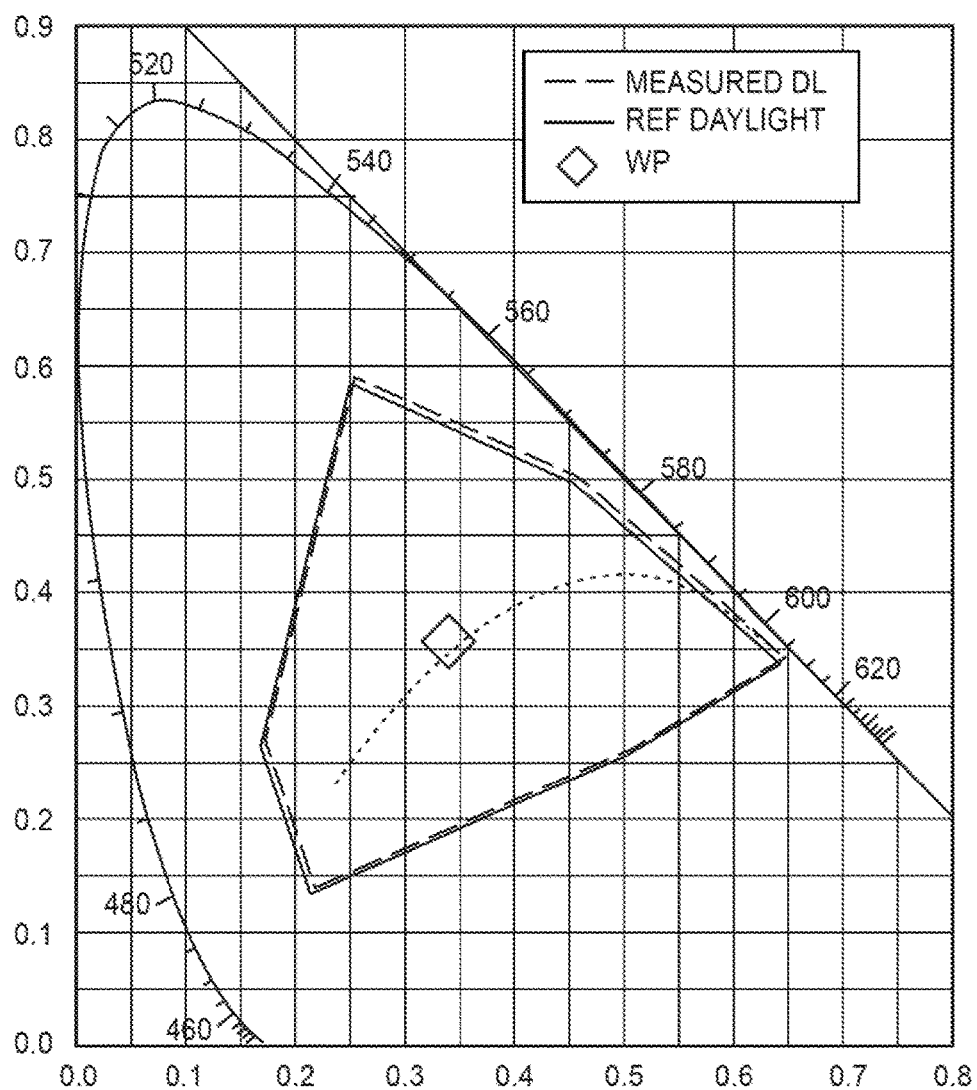
FIG. 2C is a 1931 CIE Chromaticity diagram including the blackbody locus (BBL) with addition of a polygon representing gamut of the daylight source of FIG. 2A.

FIGS. 2A-2C include results of measuring a daylight source at a CCT of 5000K. FIG. 2A is a table of gamut (relative to daylight), brightness (relative to daylight), CCT, Ra, and Qg values for the daylight source. FIG. 2B is a superimposed plot of spectral output of the daylight source of FIG. 2A, modeled reflectance of cyan, magenta, and yellow inks (utilizing the CMY inks characterized in FIG. 1A), and modeled reflectance of red, green, and blue colors upon interaction between the daylight source and the CMY inks. As shown in FIG. 2A, a CRI Ra value of 100 and a Qg value of 100 are obtained. As shown in FIG. 2B, the uppermost "white" line demonstrates that the daylight source includes significant spectral content over the entire visible range of from 400 nm to 700 nm, with a peak intensity of approximately 550 nm. Adjacent peaks of "cyan," "yellow," and "magenta" reflectance are wide and exhibit significant overlap. FIG. 2C is a 1931 CIE Chromaticity diagram including the blackbody locus (BBL) with addition of a polygon representing gamut of the daylight source of FIG. 2A. Since the measured daylight source is the reference daylight source, gamut of the measured daylight source is coextensive with the reference gamut.

Figure 3C:
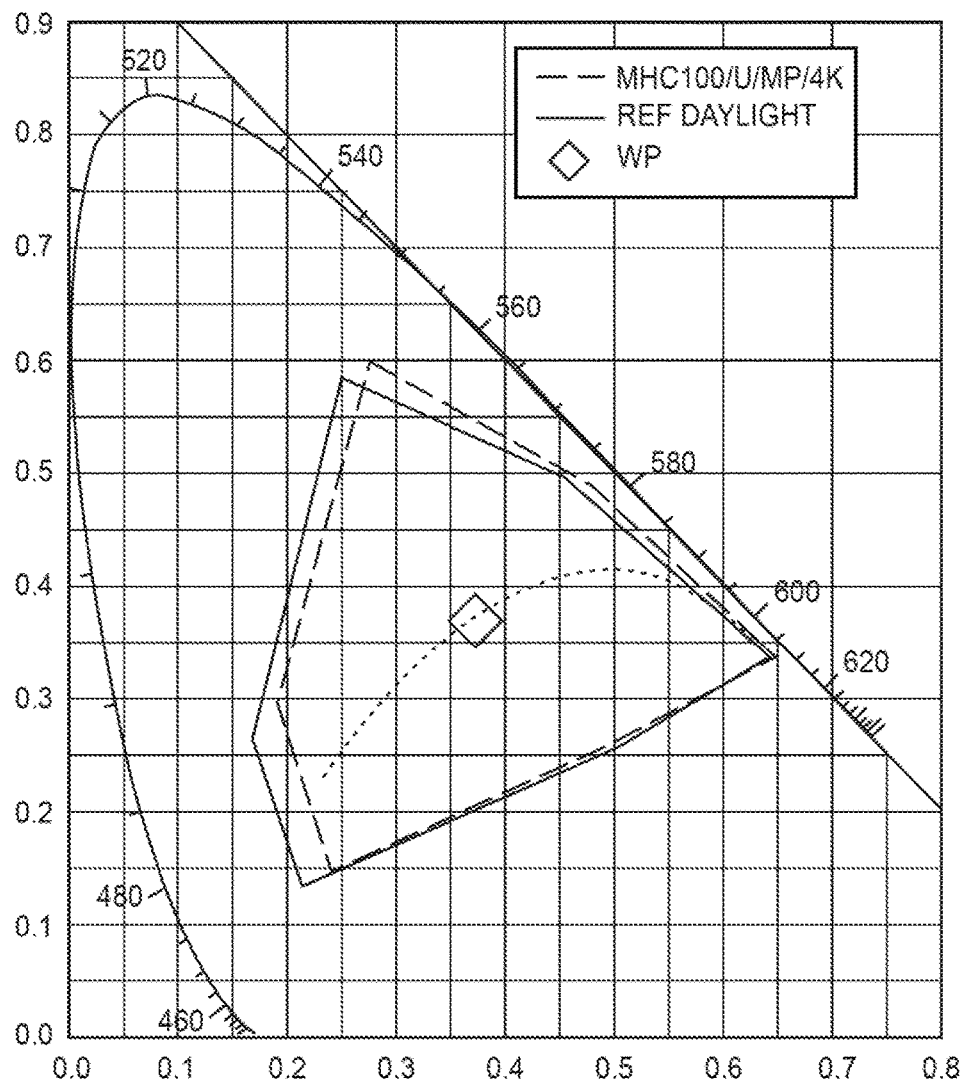
FIG. 3C is a 1931 CIE Chromaticity diagram including the BBL with addition of a polygon representing gamut of the metal halide light source of FIG. 3A superimposed over another polygon representing gamut of a reference daylight source.

FIGS. 3A-3C include results of measuring a metal halide source (Philips MHC 100/U/MP/4K) at a CCT of 5000K. FIG. 3A is a table of gamut (relative to daylight), brightness (relative to daylight), CCT, Ra, and Qg values for the metal halide light source, which exhibits a CRI Ra value in a range of from 64-90 and a Qg value in a range of from 75-100. As shown in FIG. 3A, both gamut and brightness are decreased relative to a daylight source. FIG. 3B is a superimposed plot of spectral output of the metal halide light source of FIG. 3A, modeled reflectance of cyan, magenta, and yellow inks utilizing the CMY inks characterized in FIG. 1A, and modeled reflectance of red, green, and blue colors upon interaction between the metal halide light source and the CMY inks. As shown in FIG. 3B, the uppermost "white" line demonstrates that the metal halide source includes pronounced intensity peaks at wavelengths of approximately 540 nm and 595 nm, with reduced intensity for red wavelengths above 600 nm. FIG. 3C is a 1931 CIE Chromaticity diagram including the BBL with addition of a polygon representing gamut of the metal halide light source of FIG. 3A superimposed over another polygon representing gamut of a reference daylight source.

FIGS. 4A-4C include results of measuring a multi-phosphor LED light source comprising a 450 nm dominant wavelength blue LED arranged to stimulate a mixture of green, yellow, and red phosphors, with the green (LuAg) phosphor being present in an amount five times that of the yellow (YAG) phosphor. FIG. 4A is a table of gamut (relative to daylight), brightness (relative to daylight), CCT, Ra, and Qg values for the multi-phosphor LED light source, which exhibited a CRI Ra value of 82 and a Qg value of 102. As shown in FIG. 4A, gamut is increased but brightness is decreased relative to a daylight source. FIG. 4B is a superimposed plot of spectral output of the multi-phosphor LED light source of FIG. 4A, modeled reflectance of cyan, magenta, and yellow inks, and modeled reflectance of red, green, and blue colors upon interaction between the multi-phosphor LED light source and the CMY inks. As shown in the uppermost "white" line depicted in FIG. 4B, the multi-phosphor LED light source includes a pronounced blue peak at 450 nm, a pronounced intensity trough at approximately 475 nm, and significant spectral output in the yellow through red range with localized peaks at about 540 nm and about 605 nm. FIG. 4C is a 1931 CIE Chromaticity diagram including the BBL with addition of a polygon representing gamut of the multi-phosphor LED source of FIG. 4A superimposed over another polygon representing gamut of a reference daylight source.

FIGS. 5A-5C include results of modeling a multi-LED BSG+R light source (embodying a blue-shifted green LED plus red LED, with the blue-shifted green LED including a blue LED arranged to stimulate emissions of a GAL green phosphor). FIG. 5A is a table of gamut (relative to daylight), brightness (relative to daylight), CCT, Ra, and Qg values for the multi-LED BSG+R light source, which exhibited a CRI Ra value of 92 and a Qg value of 108. As shown in FIG. 5A, gamut is increased but brightness is decreased relative to a daylight source. FIG. 5B is a superimposed plot of spectral output of the multi-LED BSG+R light source of FIG. 5A, modeled reflectance of cyan, magenta, and yellow inks utilizing the CMY inks characterized in FIG. 1A, and modeled reflectance of red, green, and blue colors upon interaction between the multi-LED BSG+R light source and the CMY inks. As shown in FIG. 5B, the uppermost "white" line exhibits narrow peaks at 450 nm and approximately 620 nm corresponding to the blue and red LEDs, whereas a broader intermediate peak is shown for the GAL green phosphor. FIG. 5C is a 1931 CIE Chromaticity diagram including the blackbody locus (BBL) with addition of a polygon representing gamut of the multi-LED BSG+R light source of FIG. 5A superimposed over another polygon representing gamut of a reference daylight source.

FIGS. 6A-6C include results of modeling a RGB source including a 622 nm dominant wavelength red LED, a 532 nm dominant wavelength green LED, and a 452 nm dominant wavelength blue LED. FIG. 6A is a table of gamut (relative to daylight), brightness (relative to daylight), CCT, Ra, and Qg values for the modeled RGB light source, which exhibited a CRI Ra value of 42, and a Qg value of 137. Both gamut and brightness are increased relative to a daylight source, but at the penalty of reduced CRI Ra. FIG. 6B is a superimposed plot of spectral output of the multi-LED RGB light source of FIG. 6A, modeled reflectance of cyan, magenta, and yellow inks, and modeled reflectance of red, green, and blue colors upon interaction between the multi-LED RGB light source and the CMY inks. As shown in FIG. 6B, pronounced narrow peaks are present for the red, green, and blue LED emitters. FIG. 6C is a 1931 CIE Chromaticity diagram including the BBL with addition of a polygon representing gamut of the multi-LED RGB light source of FIG. 6A superimposed over another polygon representing gamut of a reference daylight source.

Figure 7E:
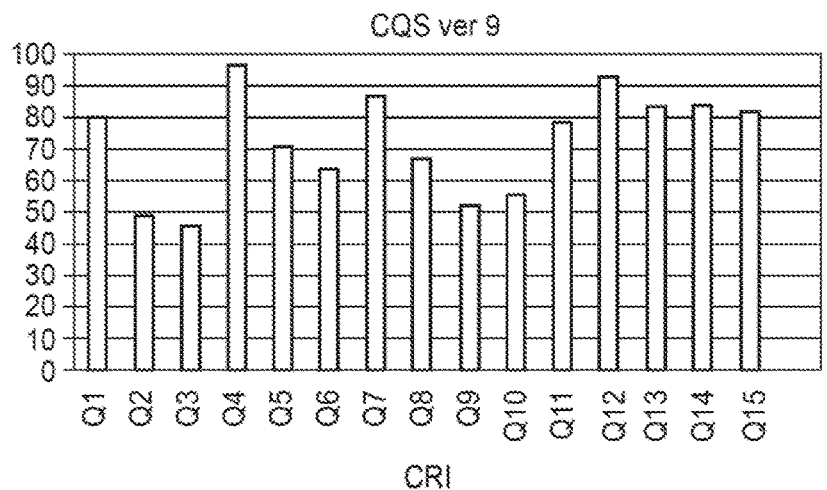
FIG. 7E is a bar chart identifying color quality scale values for the multi-LED RGB light source of FIGS. 7A-7B.

FIGS. 7A-7G include results of modeling another RGB source that includes a 617 nm dominant wavelength red LED, a 528 nm dominant wavelength green LED, and a 447 nm dominant wavelength blue LED. FIG. 7A is a table of identifying color point coordinate, wavelength, full width-half maximum, electric power, luminous flux, radiant flux, and S/P ratio values for red, green and blue LEDs of the RGB light source. FIG. 7B is a table identifying CCT, du'v', duv, power, lumens, lumens per watt, luminous efficacy of radiation, S/P ratio, CRI Ra, R9 color rendering, R9 prime color rendering, color quality scale, Qf, Qg, and GAI values for aggregate output of the light source of FIG. 7A. As shown in FIG. 7B, a trio of RGB LEDs can provide a flux of 500 lumens with a CRI Ra of above 50, a luminous efficacy of 73 lumens per watt, a Qg value of 135.6, a GAI value of 138%, and a R9 prime value of 276 at a CCT of 6532K.

FIG. 7C is a 1931 CIE Chromaticity diagram including the BBL with addition of a polygon representing gamut of the multi-LED RGB light source of FIGS. 7A-7B superimposed over another polygon representing gamut of a reference daylight source. FIG. 7D is a superimposed plot of spectral output of the multi-LED RGB light source of FIGS.

Figure 7F:
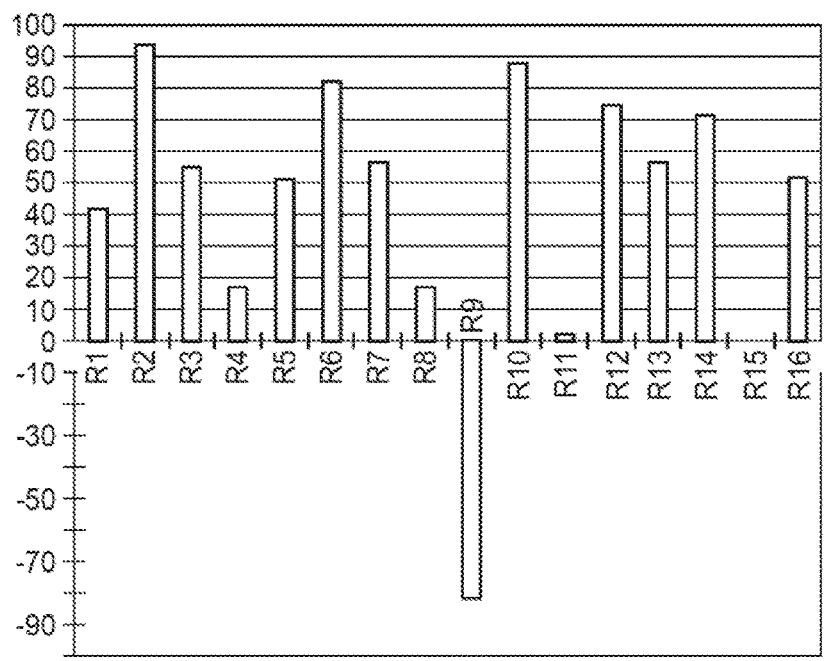
FIG. 7F is a bar chart identifying CRI values for the multi-LED RGB light source of FIGS. 7A-7B.
Figure 7G:
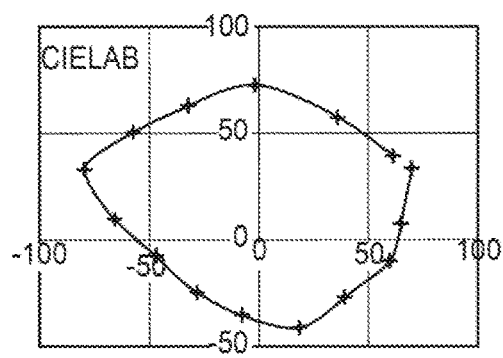
FIG. 7G is a CIELAB a*, b* color space diagram for the multi-LED RGB light source of FIGS. 7A-7B.

7A-7B, modeled reflectance of cyan, magenta, and yellow inks utilizing the CMY inks characterized in FIG. 1A, and modeled reflectance of red, green, and blue colors upon interaction between the multi-LED RGB light source and the CMY inks. FIG. 7E is a bar chart identifying individual sample color quality scale values for the multi-LED RGB light source of FIGS. 7A-7B. FIG. 7F is a bar chart identifying individual sample CRI values for the multi-LED RGB light source of FIGS. 7A-7B. Notably, the R9 (red) color rendering value is negative 82. Such value is indicative of oversaturation of red color, which would typically be construed negatively in a general illumination context. FIG. 7G is a CIELAB a*, b* color space diagram for the multi-LED RGB light source of FIGS. 7A-7B.

FIGS. 8A-8F(iii) include results obtained by modeling three BSY+R sources (each including a 450 nm blue LED arranged to stimulate a 2:1 mixture of GAL green and NYAG yellow phosphors plus a red LED, with the three BSY+R sources having red LED dominant wavelengths of 605 nm, 615 nm, and 628 nm, respectively), in comparison to a Cree® XPG 5000K 90 CRI 460 nm blue LED/multi-phosphor source (including a blue LED arranged to stimulate yellow and red phosphors).

Figure 8A:
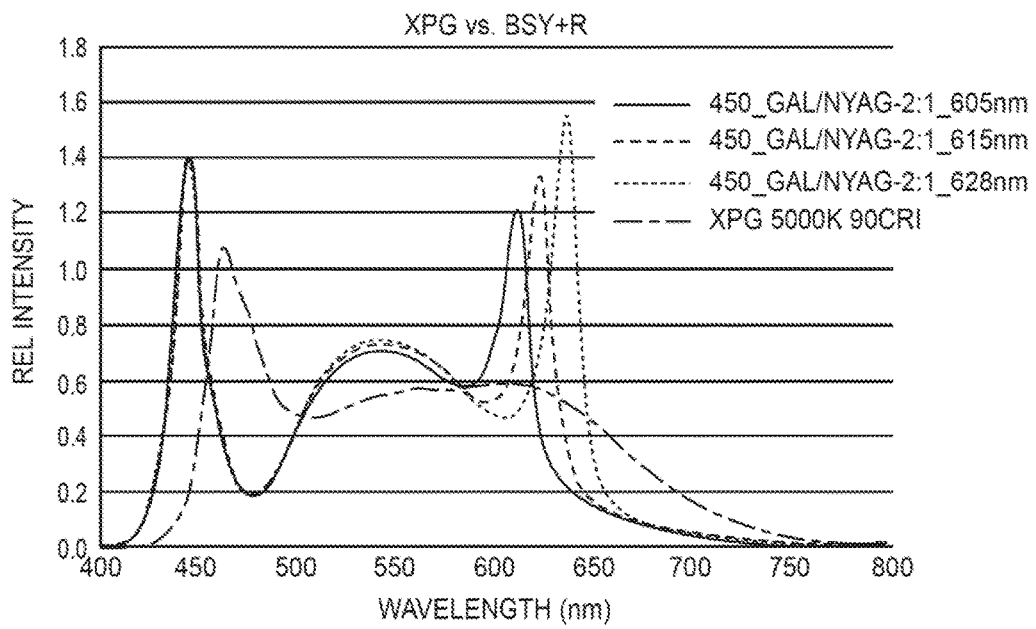
FIG. 8A is a plot of measured relative intensity versus wavelength for a Cree® XPG 5000K 90 CRI blue LED/multi-phosphor source (including a blue LED arranged to stimulate yellow and red phosphors) and for three BSY+R sources (each including a blue LED arranged to stimulate a mixture of green and yellow phosphors plus a red LED), with the three BSY+R sources having red LED dominant wavelengths of 605 nm, 615 nm, and 628 nm, respectively.

FIG. 8A is a plot of measured relative intensity versus wavelength for a Cree® XPG 5000K 90 CRI blue LED/multi-phosphor source and for three BSY+R sources having red LED dominant wavelengths of 605 nm, 615 nm, and 628 nm, respectively. As shown in FIG. 8A, the Cree® XPG source exhibits a narrow blue peak, but a broad combined yellow red peak. In comparison, each BSY+R source exhibits a narrow blue peak and a narrow red peak, and a distinct (but broader) intermediate green peak.

Figure 8B:
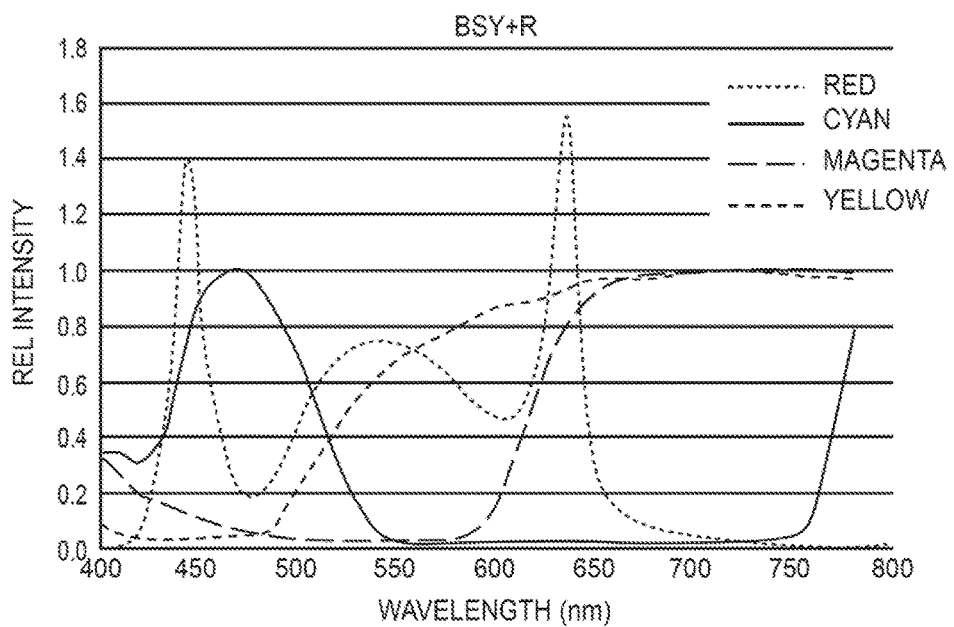
FIG. 8B is a plot of measured relative intensity versus wavelength of the BSY+R source having a red LED dominant wavelength of 628 nm superimposed with measured reflectance of Roland Eco-Sol Max cyan, magenta, and yellow inks.

FIG. 8B is a plot of measured relative intensity versus wavelength of the BSY+R source having a red LED dominant wavelength of 628 nm superimposed with measured reflectance of Roland Eco-Sol Max cyan, magenta, and yellow inks. As shown in FIG. 8B, the red peak at 628 nm overlaps significantly with an elevated portion of the magenta ink reflectance spectrum, such that the long red spectral content is available to stimulate reflection by the magenta ink.

FIG. 8C(i) is a table of luminous efficacy of radiation, color point coordinates, CCT, Duv, CRI Ra, R9 color rendering, and CQS Qg values for the Cree® XPG source of FIG. 8A. A CRI Ra value of 86.5, a R9 value of 89.1, and a Qg value of 92.8 were obtained. FIG. 8C(ii) is a CIELAB a*, b* color space diagram, and FIG. 8C(iii) is a color saturation diagram, for the Cree® XPG source of FIGS. 8A and 8C(i).

FIG. 8D(i) is a table of luminous efficacy of radiation, color point coordinate, CCT, Duv, CRI Ra, R9 color rendering, and CQS Qg values for the BSY+R (605 nm red) of FIG. 8A. A CRI Ra value of 81.02, a R9 value of −24.4, and a Qg value of 96.8 were obtained. FIG. 8D(ii) is a CIELAB a*, b* color space diagram, and FIG. 8D(iii) is a color saturation diagram, for the BSY+R (605 nm red) of FIGS. 8A and 8D(i).

FIG. 8E(i) is a table of luminous efficacy of radiation, color point coordinate, CCT, Duv, CRI Ra, R9 color rendering, and CQS Qg values for the BSY+R (615 nm red) of FIG. 8A. A CRI Ra value of 87.26, a R9 value of 59.2, and a Qg value of 102.8 were obtained. FIG. 8E(ii) is a CIELAB a*, b* color space diagram, and FIG. 8E(iii) is a color saturation diagram for the BSY+R (615 nm red) of FIGS. 8A and 8E(i).

FIG. 8F(i) is a table of luminous efficacy of radiation, color point coordinates, CCT, Duv, CRI Ra, R9 color rendering, and CQS Qg values for the BSY+R (628 nm red) of FIG. 8A. A CRI Ra value of 86.1, a R9 value of 72.3, and a Qg value of 107.8 were obtained. FIG. 8F(ii) is a CIELAB a*, b* color space diagram, and FIG. 8F(iii) is a color saturation diagram, for the BSY+R (628 nm red) of FIGS. 8A and 8F(i).

The preceding FIGS. 8A-8F(iii) evidence that a BSY+R source may provide emissions with increased gamut (e.g., increased Qg) relative to a blue LED/multi-phosphor source, and that Qg may be further increased by increasing red LED peak wavelength.

FIGS. 9A-9E(iii) include results obtained by modeling three RGB sources (including red LED dominant wavelengths of 605 nm, 615 nm, and 628 nm, respectively) in comparison to a Cree® XPG 5000K 90 CRI 460 nm blue LED/multi-phosphor source (including a blue LED arranged to stimulate yellow and red phosphors).

FIG. 9A is a plot of measured relative intensity versus wavelength for a Cree® XPG 5000K 90 CRI blue LED/multi-phosphor source and for three RGB sources having red LED dominant wavelengths of 605 nm, 615 nm, and 628 nm, respectively. As shown in FIG. 9A, the Cree® XPG source exhibits a narrow blue peak, but a broad combined yellow red peak. In comparison, each RGB source exhibits sharply defined blue peak, green, and red peaks.

FIG. 9B is a plot of measured relative intensity versus wavelength of the RGB source having a red LED dominant wavelength of 628 nm superimposed with measured reflectance of Roland Eco-Sol Max cyan, magenta, and yellow inks. As shown in FIG. 9B, the red peak at 628 nm overlaps significantly with an elevated portion of the magenta ink reflectance spectrum, such that the long red spectral content is available to stimulate reflection by the magenta ink.

FIG. 9C(i) is a table of luminous efficacy of radiation, color point coordinates, CCT, Duv, CRI Ra, R9 color rendering, and CQS Qg values for the RGB (605 nm red) source of FIG. 9A. A CRI Ra value of 79.89, a R9 prime value of 45.8, and a Qg value of 115.6 were obtained. FIG. 9C(ii) is a CIELAB a*, b* color space diagram, and FIG. 9C(iii) is a color saturation diagram for the RGB (605 nm red) source of FIGS. 9A and 9C(i).

FIG. 9D(i) is a table of luminous efficacy of radiation, color point coordinates, CCT, Duv, CRI Ra, R9 color rendering, and CQS Qg values for the RGB (615 nm red) of FIG. 9A. A CRI Ra value of 56.46, a R9 prime value of 240.8, and a Qg value of 131.9 were obtained. FIG. 9D(ii) is a CIELAB a*, b* color space diagram, and FIG. 9D(iii) is a color saturation diagram, for the RGB (615 nm red) source of FIGS. 9A and 9D(i).

FIG. 9E(i) is a table of luminous efficacy of radiation, color point coordinates, CCT, Duv, CRI Ra, R9 color rendering, and CQS Qg values for the RGB (628 nm red) of FIG. 9A. A CRI Ra value of 37.91, a R9 prime value of 381.5, and a Qg value of 141.7 were obtained. FIG. 9E(ii) is a CIELAB a*, b* color space diagram, and FIG. 9E(iii) is a color saturation diagram, for the RGB (628 nm red) of FIGS. 9A and 9E(i).

The preceding FIGS. 9A-9E(iii) evidence that a RGB source may provide emissions with increased gamut (e.g., increased Qg) and increased red saturation (e.g., R9 prime), relative to a blue LED/multi-phosphor source, and that Qg and R9 prime values may be further increased by increasing red LED peak wavelength.

Figure 10:
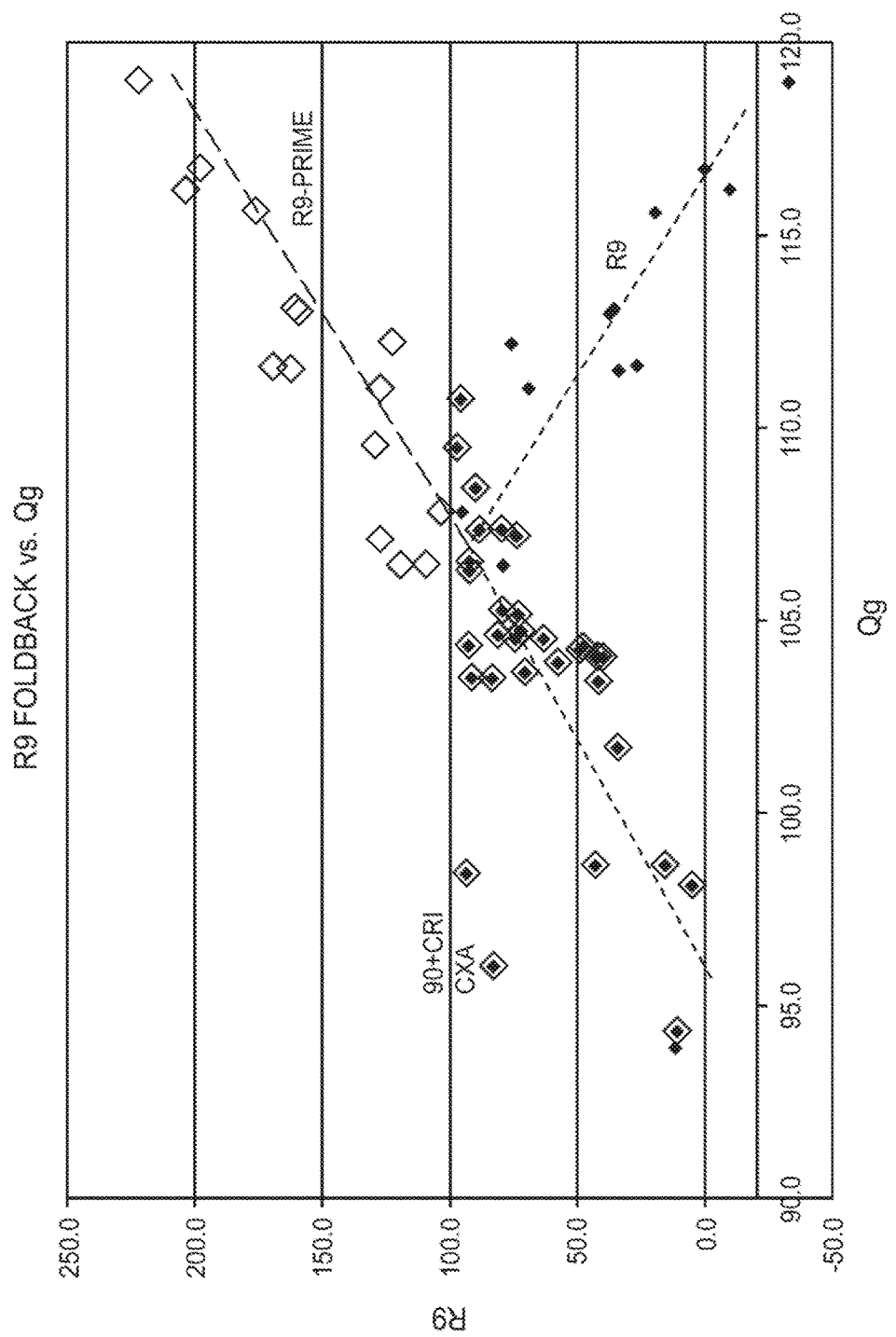
FIG. 10 is a plot of R9 color rendering and R9-prime color rendering for various BSY/G+R LED lighting devices and comparative devices, with trendlines for R9 and R9-prime showing the phenomenon of "foldback" in computation of R9-prime.

The concept of "R9-prime" is illustrated in FIG. 10. As noted previously, R9 is one of six saturated test colors not used in calculating CRI, with R9 embodying a large red content. CRI Ra is concerned with matching the color rendering of a natural light source at the same CCT, and as such, penalizes light sources that produce under-saturation as well as over-saturation. R9 behaves in the same manner, in that R9 values increase with increasing saturation (to a maximum value of 100), and then R9 values start to decline when oversaturation conditions are attained. Unfortunately, the same R9 value may be assigned to an undersaturated or oversaturated condition. The concept of R9-prime seeks to remedy deficiencies associated with R9. In a "standard" (less vivid) region, R9-prime equals R9. As saturation conditions increase, however, R9-prime values are intended to increase smoothly into the high-vividness (e.g., oversaturated) region. FIG. 10 is a plot of R9 color rendering and R9-prime color rendering for various BSY+R devices (constructed by the Applicant) having a 450 nm dominant wavelength blue LED arranged to stimulate a 2:1 green:yellow mixture of LuAG/NYAG phosphors with addition of a LED of different dominant wavelengths (namely, 605 nm, 610 nm, 615, nm, 623 nm, 628 nm, and 633 nm). Such devices were compared to a baseline 90 CRI Cree® EZW XTE device embodying blue LEDs arranged to pump a mixture of yellow and red phosphors. R9 and Qg values for the foregoing devices are plotted in FIG. 10, with trendlines for R9 and R9-prime showing the phenomenon of "foldback" in computation of R9-prime. Solid points embody R9 values, and hollow diamonds embody R9-prime values. As saturation (and Qg) increases beyond a maximum R9 value of 100, R9 values decline while R9-prime value increase. The forked dashed line in FIG. 10 illustrates this phenomenon. The dashed line in the lower left quadrant corresponds to both R9 and R9-prime. Such lines diverge thereafter with increasing saturation, with the upwardly sloping dashed line in the upper right quadrant corresponding to R9-prime, and with the downwardly sloping dashed line in the lower right quadrant corresponding to R9. As shown in FIG. 10, the Cree® CXA (90 CRI) BS(Y+R) device exhibits a R9 value of less than 100 and a Qg value of about 96. A number of BSY/R+G devices indicated by the hollow diamonds in the upper right quadrant of FIG. 10 exhibit R9-prime values in a range of from 125 to 220 or more, and exhibit Qg values between 110 and 120.

FIGS. 11A to 11C illustrate examples of solid state emitter (e.g., LED) packages that may be used to provide one or more solid state emitters of lighting devices according to certain embodiments of the present invention.

FIG. 11A illustrates an LED package 10 in which a LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material, such as a phosphor or other lumiphoric material. The entire assembly may be encapsulated in a clear protective resin 14, which may be molded in the shape of a lens to collimate the light emitted from the LED chip 12 and/or phosphor particles in the encapsulant material 16. At least some of the light emitted by the LED chip 12 over a first wavelength range (e.g., "primary light") may be received by the phosphor, which may responsively emit light over a second wavelength range (e.g., "secondary light"). The primary light emitted by the LED chip 12 may be partially or completely absorbed by the wavelength conversion material, such that the overall light output of the LED package 10 includes both the primary light emitted by the LED chip 12 and the secondary light emitted by the wavelength conversion material.

Another LED package 20 that may be used in some embodiments of the present invention is illustrated in FIG. 11B. Relative to the LED package 10 described above, the LED package 20 depicted in FIG. 11B may be more suited for high power operations which may generate more heat. In the LED package 20, an LED chip 22 is mounted onto a carrier, such as a printed circuit board (PCB) carrier 23. A metal reflector 24 mounted on the carrier 23 surrounds the LED chip 22 and reflects light emitted by the LED chip 22 away from the package 20. The metal reflector 24 is typically attached to the carrier 23 by means of a solder or epoxy bond. The reflector 24 also provides mechanical protection to the LED chip 22. One or more wirebond connections 11 are made between ohmic contacts on the LED chip 22 and electrical traces 25A, 25B on the carrier 23. The mounted LED chip 22 is covered with an encapsulant material 26, which may provide environmental and/or mechanical protection to the chips while also acting as a lens. The encapsulant material 26 includes at least one phosphor or other wavelength conversion material that absorbs at least some of the light emitted by the LED chip 22, and responsively emits light of a different wavelength.

Yet another LED package 30 that may be used in some embodiments of the present invention is illustrated in FIG. 11C. The LED package 30 includes an LED chip 32 mounted on a submount 34 to a carrier substrate 33. The carrier substrate 33 can include an alumina substrate and/or a metal core PCB carrier substrate. A reflector 44 attached to the carrier substrate 33 surrounds the LED chip 32 and defines an optical cavity 35 above the LED chip(s) 32. An encapsulant material 36, such as silicone, fills the optical cavity 35. The encapsulant material 36 further includes at least one phosphor (or other wavelength conversion material) that is that absorbs at least some of the light emitted by the LED chip 32, and responsively emits light of a different wavelength. The reflector 44 reflects light emitted by the LED chip 32 away from the package 30. The reflector 44 also includes an upwardly extending cylindrical sidewall 45 that defines a channel in which a lens 38 can be inserted. The lens 38 may be held in place by the encapsulant material 36, and can move up and down as the encapsulant material 36 expands and contracts due to heat cycling. The lens 38 may include a light-scattering lens that is configured to refract light emitted by the LED and the wavelength conversion material (e.g., a transparent lens body with light scattering particles such as $TiO_2$, $Al_2O_3$, $SiO_2$, etc., and/or a lens body including a roughened outer surface that can randomly scatter light that exits the lens 38).

FIG. 12A illustrates a solid state emitter package 100 including multiple solid state light emitters as described herein. The emitter package 100 includes multiple (e.g., four) LED chips 150A-150D that may be separately controlled (e.g., via backside anodes 121A-121D and cathodes 122A-122D) and that are supported by an insulating substrate 110. The substrate 110, which may embody a ceramic material, includes an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the upper surface 111 of the substrate 110. Gaps 145 may be provided between adjacent die attach pads 141A-141D and/or electrical elements 142A-142D to prevent undesired conductive electrical communication. In certain embodiments, die attach pads need not be electrically conductive, such as in cases where anode and cathode connections to a solid state emitter chip are both made with wirebonds. An insulating soldermask 147 is patterned over peripheral portions of the electrical traces 140, and a molded lens 160 (e.g., including a raised or hemispherical portion 161 and a base portion 162) is arranged over the upper surface 111 of the substrate 110 and is arranged to transmit at least a portion of light generated by the LED chips 150A-150D.

LED chips 150A-150D of any suitable peak wavelength (e.g., color) may be used, and one, some, or all of the chips 150A-150D may be arranged to stimulate emissions of one or more lumiphors (e.g., phosphors). Although some or all of the LED chips 150A-150D may be separately controlled, in certain embodiments groups of two or more LED chips 150A-150D or groups of LED chips 150A-150D may be controlled together in a groupwise fashion. One or more LED chips 150A-150D may be arranged to stimulate emissions of one or more lumiphoric materials. Although four LED chips 150A-150D are illustrated in FIG. 12A, it is to be appreciated that a LED package may include any desirable number of LED chips, including groups of chips arranged in series, in parallel, or in series-parallel configurations.

FIG. 12B is a bottom plan view of each of the emitter package 100 of FIG. 12A. A bottom surface 112 of the substrate includes four anodes 121A-121D and four cathodes 122A-122D patterned thereon (e.g., as electrical traces), with one paired anode/cathode per quadrant. The separate anodes 121A-121D and cathodes 122A-122D enable separate control of the multiple LED chips 150A-150D if desired. The various anodes 121A-121D and cathodes 122A-122D are separated by gaps that may be filled with solder mask material sections 127-1, 127-2. A thermal element (e.g., thermal spreading element) 126 may be arranged along the bottom surface 112 between the solder mask material sections 127-1, 127-2 and generally underlapping the LED chips 150A-150D. The thickness of the thermal element 126 may be the same as or different from (e.g., thicker than) the anodes 121A-121D and cathodes 122A-122D. As shown, the package 100 is devoid of any anode or cathode arranged on, or extending laterally beyond, any side wall 113-116 thereof.

FIGS. 13A-13H embody simplified schematic views of solid state lighting devices in which conventional features inherent to such devices (e.g., LED devices) known in the art but not essential to the understanding of the present disclosure have been omitted to facilitate ease of explanation. In certain embodiments according to FIGS. 13A-13H, multiple solid state light emitters may be independently controllable. In other embodiments, groups of two or more solid state light emitters may be controlled together in a groupwise manner.

In certain embodiments according to FIGS. 13A-13H, such devices may include multiple solid state emitters arranged to generate different peak wavelengths, wherein each solid state emitter comprises a peak wavelength that differs from a peak wavelength of at least one other solid state light emitter (or at least two other solid state light emitters) of the lighting device by at least 20 nm, at least 30 nm, at least 40 nm, at least 50 nm, or another threshold specified herein. In certain embodiments, the preceding value ranges may optionally be bounded at an upper end by 50 nm, 60 nm, 70 nm, or 80 nm. In certain embodiments according to one or more of FIGS. 13A-13H, such devices may be arranged to generate aggregate emissions including at least three peak wavelengths or at least four peak wavelengths. In certain embodiments, at least two peak wavelengths or at least three peak wavelengths of the aggregate emissions may be separated from each other peak wavelength by at least 30 nm, at least 40 nm, at least 50 nm, or another threshold specified herein (with the preceding value ranges optionally being bounded at an upper end by 50 nm, 60 nm, or 70 nm).

In certain embodiments according to FIG. 13A or FIGS. 13C-13H, one or more of the lumiphoric materials may embody a narrow-band light emitting material providing emissions with a full width-half maximum (FWHM) intensity value of less than 90 nm, of less than 80 nm, of less than 75 nm, of less than 70 nm, or of less than 65 nm. In certain embodiments, one or more of the lumiphoric materials may comprise at least one quantum dot material. In certain embodiments, one or more solid state emitters may each be arranged to stimulate emissions of multiple lumiphoric materials including different peak wavelengths.

In certain embodiments according to FIGS. 13A-13H, each solid state emitter comprises a peak wavelength in a visible range. In certain embodiments according to FIGS. 13A-13H, electrically activated solid state emitters may be arranged to provide short wavelength blue, long wavelength blue, cyan, or green emissions prior to any lumiphor conversion. In certain embodiments, a short wavelength blue solid state light emitter is arranged to generate emissions including a peak wavelength in a range of from 390 nm to 460 nm (with the 390 nm lower boundary optionally being replaced with 400 nm, 410 nm, 420 nm, 430 nm or 440 nm in certain embodiments), and a long wavelength blue solid state emitter may be arranged to generate emissions including a peak wavelength in a range of from 461 nm to 505 nm (or in a subrange of from 470 nm to 489 nm, or in a subrange of from 470 nm to 480 nm, or in a subrange of from 472 to 475 nm, or another subrange specified herein). In certain embodiments, a green solid state light emitter is arranged to generate emissions including a peak wavelength in a range of from 506 nm to 560 nm.

Although FIGS. 13A-13F each illustrate two to four solid state emitter chips, it is to be appreciated that a lighting device such as a LED package or lighting component may include any desirable number of solid state emitter chips, including groups of chips arranged in series, in parallel, or in series-parallel configurations.

Figure 13A:
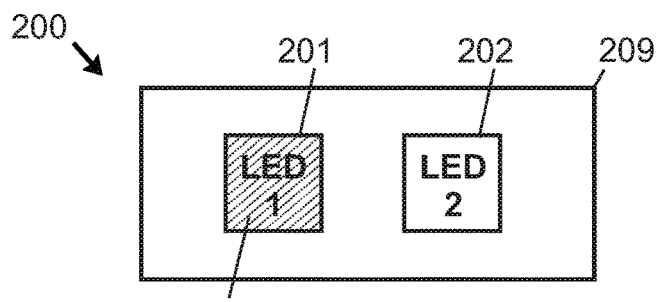
FIG. 13A is a schematic view of a first lighting device including first and second solid state emitters (e.g., including LEDs), with one solid state emitter arranged to stimulate a lumiphoric material, supported by a single submount or substrate.

FIG. 13A is a schematic view of a first lighting device 200 including first and second solid state emitters 201, 202 (e.g., including LEDs) supported by a single submount or substrate 209. One solid state emitter 201 is arranged to stimulate emissions of at least one lumiphoric material 205. Aggregate emissions of the lighting device 200 may include emissions of the second solid state emitter 202, a portion of emissions of the first solid state emitter 201 not absorbed by (and therefore passing through) the at least one lumiphoric material 205, and emissions of the at least one lumiphoric material 205.

In one embodiment, the first solid state emitter 201 may include a blue LED arranged to stimulate emissions of at least one lumiphoric material 205 including a green lumiphor or a green-yellow lumiphor mixture, and the second solid state emitter 202 may include a red LED. In another embodiment, the first solid state emitter 201 may include a blue LED arranged to stimulate emissions of a red lumiphor, and the second solid state emitter 202 may include a green LED.

Although not shown in FIG. 13A, in certain embodiments, the second solid state emitter 202 may be arranged to stimulate emissions of at least one second lumiphoric material.

Figure 13B:
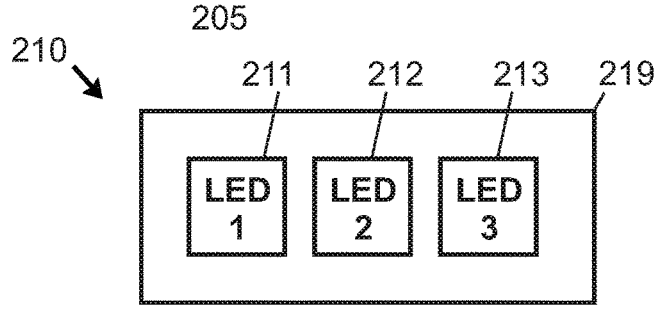
FIG. 13B is a schematic view of a second lighting device including first, second, and third solid state emitters supported by a single submount or substrate.

FIG. 13B is a schematic view of a second lighting device 210 including first through third solid state emitters (e.g., LEDs) 211-213 supported by a single submount or substrate 219. None of the emitters 211-213 is arranged to stimulate emissions of a lumiphoric material. In one embodiment, the first through third solid state emitters 211-213 embody red, green, and blue solid state light emitters, whereby emissions of each solid state emitter 211-213 contribute to aggregate emissions of the lighting device 210. In one embodiment, the first through third solid state emitters 211-213 embody red, green, and blue solid state light emitters.

Figure 13C:
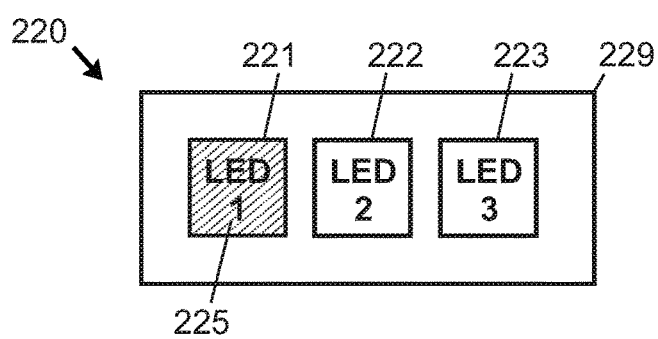
FIG. 13C is a schematic view of a third lighting device including first, second, and third solid state emitters, with one solid state emitter arranged to stimulate a lumiphoric material, supported by a single submount or substrate.

FIG. 13C is a schematic view of a third lighting device 220 including first through third solid state emitters (e.g., LEDs) 221-223 supported by a single submount or substrate 229. One solid state emitter 221 is arranged to stimulate emissions of at least one lumiphoric material 225. Aggregate emissions of the lighting device 220 may include emissions of the second solid state emitter 222, emissions of the third solid state emitter 223, a portion of emissions of the first solid state emitter 221 not absorbed by (and therefore passing through) the at least one lumiphoric material 225, and emissions of the at least one lumiphoric material 225. In certain embodiments, the first solid state emitter 221 may include a blue LED arranged to stimulate emissions of at least one lumiphoric material 225 including a yellow lumiphor, green lumiphor, or green-yellow lumiphor mixture, the second solid state emitter 202 may include a green LED, and the third solid state emitter 203 may include a red LED.

Figure 13D:
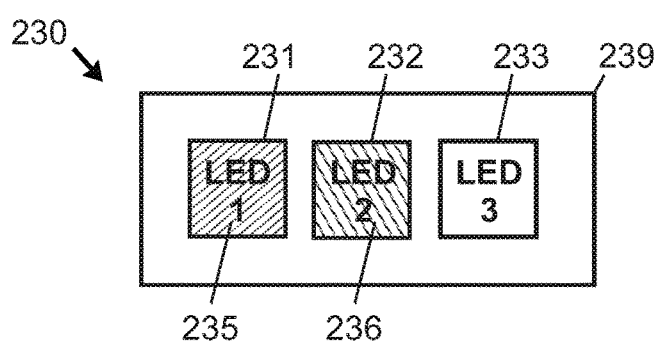
FIG. 13D is a schematic view of a fourth lighting device including first, second, and third solid state emitters, with two solid state emitters arranged to stimulate lumiphoric materials, supported by a single submount or substrate.

FIG. 13D is a schematic view of a fourth lighting device 230 including first through third solid state emitters (e.g., LEDs) 231-233 supported by a single submount or substrate 239. The first solid state emitter 231 is arranged to stimulate emissions of at least one first lumiphoric material 235, and the second solid state emitter 232 is arranged to stimulate emissions of at least one second lumiphoric material 236. In certain embodiments, one or both of the first and second lumiphoric materials 235, 236 may provide emissions with saturated (e.g., green or red) color, such as having a color purity of at least 85%, at least 90%, at least 95%, or greater. Aggregate emissions of the lighting device 230 may include emissions of the third solid state light emitter 233, emissions of the lumiphoric materials 235, 236, and any portion of emissions of the first and second solid state emitters 231, 232 not absorbed by the lumiphoric materials 235, 236. In certain embodiments, the first solid state emitter 231 may include a blue LED arranged to stimulate emissions of at least one first lumiphoric material 235 including a yellow lumiphor, green lumiphor, or green-yellow lumiphor mixture, the second solid state emitter 232 may include a blue LED arranged to stimulate at least one second lumiphoric material 236 that may include a green or red lumiphoric material (or a green LED arranged to stimulate a red lumiphoric material), and the third solid state emitter 203 may include a red LED or green LED.

Figure 13E:
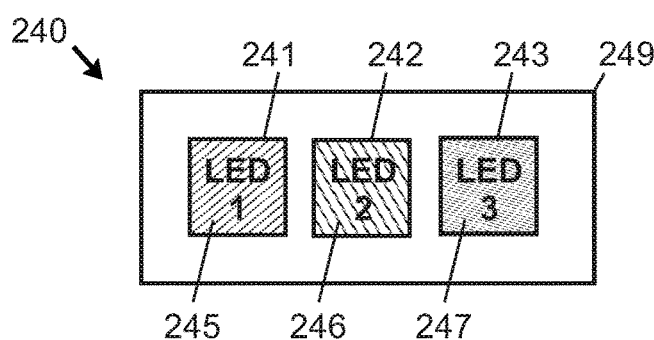
FIG. 13E is a schematic view of a fifth lighting device including first, second, and third solid state emitters, with each solid state emitter arranged to stimulate a lumiphoric material, supported by a single submount or substrate.

FIG. 13E is a schematic view of a fifth lighting device 240 including first through third solid state emitters (e.g., LEDs) 241-243 supported by a single submount or substrate 249. The first solid state emitter 241 is arranged to stimulate emissions of at least one first lumiphoric material 245, the second solid state emitter 242 is arranged to stimulate emissions of at least one second lumiphoric material 246, and the third solid state emitter 243 is arranged to stimulate emissions of at least one third lumiphoric material 247. In certain embodiments, one, two, or all of first through third lumiphoric materials 245-247 may provide emissions with saturated (e.g., blue, green, or red) color. In certain embodiments, one or more of the lumiphoric materials 245-247 may embody a narrow-band light emitting material providing emissions with a full width-half maximum value of less than about 35 nm less than about 30 nm, less than about 35 nm, or less than about 25 nm. In certain embodiments, one or more of the lumiphoric materials 245-247 may comprise a quantum dot material. Aggregate emissions of the lighting device 240 may include emissions of the lumiphoric materials 245-247 and any portion of emissions of the first, second, or third solid state emitters 241-243 not absorbed by the lumiphoric materials 245-247.

FIG. 13F is a schematic view of a sixth lighting device 250 including first through fourth solid state emitters (e.g., LEDs) 251-254 supported by a single submount or substrate 259. The first solid state emitter 251 is arranged to stimulate emissions of at least one first lumiphoric material 255. In certain embodiments, the first solid state emitter 251 may include a blue LED arranged to stimulate emissions of at least one lumiphoric material 225 including a yellow lumiphor, green lumiphor, or green-yellow lumiphor mixture, and the second through fourth solid state emitters 252-254 may include red, green, and blue (or cyan) solid state light emitters such as LEDs.

FIG. 13G is a schematic view of a seventh lighting device 260 including first through fourth solid state emitters (e.g., LEDs) 261-264 supported by a single submount or substrate 269. The first and second solid state emitters 261, 262 are arranged to stimulate emissions of first and second lumiphoric materials 265, 266, respectively. In certain embodiments, the first solid state emitter 261 may include a blue LED arranged to stimulate emissions of at least one first lumiphoric material 265 including a yellow and/or a red lumiphor, the second solid state emitter 262 may include a blue LED arranged to stimulate emissions of at least one second lumiphoric material 266 including a green lumiphor, and the third and fourth solid state emitters 263, 264 may include green and red solid state emitters, respectively.

FIG. 13H is a schematic view of an eighth lighting device 270 including first through fourth solid state emitters (e.g., LEDs) 271-274 supported by a single submount or substrate 279. The first, second, and third solid state emitters 271-273 are arranged to stimulate emissions of first to third lumiphoric materials 275-277 respectively. In certain embodiments, the first solid state emitter 271 may include a blue LED arranged to stimulate emissions of at least one first lumiphoric material 275 including a yellow lumiphor, the second solid state emitter 272 may include a blue LED arranged to stimulate emissions of at least one second lumiphoric material 276 including a green lumiphor, the third solid state emitter 272 may include a blue LED or a green LED arranged to stimulate emissions of at least one third lumiphoric material 277 including a red lumiphor, and the fourth solid state emitter 274 may include a green or red solid state emitter.

Although FIGS. 13A-13F each illustrate a lighting device that may be embodied in a single emitter package or emitter component, it is to be appreciated that lighting devices described herein may include any desirable number of emitter packages or emitter components, which may be arranged in series, in parallel, or in series-parallel configurations in an array or other suitable configuration. Additionally, in certain embodiments, multiple emitter packages or emitter components may be controlled as a group, may be controlled in clusters, or may be controlled independently.

FIG. 14 illustrates a lighting apparatus (e.g., light fixture) 310 according to at least one embodiment. The apparatus 310 includes a substrate or mounting plate 375 to which multiple solid state emitter (e.g., LED) lamps 370-1 to 370-6 (optionally embodied in multi-chip lamps such as multi-chip LED packages) are attached, wherein each lamp 370-1 to 370-6 may include multiple LEDs or other solid state emitters as described herein. In certain embodiments, each lamp 370-1 to 370-6 may optionally include a cluster of solid state emitters, including at least one lumiphor converted solid state emitter and at least one non-lumiphor-converted solid state emitter. The mounting plate 375 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 370-1, each solid state lamp 370-1 to 370-6 may include multiple solid state emitters (e.g., LEDs) 374A-374C preferably arranged on a single submount 361. Although FIG. 14 illustrates four solid state emitter chips as being associated with each multi-chip solid state lamp 370-1 to 370-6, it is to be appreciated that any suitable number of solid state emitter chips may be associated with each multi-chip solid state lamp 370-1 to 370-6, and the number of solid state emitter chips associated with different (e.g., multi-chip) solid state lamps may be different. Preferably, solid state lamps with different output characteristics may be intentionally provided in a single apparatus 310, whereby separate control of lamps arranged to output different color points may enable the fixture to be adjusted to provide aggregate emissions having different (e.g., two or more different) color points and/or different vividness characteristics according to one or more different operating modes that may be responsive to a user input, to a sensor, to a timer or clock, or another appropriate control signal generating element.

The solid state lamps 370-1 to 370-6 may be grouped on the mounting plate 375 in clusters or other arrangements so that the light apparatus 310 outputs a desired pattern of light. In certain embodiments, at least one state emitter lamp associated with a single apparatus 310 includes a lumiphor-converted light emitting component. In certain embodiments, a majority or substantially all of the solid state lamps 370-1 to 370-6 may be overlaid or otherwise covered with at least one functional element, such as may include a diffuser, an optical element, and/or a lumiphoric material. With continued reference to FIG. 14, the light apparatus 310 may include one or more control circuit components 380 arranged to operate the solid state lamps 370-1 to 370-6 by independently applying currents and/or adjusting duty cycle of respective LED components or groups thereof. In certain embodiments, individual solid state chips 364A-364D in various solid state lamps 370-1 to 370-6 may be configured to be individually addressed by the control circuit 380. In certain embodiments, the apparatus 310 may be self-ballasted. In certain embodiments, a control circuit 380 may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 380 may be configured to control the current driven through the solid state emitter chips 364A-364D associated with the lamps 370-1 to 370-6 using one or more control schemes known in the art. In certain embodiments, the control circuit 380 may be attached to an opposite or back surface of the mounting plate 375, or may be provided in an enclosure or other structure (not shown) that is segregated from the apparatus 310.

While not illustrated in FIG. 14, the light apparatus 310 may further include one or more heat spreading components and/or heatsinks for spreading and/or removing heat emitted by solid state emitter chips 364A-364D associated with the lamps 370-1 to 370-6. For example, a heat spreading component may include a sheet of thermally conductive material configured to conduct heat generated by the solid state emitter chips 364A-364D of the light apparatus 310 and spread the conducted heat over the area of the mounting plate 375 to reduce thermal stratification in the light apparatus 310.

FIG. 15 illustrates a lighting apparatus (e.g., light fixture) 410 according to another embodiment. The apparatus includes multiple solid state emitter lamps 400A-400X (which may optionally be embodied in solid state emitter packages or clusters) each including multiple solid state light emitting chips (e.g., LEDs) 448A-448X, with each lamp 400A-400X optionally embodying one or more LED packages or LED components as described previously herein. Each lamp 400A-400X preferably includes multiple emitters arranged to generate spectral output including different peak wavelengths. (Although six lamps 400A-400X are shown, it is to be appreciated that any desirable number of clusters may be provided, as represented by the variable "X"). In certain embodiments, each lamp 400A-400X may embody an individually temperature compensated lamp. Each lamp 400A-400X may preferably (but not necessarily) include a single submount 442A-442X to which the multiple LEDs 448A-448X are mounted or otherwise supported. The lighting device 410 includes a body structure or substrate 411 to which each lamp 400A-400X may be mounted, with each lamp 400A-400X optionally being arranged in conductive thermal communication with a single heatsink 418 and further arranged to emit light to be diffused by a single diffuser or other optical element 417. The lighting device 410 is preferably self-ballasted. Power may be supplied to the lighting device via contacts 416 (e.g., as may be embodied in a single anode and single cathode, or multiple anodes and cathodes). A power conditioning circuit 412 may provide AC/DC conversion utility, voltage conversion, and/or filtering utility. At least one control circuit 414 may be provided to control operation (e.g., control dimming) of one or more lamps 400A-400X or subgroups thereof. In certain embodiments, each lamp 400A-400X may include one or more emitters of a first LED component and one or more emitters of a second LED component. In other embodiments, each lamp 400A-400X may include emitters of either a first LED component or a second LED component, but not emitters of both LED components within the same specific lamp 400A-400X. In certain embodiments, one or more photosensors, image sensors, or light sensing elements (not shown) may be arranged to receive emissions from one or more lamps 400A-400X, with an output signal of the one or more light sensing elements being used to control or adjust operation of the lamps 400A-400X, such as to ensure attainment of a desired output color point or output color temperature by the lamps 400A-400X. In certain embodiments, one or more photosensors or image sensors may detect whether a surface to be illuminated includes skin tones or other content for which illumination with an operating mode providing aggregate emissions with greater color rendering index (CRI or CRI Ra) properties may be appropriate, as opposed to illumination according to a different operating mode providing aggregate emissions with increased vividness but lower color rendering properties.

FIG. 16 illustrates a driver module 530 for driving a LED array 520 according to one embodiment of the disclosure. In certain embodiments, the LED array 520 may be divided into multiple strings of series-connected LEDs 582. A first LED string S1 includes multiple first LEDs 582-1, a second LED string S2 includes multiple second LEDs 582-2, and a third LED string S3 includes multiple third LEDs 582-3. In certain embodiments, the first LEDs 582-1 include red LEDs, the second LEDs 582-2 include green LEDs, and the third LEDs 582-3 include blue LEDs. Other combinations of LEDs (with or without lumiphor conversion) as disclosed herein may be employed. Additionally, although only three LED strings S1, S2, S3 are shown in FIG. 16, it is to be appreciated that additional strings may be provided in certain embodiments, and that multiple groups or strings of first LEDs 582-1, multiple groups or strings of second LEDs 582-2, and multiple groups or strings of third LEDs 582-3 (optionally supplemented with multiple groups or strings of fourth LEDs (not shown)) may be independently controlled. Independent control of large numbers of different LEDs may permit different subregions of a surface (e.g., an upright surface) containing printed material to be illuminated differently, such as to illuminate different subregions with light having different brightness, gamut properties, or both brightness and gamut properties (thereby impacting vibrancy).

In general, the driver module 530 controls the currents $i_1$, $i_2$, and $i_3$ that are used to drive the respective LED strings S1, S2, and S3. The ratio of currents $i_1$, $i_2$, and $i_3$ provided to the respective LED strings S1, S2, and S3 may be adjusted to effectively control the relative intensities of differently colored light generated by the respective strings S1, S2, S3. The resultant light from each LED string S1, S2, and S3 may be mixed to generate an overall light output that has a desired color, CCT, and intensity (which may also be referred to as a dimming level). The overall light output may be white light that falls on or within a desired proximity of the BBL with a desired CCT. Although dimming in the context of three LED strings S1, S2, and S3 is described herein, it is to be appreciated that dimming may be independently applied to large numbers of different LEDs (embodying subgroups of the LED array 520) in certain embodiments, with appropriate changes to architecture of the driver module 530.

The number of LED strings S1, S2, S3 may vary from one to many and different combinations of LED colors may be used in the different strings. Each LED string S1, S2, S3 may have LEDs 582 of the same color, variations of the same color, or substantially different colors. In the illustrated embodiment, each LED string S1, S2, S3 is configured such that all of the LEDs 582-1, 582-2, 582-3 within each individual string are all essentially identical in color. However, in certain embodiments, the LEDs 582-1, 582-2, 582-3 in each string may vary substantially in color or embody completely different colors in certain embodiments. In certain embodiments, three LED strings S1, S2, S3 with red, green, and blue LEDs may be used, wherein each LED string S1, S2, S3 embodies LED dedicated to a single color. Other combinations of colored and white (or near white, such as blue yellow or blue shifted green) LEDs may be provided. Single string embodiments are also envisioned, wherein currents may be individually adjusted for the LEDs of the different colors using controllable bypass circuits, controllable shunt circuits, or the like.

The driver module 530 illustrated in FIG. 16 generally includes AC-DC conversion circuitry 506, control circuitry 510, and a number of current sources, such as the illustrated DC-DC converters 512. In certain embodiments, signals from one or more user input elements 515 may be communicated directly to the driver module 530, or alternatively through the communication module 532 (which may embody a wireless receiver or wireless transceiver) or through the communication interface 514. The AC-DC conversion circuitry 506 is configured to receive an AC power signal (AC IN), rectify the AC power signal, correct the power factor of the AC power signal, and provide a DC output signal. The DC output signal may be used to directly power the control circuitry 510 and any other circuitry provided in the driver module 530, including the DC-DC converters 512, a communication interface 514, and the sensor module 540.

The DC output signal may also be provided to the power bus, which is coupled to one or more power ports (e.g., as part of a standard communication interface). The DC output signal provided to the power bus may be used to provide power to one or more external devices that are coupled to the power bus and separate from the driver module 530. These external devices may include the communication module 532 and any number of auxiliary devices, such as the sensor module 540.

In certain embodiments, the sensor module 540 may include at least one sensor arranged to sense at least one of an environmental condition and a property of the surface (e.g., an upright surface) to be illuminated and produce at least one sensor output signal, wherein the control circuitry 510 is configured to select or adjust an operating mode of a lighting device (thereby adjusting operation of the LED strings S1, S2, and S3 or subgroups of the LED array 520) responsive to the at least one sensor output signal. In certain embodiments, the senor module 540 may include a time signal generating element or time signal receiving element arranged to provide at least one signal indicative of time, wherein the control circuitry 510 is configured to select or adjust an operating mode of a lighting device (thereby adjusting operation of the LED strings S1, S2, and S3 or subgroups of the LED array 520) responsive to the at least one signal indicative of time. In certain embodiments, the sensor module 540 may include at least one sensor arranged to sense at least one of an environmental condition and a property of a surface (e.g., an upright surface) and produce at least one sensor output signal, wherein the control circuitry 510 is configured to adjust operation of multiple groups of LEDs (e.g., including LED strings S1, S2, S3 or subgroups of the LED array 520) to preferentially illuminate one or more subregions of a surface (e.g., an upright surface) responsive to the at least one sensor output signal.

In certain embodiments, the user input module 515 may include a user input signal generating element or user input signal receiving element arranged to provide at least one signal indicative of a user input, wherein the control circuitry 510 is configured to select or adjust an operating mode of the lighting device (thereby adjusting operation of the LED strings S1, S2, and S3) responsive to the at least one signal indicative of a user input. In certain embodiments, the user input module 515 may include a user input signal generating element or user input signal receiving element arranged to provide at least one signal indicative of a user input, wherein the control circuitry 510 is configured to adjust operation of subgroups of LEDs 582-1, 582-2, and 582-3 of the LED array 520 to preferentially illuminate one or more subregions of a surface (e.g., an upright surface) responsive to the at least one signal indicative of a user input. In certain embodiments, the preferential illumination includes altering relative gamut of illumination of at least one subregion of an upright surface in comparison to at least one other subregion of the upright surface.

In certain embodiments, the communication interface 514 may include a wired or wireless communication signal receiving element arranged to receive a signal indicative of at least one of an environmental condition, a time or temporal condition, and a user input. In certain embodiments, the communication interface 514 may include a wired or wireless communication signal receiving element arranged to receive a signal indicative of an instruction set (optionally stored in the memory 516), wherein the control circuitry 510 is configured to utilize the instruction set to adjust operation of one or more LEDs 582-1, 582-2, and 582-3 (or subgroups of LEDs 582-1, 582-2, and 582-3 of the LED array 520) to preferentially illuminate one or more subregions of a surface(e.g., an upright surface).

As illustrated, the three respective DC-DC converters 512-1, 512-2, 512-3 of the driver module 530 provide currents $i_1$, $i_2$, and $i_3$ for the three LED strings S1, S2, and S3 in response to control signals CS1, CS2, and CS3. The control signals CS1, CS2, and CS3 may be pulse width modulated (PWM) signals that effectively turn the respective DC-DC converters 512-1, 512-2, 512-3 on during a logic high state and off during a logic low state of each period of the PWM signal.

In certain embodiments the control signals CS1, CS2, and CS3 may be the product of two PWM signals. The first PWM signal is a higher frequency PWM signal that has a duty cycle that effectively sets the DC current level through a corresponding one of LED strings S1, S2, and S3, when current is allowed to pass through the LED strings S1, S2, and S3. The second PWM signal is a lower frequency signal that has a duty cycle that corresponds to a desired dimming or overall output level. In essence, the higher frequency PWM signals set the relative current levels though each LED string S1, S2, and S3 while the lower frequency PWM signal determines how long the currents $i_1$, $i_2$, and $i_3$ are allowed to pass through the LED strings S1, S2, and S3 during each period of the lower frequency PWM signal. The longer the currents $i_1$, $i_2$, and $i_3$ are allowed to flow through the LED strings S1, S2, and S3 during each period, the higher the output level, and vice versa. Given the reactive components associated with the DC-DC converters 512, the relative current levels set with the higher frequency PWM signals may be filtered to a relative DC current. However, this DC current is essentially pulsed on and off based on the duty cycle of the lower frequency PWM signal. In one embodiment, the higher frequency PWM signal may have a switching frequency of around 500 KHz, while the lower frequency PWM signal may have a switching frequency of around 5 KHz.

In certain embodiments, a dimming device may control the AC power signal. The AC-DC conversion circuitry 506 may be configured to detect the relative amount of dimming associated with the AC power signal and provide a corresponding dimming signal to the control circuitry 510. Based on the dimming signal, the control circuitry 510 will adjust the currents $i_1$, $i_2$, and $i_3$ provided to each of the LED strings S1, S2, and S3 to effectively reduce the intensity of the resultant light emitted from the LED strings S1, S2, and S3 while maintaining the desired CCT. As described further below, the CCT and dimming levels may be initiated internally or received from the user input element 515, a photosensor (e.g., ambient light sensor), an image sensor, or another sensor. If received from an external device via the communication module 532, the color point, CCT level, and/or dimming levels are delivered from the communication module 532 to the control circuitry 510 of the driver module 530 in the form of a command via the communication bus. The driver module 530 will respond by controlling the currents $i_1$, $i_2$, and $i_3$ in the desired manner to achieve the requested CCT and/or dimming levels.

The intensity and CCT of light emitted by the LEDs 582 may be affected by temperature. If associated with a thermistor $S_T$ or other temperature-sensing device, the control circuitry 510 can control the currents $i_1$, $i_2$, and $i_3$ provided to each of the LED strings S1, S2, and S3 based on ambient temperature of the LED array 520 in an effort to compensate for temperature effects. The control circuitry 510 may also monitor the output of the occupancy and ambient light sensors $S_O$ and $S_A$ for occupancy and ambient light information and further control the currents $i_1$, $i_2$, and $i_3$ in a desired fashion. Each of the LED strings S1, S2, and S3 may have different temperature compensation adjustments, which may also be functions of the magnitude of the various currents $i_1$, $i_2$, and $i_3$.

In certain embodiments, the control circuitry 510 may be used to adjust currents to the LED strings S1, S2, and S3 to adjust at least one gamut property of emissions of the LED strings S1, S2, and S3. In certain embodiments, the control circuitry 510 may be configured to operate the LED strings S1, S2, and S3 according to multiple operating modes having different gamut properties. In certain embodiments, the control circuitry 510 may additionally or alternatively be arranged to adjust operation of one or more solid state light emitters or subgroups thereof to preferentially illuminate one or more subregions of a surface (e.g., an upright surface) containing printed material.

The control circuitry 510 may include a central processing unit (CPU) and sufficient memory 516 to enable the control circuitry 510 to bidirectionally communicate with the communication module 532 or other devices over the communication bus through an appropriate communication interface (I/F) 514 using a defined protocol, such as the standard protocol described above. The control circuitry 510 may receive instructions from the communication module 532 or other device and take appropriate action to implement the received instructions. The instructions may include controlling how the LEDs 582 of the LED array 520 are driven, or returning operational data, such as temperature, occupancy, light output, or ambient light information, that was collected by the control circuitry 510 to the communication module 532 or other device via the communication bus. In certain embodiments, the functionality of the communication module 532 may be integrated into the driver module 530, and vice versa.

In certain embodiments, the control circuitry 510 of the driver module 530 is loaded with a current model in the form of one or more functions (equation) or look up tables for each of the currents $i_1$, $i_2$, and $i_3$. Each current model is a reference model that is a function of dimming or output level, temperature, and CCT. The output of each model provides a corresponding control signal CS1, CS2, and CS3, which effectively sets the currents $i_1$, $i_2$, and $i_3$ in the LED strings S1, S2, and S3. The three current models are related to each other. At any given output level, temperature, and CCT, the resulting currents $i_1$, $i_2$, and $i_3$ cause the LED strings S1, S2, and S3 to emit light, which when combined, provides an overall light output that has a desired output level and CCT, regardless of temperature. While the three current models do not need to be a function of each other, they are created to coordinate with one another to ensure that the light from each of the strings S1, S2, and S3 mix with one another in a desired fashion.

FIG. 17 illustrates a billboard or outdoor sign 600 including an upright surface 601 with printed material 602 thereon. The printed material 602, which may include CMY or CMYK ink, is illuminated by multiple solid state lighting devices 605A-605X anchored by supports 619. Each solid state lighting device 605A-605X includes multiple solid state light emitters and is arranged in front of the upright surface 601 with the printed material 602. As shown in FIG. 17, each solid state lighting device 605A-605X is arranged below a lateral centerline of the upright surface 601, adjacent to a lower edge of the upright surface 601. The upright surface 601 may be elevated by one or more legs 608 or other supports. Although not shown in FIG. 17, it is to be appreciated that lighting devices may be arranged along or adjacent to any one or more surfaces or edges of the billboard or sign 600, such as along a bottom edge, top edge, left side edge, and/or right side edge. In certain embodiments, each solid state lighting device 605A-605X may include one or more optical elements (e.g., lenses, diffusers, filters, etc.) to achieve a desired distribution or pattern of light on the upright surface 601 with the printed material 602. In certain embodiments, each solid state lighting device 605A-605X may be independently controlled such as to permit different subregions of the upright surface 601 to be illuminated differently. In other embodiments, the solid state lighting device 605A-605X may be controlled together as a group. In certain embodiments, one or more of the solid state lighting devices 605A-605X may include one or more sensors of any suitable type; alternatively, sensors (not shown) of various types disclosed herein may be arranged in electrical communication with one or more of the solid state lighting devices 605A-605X.

FIG. 18 is a perspective view of a backlit sign 700 including an upright surface 701 with printed material 702 thereon. The upright material preferably comprises a light-transmissive material. The printed material 702, which may include CMY or CMYK ink, is illuminated by a solid state lighting device 705 including a reflective substrate 711 supporting an array of solid state light emitters 715A-715X. In certain embodiments, each solid state light emitter 715A-715X may include one or more LED packages, which may each include one or multiple LEDs. The solid state light emitters 715A-715X are arranged behind the printed material 702 and may embody any combination of solid state light emitters disclosed herein. Angled reflector walls 712 may be arranged along two or more walls of the substrate 711, with the solid state light emitters 715A-715X being separated from the upright surface 701 by a hollow cavity. In certain embodiments, the substrate 711 may be arranged to support at least one control circuit element (not shown) to provide any desirable control function disclosed herein. In certain embodiments, each solid state light emitter 715A-715X or groups thereof may include one or more optical elements (e.g., lenses, diffusers, filters, etc.) to achieve a desired distribution or pattern of light on the upright surface 701 with the printed material 702. In certain embodiments, each solid state light emitter 715A-715X or groups thereof may be independently controlled to permit subregions of the upright surface 701 and the printed material 702 to be preferentially illuminated. In certain embodiments, the preferential illumination is arranged to alter relative gamut of illumination of at least one subregion of the upright surface 701 in comparison to at least one other subregion of the upright surface 701 containing printed material 702. In certain embodiments, the lighting device 705 may include one or more sensors of any suitable type; alternatively, sensors (not shown) of various types disclosed herein may be arranged in electrical communication with the solid state lighting device 705.

FIG. 19 illustrates a solid state lighting device 805 including multiple solid state light emitters 815A-815X supported on a reflective substrate 811 within a reflector cup 812 defining a cavity 813. One end of the cavity 813 is bounded with a light-transmissive element 814, which may further embody a lens, a diffuser, a filter, or any other desirable light-affecting element. The solid state lighting device 805 further includes a body structure 820 containing at least one control circuit element 825, with a heatsink 822 arranged to dissipate heat generated by the solid state light emitters 815A-815X and/or the at least one control circuit element 825. The at least one control circuit element 825 may provide any one or more control functions disclosed herein. In certain embodiments, the at least one control circuit element 825 may include a microprocessor arranged to execute at least one pre-defined or user-defined instruction set. Mounting hardware 821 may be provided to permit the solid state lighting device 805 to be mounted in an appropriate location on or adjacent to an upright surface containing printed material to be illuminated. The solid state light emitters 815A-815X may embody any combination of solid state light emitters (e.g., including LEDs or LEDs in combination with one or more lumiphoric materials) disclosed herein. In certain embodiments, one or more of the solid state light emitters 815A-815C may serve as a photosensor (e.g., between time windows when the emitter is pulsed on), or one or more sensors of any suitable type may be substituted for one or more of the illustrated solid state light emitters 815A-815C. Other sensors (not shown) of various types disclosed herein may be integrated with the lighting device 805 or may be arranged in wireless or wired electrical communication with the lighting device 805.

FIG. 20 illustrates an elongated solid state lighting device 905 including multiple solid state light emitters 915A-915X arranged on a substrate 911 within a tubular light-transmissive body 914. The solid state lighting device 905 includes an end cap 920 that may optionally contain at least one control circuit element, and that further includes electrical contacts 926A-926B. In certain embodiments, the solid state lighting device 905 may include end caps and electrical contacts at both ends of the tubular body 914 to permit the solid state lighting device 905 to serve as a direct replacement for a tubular fluorescent lamp. In certain embodiments, one or more of the solid state light emitters 915A-915X may serve as a photosensor (e.g., between time windows when the emitter is pulsed on), or one or more sensors of any suitable type may be substituted for one or more of the illustrated solid state light emitters 915A-915X. Other sensors (not shown) of various types disclosed herein may be integrated with the lighting device 905 or may be arranged in wired or wireless electrical communication with the lighting device 905.

Embodiments as disclosed herein may provide one or more of the following beneficial technical effects: enhancing vibrancy of colors of illuminated printed material on upright surfaces (e.g., outdoor billboards, signs, posters, point of purchase displays, and the like); enhancing efficacy of illumination of printed material on upright surfaces, and enhancing control of illumination of printed material on upright surfaces.

Those skilled in the art will recognize improvements and modifications to the preferred embodiments of the present disclosure. All such improvements and modifications are considered within the scope of the concepts disclosed herein and the claims that follow. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A lighting device configured for illuminating a surface including printed material, the lighting device comprising:
   a plurality of solid state light emitter groups, wherein each solid state light emitter group of the plurality of solid state light emitter groups includes at least one first solid state light emitter arranged to generate first emissions comprising a first peak wavelength, and at least one second solid state light emitter arranged to generate second emissions comprising a second peak wavelength that differs by at least 40 nm from the first peak wavelength and differs by at least 40 nm from any other peak wavelength optionally generated by the at least one first solid state light emitter;
   wherein aggregate emissions of the lighting device include emissions of the plurality of solid state light emitter groups and provide a luminous flux of at least 2000 lumens; and
   wherein aggregate emissions of the lighting device comprise a luminous efficacy of at least 70 lumens per watt.

2. The lighting device of claim 1, wherein each solid state light emitter group of the plurality of solid state light emitter groups includes at least one third solid state light emitter arranged to generate third emissions comprising a third peak wavelength that differs from the second peak wavelength by at least 40 nm, that differs from the first peak wavelength by at least 40 nm, and that differs by at least 40 nm from any other peak wavelengths optionally generated by the at least one first solid state light emitter and the at least one second solid state light emitter.

3. The lighting device of claim 2, comprising at least one of the following features (i) or (ii): (i) the at least one second solid state light emitter is arranged to produce emissions having a full width-half maximum intensity value of no greater than 35 nm; or (ii) the third peak wavelength is in a range of from 630 nm to 680 nm.

4. The lighting device of claim 1, wherein the surface including printed material comprises an upright surface including printed material, and the plurality of solid state light emitter groups is arranged in front of the upright surface including printed material, or is arranged behind an illuminated surface of the upright surface including printed material.

5. An outdoor billboard, poster, or illuminated sign comprising the lighting device of claim 1.

6. A lighting device configured for illuminating a surface including printed material, the lighting device comprising:
   a plurality of solid state light emitter groups, wherein each solid state light emitter group of the plurality of solid state light emitter groups includes at least one first solid state light emitter arranged to generate first emissions comprising a dominant wavelength in a blue range, at least one second solid state light emitter arranged to generate second emissions comprising a dominant wavelength in a green or yellow-green range, and at least one third solid state light emitter arranged to generate third emissions comprising a dominant wavelength in a red or red-orange range;
   wherein aggregate emissions of the lighting device include at least a portion of the first emissions, at least a portion of the second emissions, and at least a portion of the third emissions; and
   wherein the lighting device comprises at least one of the following features:
   (a) the at least one first solid state light emitter is arranged to stimulate emissions of a lumiphoric material arranged to produce lumiphor emissions in a green or yellow-green range;
   (b) the at least one second solid state light emitter is arranged to produce emissions having a full width-half maximum intensity value of no greater than 35 nm;
   (c) the at least one third solid state light emitter comprises a peak wavelength in a range of from 630 nm to 680 nm; or
   (d) the aggregate emissions comprise a R9-prime color rendering value of greater than 110.

7. The lighting device of claim 6, comprising a control circuit configured to operate the plurality of solid state light emitter groups in a plurality of operating modes including a first mode wherein the aggregate emissions comprise a first relative gamut value and including a second mode wherein the aggregate emissions comprise a second relative gamut value, wherein the second relative gamut value is at least 10% greater than the first relative gamut value.

8. The lighting device of claim 6, wherein the aggregate emissions provide a luminous flux of at least 2000 lumens.

9. The lighting device of claim 6, wherein the aggregate emissions comprise a luminous efficacy of at least 70 lumens per watt.

10. The lighting device of claim 6, wherein each solid state light emitter group of the plurality of solid state light emitter groups further comprises at least one fourth solid state light emitter including a blue solid state light emitter arranged to stimulate emissions of a lumiphoric material arranged to produce lumiphor emissions in a green or yellow-green range.

11. The lighting device of claim 6, wherein at least one of the at least one first solid state light emitter, the at least one second solid state light emitter, and the at least one third solid state light emitter includes at least one lumiphoric material.

12. The lighting device of claim 6, wherein the surface including printed material comprises an upright surface including printed material, and the plurality of solid state light emitter groups is arranged in front of the upright surface including printed material, or is arranged behind an illuminated surface of the upright surface including printed material.

13. An outdoor billboard, poster, or illuminated sign comprising the lighting device of claim 6.

14. A lighting device configured for illuminating a surface including printed material, the lighting device comprising:
   a plurality of solid state light emitter groups, wherein each solid state light emitter group of the plurality of solid state light emitter groups includes at least one first solid state light emitter arranged to generate first emissions comprising a dominant wavelength in a blue range, at least one second solid state light emitter arranged to generate second emissions comprising a dominant wavelength in a green or yellow-green range, and at least one third solid state light emitter arranged to generate third emissions comprising a dominant wavelength in a red or red-orange range, wherein aggregate emissions of the lighting device include at least a portion of the first emissions, at least a portion of the second emissions, and at least a portion of the third emissions; and a control circuit configured to operate the plurality of solid state light emitter groups in a plurality of operating modes including a first mode wherein the aggregate emissions comprise a first relative gamut value and including a second mode wherein the aggregate emissions comprise a second relative gamut value, wherein the second relative gamut value is at least 10% greater than the first relative gamut value.

15. The lighting device of claim 14, further comprising at least one sensor arranged to sense at least one of an environmental condition and a property of the surface and produce at least one sensor output signal, wherein the control circuit is configured to select or adjust an operating mode of the lighting device responsive to the at least one sensor output signal.

16. The lighting device of claim 14, further comprising a time signal generating element or time signal receiving element arranged to provide at least one signal indicative of time, wherein the control circuit is configured to select or adjust an operating mode of the lighting device responsive to the at least one signal indicative of time.

17. The lighting device of claim 14, wherein at least one of the at least one first solid state light emitter, the at least one second solid state light emitter, and the at least one third solid state light emitter includes at least one lumiphoric material.

18. The lighting device of claim 14, wherein the surface including printed material comprises an upright surface including printed material, and the plurality of solid state light emitter groups is arranged in front of the upright surface including printed material, or is arranged behind an illuminated surface of the upright surface including printed material.

19. An outdoor billboard, poster, or illuminated sign comprising the lighting device of claim 14.

20. A lighting device configured for illuminating an upright surface including printed material, the lighting device comprising:

an array of solid state light emitter groups, wherein each solid state light emitter group of the array of solid state light emitter groups includes at least one first solid state light emitter arranged to generate first emissions comprising a dominant wavelength in a blue range, at least one second solid state light emitter arranged to generate second emissions comprising a dominant wavelength in a green or yellow-green range, and at least one third solid state light emitter arranged to generate third emissions comprising a dominant wavelength in a red or red-orange range, wherein aggregate emissions of the lighting device include at least a portion of the first emissions, at least a portion of the second emissions, and at least a portion of the third emissions; and a control circuit configured to adjust operation of one or more solid state light emitters or subgroups of the array of solid state light emitter groups to preferentially illuminate one or more subregions of the upright surface.

21. The lighting device of claim 20, further comprising at least one sensor arranged to sense at least one of an environmental condition and a property of the upright surface and produce at least one sensor output signal, wherein the control circuit is configured to adjust operation of one or more solid state light emitters or subgroups of the array of solid state light emitter groups to preferentially illuminate one or more subregions of the upright surface responsive to the at least one sensor output signal.

22. An outdoor billboard, poster, or illuminated sign comprising the lighting device of claim 20.

23. A lighting device configured for illuminating printed material comprising first, second, and third colored inks, paints, or dyes providing first, second, and third reflectance spectra comprising first, second, and third peak wavelengths, respectively, that differ from one another by at least about 40 nm, the lighting device comprising:

at least one first solid state light source comprising a dominant wavelength within about 20 nm of the first peak wavelength;

at least one second solid state light source comprising a dominant wavelength within about 20 nm of the second peak wavelength; and at least one third solid state light source comprising a dominant wavelength within about 20 nm of the third peak wavelength;

wherein the lighting device comprises two or more of the following characteristics (a) to (c):

(a) a luminous efficacy of at least 80 lumens per watt;

(b) an average color rendering index (CRI Ra) of at least 80; and (c) a relative gamut (Qg) of at least 100.

24. The lighting device of claim 23, wherein one or more of the at least one first, the at least one second, or the at least one third solid state light source comprises a lumiphoric material.

25. The lighting device of claim 23, comprising a plurality of solid state light source clusters, wherein each solid state light source cluster of the plurality of solid state light source clusters includes a first solid state light source of the at least one first solid state light source, a second solid state light source of the at least one second solid state light source, and a third solid state light source of the at least one third solid state light source.

26. The lighting device of claim 23, comprising all three characteristics (a) to (c).

27. The lighting device of claim 23, being configured to illuminate an upright billboard or sign.

28. The lighting device of claim 23, wherein one or more of the at least one first, the at least one second, or the at least one third solid state light source comprises a lumiphor including a full width-half maximum intensity value of no greater than 35 nm.

29. The lighting device of claim 23, wherein aggregate emissions of the lighting device comprise a R9-prime color rendering value of greater than 110.

* * * * *